United States Patent
Chun et al.

(10) Patent No.: US 10,608,182 B2
(45) Date of Patent: Mar. 31, 2020

(54) ANALYSIS OF MATERIAL LAYERS ON SURFACES, AND RELATED SYSTEMS AND METHODS

(71) Applicant: Kateeva, Inc., Newark, CA (US)

(72) Inventors: Doris Pik-Yiu Chun, Santa Clara, CA (US); Ian David Parker, Santa Barbara, CA (US)

(73) Assignee: Kateeva, Inc., Newark, CA (US)

( * ) Notice: Subject to any disclaimer, the term of this patent is extended or adjusted under 35 U.S.C. 154(b) by 74 days.

(21) Appl. No.: 15/954,923

(22) Filed: Apr. 17, 2018

(65) Prior Publication Data
US 2018/0309061 A1    Oct. 25, 2018

Related U.S. Application Data

(60) Provisional application No. 62/487,962, filed on Apr. 20, 2017.

(51) Int. Cl.
G06T 11/60        (2006.01)
H01L 51/00        (2006.01)
(Continued)

(52) U.S. Cl.
CPC .......... *H01L 51/0031* (2013.01); *G06T 7/001* (2013.01); *G06T 7/0004* (2013.01);
(Continued)

(58) Field of Classification Search
CPC ............. H01L 51/0031; H01L 51/5253; H01L 51/0005; G06T 7/0004; G06T 7/0008;
(Continued)

(56) References Cited

U.S. PATENT DOCUMENTS

| | | | |
|---|---|---|---|
| 8,063,551 B1 * | 11/2011 | Stainer | H01L 27/3246 313/503 |
| 2006/0171580 A1 * | 8/2006 | Blanford | G01N 21/8806 382/141 |

(Continued)

OTHER PUBLICATIONS

Invitation to Pay Additional Fees and, where Applicable, Protest fee.
(Continued)

*Primary Examiner* — Carol Wang
(74) *Attorney, Agent, or Firm* — Paula J. Tostado

(57) ABSTRACT

A method of analyzing film on a substrate may comprise receiving three-dimensional data obtained from measurements of a plurality of pixels on a substrate, the plurality of pixels comprising one or more film layers; extracting a plurality of parameters based on the received three-dimensional data, the plurality of parameters comprising at least an average thickness for the film layers of the pixels, one or more area aperture ratios for the film layers of the pixels, and a pitch between pixels, wherein the extraction is based on a predetermined pattern for the pixels on the substrate; displaying a user interface comprising a graphical representation of one or more of the parameters for the one or more film layers of the one or more of the pixels; and dynamically modifying the graphical representation of the one or more parameters in response to user input of the displayed user interface, the dynamically modifying causing the displayed graphical images to appear as continuously changing.

21 Claims, 55 Drawing Sheets

(51) Int. Cl.
*H01L 51/52* (2006.01)
*G06T 7/00* (2017.01)
*G06T 11/00* (2006.01)
*G06T 11/20* (2006.01)

(52) U.S. Cl.
CPC .......... *G06T 7/0008* (2013.01); *G06T 11/001* (2013.01); *G06T 11/206* (2013.01); *G06T 11/60* (2013.01); *H01L 51/5253* (2013.01); *G06T 2200/24* (2013.01); *G06T 2207/10024* (2013.01); *G06T 2207/10028* (2013.01); *G06T 2207/20072* (2013.01); *G06T 2207/20224* (2013.01); *G06T 2207/30121* (2013.01); *G06T 2207/30148* (2013.01); *H01L 51/0005* (2013.01)

(58) Field of Classification Search
CPC ....... G06T 7/001; G06T 11/206; G06T 11/60; G06T 11/001; G06T 2207/30121; G06T 2207/10028; G06T 2207/30148; G06T 2207/20224; G06T 2207/20072; G06T 2207/10024; G06T 2200/24; G06F 3/048; G06F 3/0481; G06F 3/04812; G06F 3/04815; G06F 3/04817; G06F 3/0482; G06F 3/0483; G06F 3/0484; G06F 3/04842; G06F 3/04845; G06F 3/04847; G06F 3/0485; G06F 3/0486; G06F 3/0487; G06F 3/0488; G06F 3/0489
See application file for complete search history.

(56) References Cited

U.S. PATENT DOCUMENTS

| | | |
|---|---|---|
| 2008/0285840 A1 | 11/2008 | Kawai |
| 2010/0128061 A1* | 5/2010 | Kowalski ................ G06T 11/60 345/619 |
| 2014/0233843 A1 | 8/2014 | Cocca |
| 2014/0366006 A1* | 12/2014 | Gottschlich ......... G06F 11/3664 717/125 |
| 2015/0221869 A1 | 8/2015 | Harjee et al. |
| 2015/0298153 A1 | 10/2015 | Baker et al. |
| 2017/0077461 A1 | 3/2017 | Cocca |

OTHER PUBLICATIONS

Notification of Transmittal of the International Search Report and the Written Opinion dated Aug. 24, 2018, to PCT Application No. PCT/US18/27890.

* cited by examiner

| Panel ID | Sequence number | Pixel number | Center Thickness (nm) | Whole Pixel Average Thickness (nm) | 1.0mm Area Aperture (%) | 5mm Area Aperture (%) | 2nm Area Aperture (%) | 1nm Area Aperture (%) | Center to Trough (nm) | Ink vol. in well (pL) |
|---|---|---|---|---|---|---|---|---|---|---|
| devnum1234 | 1 | 2 | 85.2 | 90.9 | 74.2 | 62.6 | 33 | 19.7 | 4.7 | 0.8 |
| devnum1234 | 1 | 3 | 87.2 | 90.3 | 78.7 | 56.5 | 30.3 | 15.3 | 7.1 | 0.8 |
| devnum1234 | 1 | 4 | 98.5 | 98.9 | 89.7 | 65.8 | 30.6 | 18.5 | 6.6 | 0.9 |
| devnum1234 | 2 | 2 | 152.6 | 153.1 | 92 | 65.3 | 35.4 | 20.4 | 9.1 | 1.4 |
| devnum1234 | 2 | 3 | 150.2 | 152.7 | 92.4 | 75.2 | 40.4 | 23 | 5.7 | 1.4 |
| devnum1234 | 2 | 4 | 163.1 | 160.2 | 73.2 | 52.1 | 31.5 | 16.8 | 14.9 | 1.4 |
| devnum1234 | 3 | 2 | 154.2 | 154.4 | 92.9 | 66.8 | 35.5 | 20.1 | 9 | 1.4 |
| devnum1234 | 3 | 3 | 152.6 | 152.6 | 92.7 | 73.5 | 38.4 | 21.5 | 5.9 | 1.4 |
| devnum1234 | 3 | 4 | 162.6 | 159 | 73.4 | 52.1 | 30.8 | 16.6 | 14.6 | 1.4 |
| devnum1234 | 4 | 2 | 155.2 | 155.2 | 92.6 | 65.1 | 34.9 | 18.8 | 9.5 | 1.4 |
| devnum1234 | 4 | 3 | 152.1 | 154.1 | 93.1 | 75.9 | 38.3 | 21.8 | 5.7 | 1.4 |
| devnum1234 | 4 | 4 | 165.5 | 159.8 | 71.1 | 51.2 | 27.2 | 16.8 | 15.1 | 1.4 |

FIG. 5

ANALYSIS OF MATERIAL LAYERS ON SURFACES, AND RELATED SYSTEMS AND METHODS

CROSS-REFERENCE TO RELATED APPLICATIONS

This application claims priority to U.S. Provisional Application No. 62/487,962, filed Apr. 20, 2017, which is incorporated by reference herein in its entirety.

TECHNICAL FIELD

Aspects of the present disclosure generally relate to surfaces on which one or more layers of film are formed, and methods for analyzing such film layers. More specifically, the present disclosure relates to analysis of film layers on electronic display surfaces in order to achieve quality control for display manufacturing. In addition, aspects of the present disclosure relate to graphical user interfaces for displaying profile data to enhance quality control, inspection, and processes for manufacturing of substrates having one or more layers of thin film thereon, such as, for example, electronic displays.

INTRODUCTION

The section headings used herein are for organizational purposes only and are not to be construed as limiting the subject matter described in any way.

The section headings used herein are for organizational purposes only and are not to be construed as limiting the subject matter described in any way.

Electronic displays are present in many differing kinds of electronic equipment such as, for example, television screens, computer monitors, cell phones, smart phones, tablets, handheld game consoles, etc. One type of electronic display relies on organic light emitting diode (OLED) technology. OLED technology utilizes an organic light-emissive layer sandwiched between two electrodes disposed on a substrate. A voltage can be applied across the electrodes causing charge carriers to be excited and injected into the organic light-emissive layer. Light emission can occur through photoemission as the charge carriers relax back to normal energy states. OLED technology can provide displays with a relatively high contrast ratio because each pixel can be individually addressed to produce light emission only within the addressed pixel. OLED displays also can offer a wide viewing angle due to the emissive nature of the pixels. Power efficiency of an OLED display can be improved over other display technologies because an OLED pixel only consumes power when directly driven. Additionally, the panels that are produced can be much thinner than in other display technologies due to the light-generating nature of the technology eliminating the need for light sources within the display itself and the thin device structure. OLED displays also can be fabricated to be flexible and bendable due to the compliant nature of the active OLED layers. While OLED displays have been described herein, other types of electronic displays, such as LED, quantum dot, electrophoretic, and electrochromic displays, may also be implemented in accordance with this disclosure.

Manufacturing of such displays requires precision and quality control in order to produce a viable result, such as a display having sufficient quality and longevity. An electronic display panel can comprise a series of spaced banks or wells for ink deposition. The properties of a display panel prior to ink layer deposition, such as bank opening size, bank wall slope, bank depth, bank pitch, and taper distance, can indicate whether the display can produce a viable product. Other factors can influence deposition precision in OLED display manufacturing techniques such as, display resolution, fluid properties (e.g., surface tension, viscosity, boiling point) associated with deposited OLED layer materials (e.g., active OLED materials, sometimes referred to as inks), which are comprised of a combination of OLED layer material and one or more carrier fluids, and deposition techniques. In addition, after material deposition, factors such as film layer thickness, area aperture ratios, film layer uniformity, center to minimum difference, and dried material volume can influence luminance, color, and ultimately performance of a manufactured display. Techniques for analyzing electronic panel displays prior to material deposition and post-deposition can provide quality control mechanism to improve the manufacturing process for displays, such as OLED displays.

SUMMARY

The present disclosure may solve one or more of the above-mentioned problems and/or achieve one or more of the above-mentioned desirable features. Other features and/or advantages may become apparent from the description which follows.

In accordance with an exemplary embodiment of the present disclosure, a method of analyzing film on a substrate may comprise receiving three-dimensional data obtained from measurements of a plurality of pixels on a substrate, the plurality of pixels comprising one or more film layers; extracting a plurality of parameters based on the received three-dimensional data, the plurality of parameters comprising at least an average thickness for the film layers of the pixels, one or more area aperture ratios for the film layers of the pixels, and a pitch between pixels, wherein the extraction is based on a predetermined pattern for the pixels on the substrate. The method may further comprise displaying a user interface comprising a graphical representation of one or more of the parameters for the one or more film layers of the one or more of the pixels; and dynamically modifying the graphical representation of the one or more parameters in response to user input of the displayed user interface, the dynamically modifying causing the displayed graphical images to appear as continuously changing.

In accordance with another exemplary embodiment of the present disclosure, a method of analyzing film on a substrate comprises receiving 3-dimensional data obtained from measurements of a substrate comprising a plurality of banks and extracting a plurality of parameters for the substrate from the received 3-dimensional data comprising one or more of bank depth, bank pitch, bank height, bank slope and bank opening size. The method may further comprise comparing the plurality of parameters to a criteria and determining whether the substrate meets a quality control standard based on the comparing.

According to yet another exemplary embodiment of the present disclosure, a method of analyzing film on a substrate comprises receiving three-dimensional data obtained from measurements of a plurality of pixels of a substrate, the plurality of pixels comprising one or more film layers and extracting a plurality of parameters from the received three-dimensional data, the parameters comprising at least a height for the film layers of the plurality pixels, wherein the extraction is based on a predetermined pattern for the pixels on the substrate. The method may further comprise displaying a user interface graphically representing at least a height for the film layers of one of the plurality of pixels and displaying a graphical representation illustrating a height for a plurality of different film layers of the one pixel, the plurality of film layers including at least one of an underlayer, a printed layer, and a difference layer between the underlayer and the printed layer.

In yet another exemplary embodiment, a method of analyzing film on a substrate and displaying a dynamic interface based on the analysis comprises receiving three-dimensional data obtained from measurements of a plurality of pixels on a substrate, at least a portion of the plurality of pixels comprising one or more film layers and extracting a plurality of parameters from the received three-dimensional data comprising at least a height for the film layers of the pixels, wherein the extraction is based on a predetermined pattern for the pixels on the substrate. The method may further include displaying a user interface graphically representing one or more of the parameters for one or more film layers of the one or more of the pixels. The user interface may comprise a plurality of individual graphs that illustrate one or more parameters of the film layers for a plurality of pixels, and a composite graph that illustrate one or more parameters of the film layers of each of the plurality of pixels, wherein the individual graphs for each of the pixels is overlaid onto the composite graph.

In another exemplary embodiment of the present disclosure, a method of analyzing film on a substrate comprises receiving three-dimensional data obtained from measurements of a plurality of pixels on a substrate, the plurality of pixels comprising one or more film layers and extracting a plurality of parameters based on the received three-dimensional data, the plurality of parameters comprising at least an average thickness for the film layers of the pixels, one or more area aperture ratios for the film layers of the pixels, and a pitch between pixels, wherein the extraction is based on a predetermined pattern for the pixels on the substrate. The method may further comprise displaying a graphical representation of one or more of the parameters for one or more film layers of the one or more of the pixels, comparing the one or more parameters to a quality criteria, and determining whether the substrate meets a quality control standard based on the comparing.

Yet another exemplary embodiment of the present disclosure relates to a method of analyzing film on a substrate for substrate processing control, the method comprising receiving three-dimensional data obtained from measurements of a plurality of pixels on a substrate, the plurality of pixels comprising one or more film layers and extracting a plurality of parameters based on the received three-dimensional data, the plurality of parameters comprising at least an average thickness for the film layers of the pixels, one or more area aperture ratios for the film layers of the pixels, and a pitch between pixels, wherein the extraction is based on a predetermined pattern for the pixels on the substrate. The method may further comprise displaying a graphical representation of one or more of the parameters for one or more film layers of the one or more of the pixels, comparing the plurality of parameters to threshold criteria for each parameter, and adjusting a process of forming the one or more film layers on the substrate based on the comparing.

Additional objects and advantages will be set forth in part in the description which follows, and in part will be obvious from the description, or may be learned by practice of the present teachings. At least some of the objects and advantages of the present disclosure may be realized and attained by means of the elements and combinations particularly pointed out in the appended claims.

It is to be understood that both the foregoing general description and the following detailed description are exemplary and explanatory only and are not restrictive of the invention, as claimed. It should be understood that the invention, in its broadest sense, could be practiced without having one or more features of these exemplary aspects and embodiments.

BRIEF DESCRIPTION OF THE DRAWINGS

The accompanying drawings, which are incorporated in and constitute a part of this specification, illustrate some exemplary embodiments of the present disclosure together with the description, serve to explain certain principles. In the drawings.

FIG. 5 is a data table illustrating analytical results from profile data for pixels on a substrate in accordance with the present disclosure.

DESCRIPTION OF EXEMPLARY EMBODIMENTS

Figure 1A:
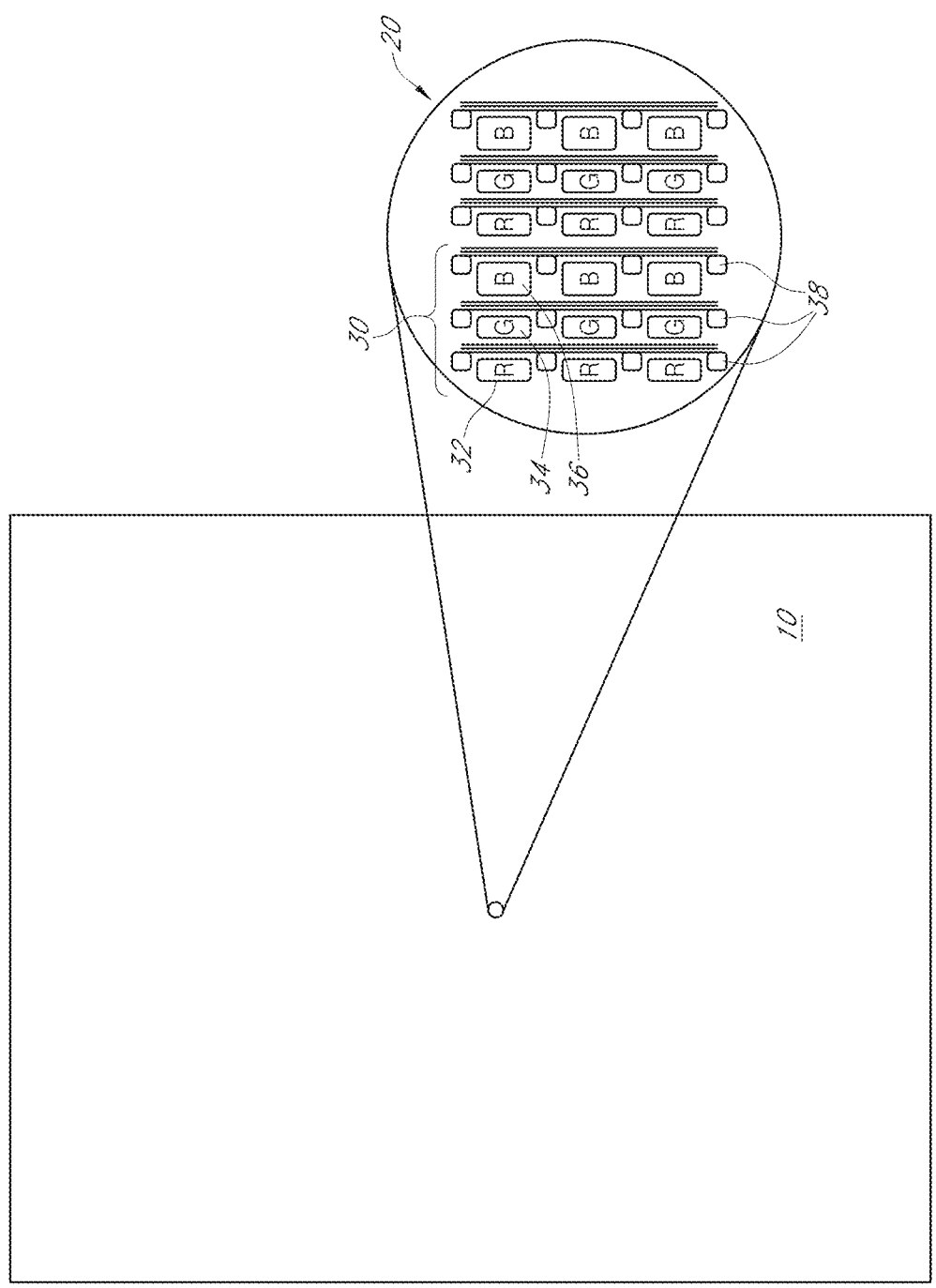
FIG. 1A is a schematic representation of an exemplary pixel arrangement within a display panel in accordance with the present disclosure.

Reference will now be made in detail to various exemplary embodiments of the present disclosure, examples of which are illustrated in the accompanying drawings. Wherever possible, the same reference numbers will be used throughout the drawings to refer to the same or like parts.

For the purposes of this specification and appended claims, unless otherwise indicated, all numbers expressing quantities, percentages, or proportions, and other numerical values used in the specification and claims, are to be understood as being modified in all instances by the term "about," to the extent they are not already so modified. Accordingly, unless indicated to the contrary, the numerical parameters set forth in the following specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," and any singular use of any word, include plural referents unless expressly and unequivocally limited to one referent. As used herein, the term "include" and its grammatical variants are intended to be non-limiting, such that recitation of items in a list is not to the exclusion of other like items that can be substituted or added to the listed items.

Further, this description's terminology is not intended to limit the invention. For example, spatially relative terms—such as "beneath", "below", "lower", "top", "bottom", "above", "upper", "horizontal", "vertical", and the like—may be used to describe one element's or feature's relationship to another element or feature as illustrated in the figures. These spatially relative terms are intended to encompass differing positions (i.e., locations) and orientations (i.e., rotational placements) of a device in use or operation in addition to the position and orientation shown in the figures. For example, if a device in the figures is turned over, elements described as "below" or "beneath" other elements or features would then be "above" or "over" the other elements or features. Thus, the exemplary term "below" can encompass both positions and orientations of above and below depending on the overall orientation of the device. A device may be otherwise oriented (rotated 90 degrees or at other orientations) and the spatially relative descriptors used herein interpreted accordingly.

As used herein, "pixel" is intended to mean the smallest functionally complete and repeating unit of a light emitting pixel array. The term "sub-pixel" is intended to mean a portion of a pixel that makes up a discrete light emitting part of the pixel, but not necessarily all of the light emitting parts. For example, in a full color display, a pixel can include three primary color sub-pixels such as red, green, and blue. In a monochrome display, the terms sub-pixel and pixel are equivalent, and may be used interchangeably.

One of ordinary skill in the art would generally accept the term "high resolution" to mean a resolution greater than 100 pixels per inch (ppi) where 300 ppi can sometimes be referred to as very high resolution. One of ordinary skill in the art would also recognize that pixel density does not directly correlate to the size of the display. Various exemplary embodiments disclosed herein can be used to achieve high resolution in small and large display sizes. For example, displays having a size of about 3 inches to about 11 inches can be implemented as high resolution displays. Moreover, displays having larger sizes, such as television displays up to 55" and beyond, can also be used with various exemplary embodiments described herein to achieve high resolution displays.

As used herein, a layer or structure being "on" a surface includes both the case where the layer is directly adjacent to and in direct contact with the surface over which it is formed and the case where there are intervening layers or structures between the layer or structure being formed over the surface.

Manufacturing of electronic displays, such as OLED displays, requires precision and quality control in order to produce a viable result. An electronic display panel may comprise a series of spaced banks or well for ink deposition. The properties of a display panel prior to ink layer deposition, such as bank opening size, bank wall slope, bank depth, bank pitch, and taper distance, can indicate whether the display can produce a viable product. Other factors can influence deposition precision in OLED display manufacturing techniques such as, display resolution, fluid properties (e.g., surface tension, viscosity, boiling point) associated with the OLED layer material (e.g., active OLED materials) inks, which are comprised of a combination of OLED layer material and one or more carrier fluids, and deposition techniques. In addition, after ink deposition, factors such as ink layer thickness, area aperture ratios, layer uniformity, center to minimum difference, and/or dried ink volume can influence luminance, color, and ultimately performance of a manufactured display. Techniques for analyzing electronic panel displays prior to deposition of material for forming film layers and after film layer formation can provide quality control mechanisms to improve the manufacturing process and/or for determining whether a product meets quality standards (e.g., fails inspection).

While OLED displays represent one application that will be discussed herein, those having ordinary skill in the art will appreciate that a variety of applications in which one or more film layers are formed (e.g., in a stack) on a surface can benefit from the various analyses of those layers, as described herein. Moreover, the methods and systems described herein are applicable to a variety of material deposition techniques and ink jet printing is not intended to be limiting, but rather exemplary. For example, the film layers analyzed in accordance with the techniques of the present disclosure can be formed from thermal evaporation, organic vapor phase deposition, organic vapor jet printing, spin coating, slot coating, and other material deposition processes for forming film layers with which those of ordinary skill in the art are familiar. In addition, the present disclosure can relate to display types other than OLED displays that have film layers thereon, including but not limited to, light emitting diode (LED) displays, quantum dot displays, electrophoretic displays, and electrochromic displays. Aside from electronic displays, the analysis techniques described herein may be useful for any applications using thin films on a surface, and in particular for applications in which the uniformity of such film layers impacts quality or performance. Printed circuitry applications are one example of such an application.

Exemplary Electronic Display

FIG. 1A is a schematic top view of an OLED device substrate 10, with an expanded view 20 showing circuitry for six pixels formed on the surface of substrate 10. A single pixel is designated by numeral 30, and is seen to consist of separate red, green and blue light generating elements (32, 34 and 36). Additional circuitry (such as depicted by numeral 38) can be formed on the OLED device display substrate to assist with control over generation of light by a respective pixel well.

Figure 1B:
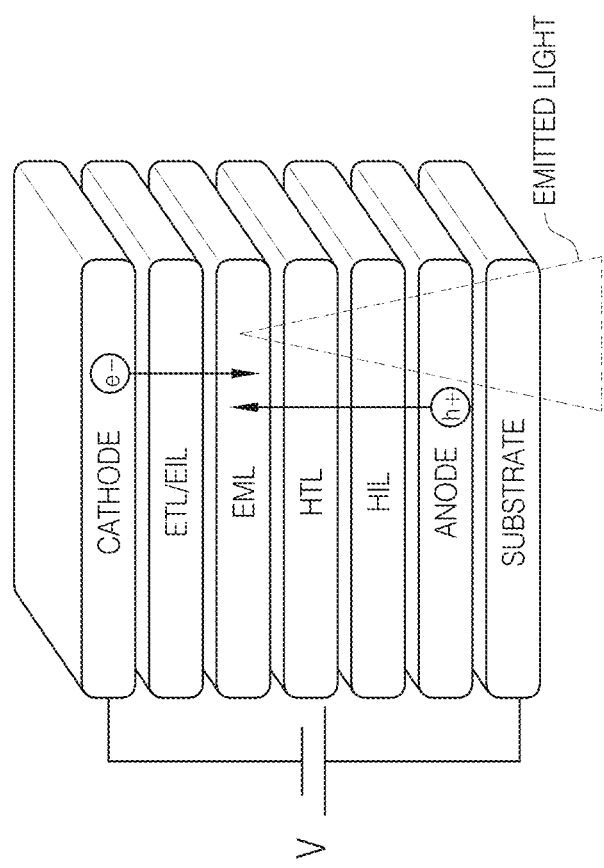
FIG. 1B is a schematic depiction of an embodiment of an OLED stack in accordance with the present disclosure.

During the manufacture of an electronic panel display, a pixel is formed to include at least one film layer stack. Taking an OLED display as an example, the film layer stack may be an OLED film layer stack that can emit light when a voltage is applied. FIG. 1B depicts an embodiment of an OLED film layer stack that includes between the anode and the cathode a hole injection layer (HIL), a hole transport layer (HTL), an emissive layer (EML), and an electron transport layer (ETL) combined with an electron injection layer (EIL). When voltage is applied across the anode and cathode, light of a specific wavelength is emitted from the EML layer, as indicated in FIG. 1B. In various embodiments of systems, devices and methods of the present teachings, the HIL, HTL, EML, and ETL/EIL layers depicted in FIG. 1B can be printed using inkjet printing, however such deposition technique is not limiting and other deposition techniques may be used without departing from the scope of the present disclosure. Each of the HIL, HTL, and ETL/EIL OLED stack layers has an ink formulation including materials that define the function of those OLED stack film layers. As will be discussed in more detail subsequently, in an exemplary embodiment, a pixel can include three color generating elements (e.g., subpixels), where each element has an EML layer that emits a different wavelength of light, for example, but not limited by, red, green and blue. For various embodiments of an OLED pixel of the present teachings, each EML layer has an ink formulation including an OLED material that can emit in the targeted electromagnetic wavelength range. In other embodiments, a monochromatic display (e.g., with a single subpixel for each pixel) may be implemented, as well as any number or combination of color components and associated pixels.

Electronic Display and Ink Layer Profile Data

Physical properties for an electronic display in accordance with various embodiments and/or a plurality of film layers deposited onto the electronic display in accordance with various embodiments may be detected by any suitable optical or mechanical profilometer or similar instrument. Examples of instruments and techniques for measuring surface profiles and providing Cartesian space (x, y, z) data include, but are not limited to 3-dimension optical profilometers, such as those manufactured by Bruker, Zygo, Nanovea, Flimetrics, FRT (MicroProf), NanoView, KLA-Tencor, Rtec, Sensofar, and Zeta, laser scanners, such as those manufactured by Keyence, Novacam, and Salrius, Stylus profilometers, such as those manufactured by Bruker, Tencor, NanoScience, KLA Tencor, and Dektak, AFM Profilometers, such as those manufactured by Bruker, Horiba, Nanosurf, Park Systems, Hitachi, and Keysight, confocal microscopes, such as those manufactured by Keyence, Olympus, Leica, Bruker, and Zeiss, and any other suitable instrument or techniques. For example, any suitable instrument or technique for measuring x-y-z data of an electronic display and one or more film layers deposited on a surface of the display with a sensitivity of at least 200 um lateral (x-y) and 100 angstrom in height (z) may be implemented.

In exemplary embodiments, the three-dimensional (3-D) profile data received from the profilometer comprises x-y-z data that describes physical characteristics for an electronic display comprising a plurality of spaced banks and/or physical characteristics for a plurality of film layers deposited on the electronic display. The profile data may be received in any suitable format and from any of the listed instruments or any other suitable instrument.

In exemplary embodiments, profile data may be received for a plurality of electronic displays that comprise a plurality of control (unprinted) pixels, and the profile data may include, for example, bank height, bank taper distance, and curvature of a bank. Alternatively or in addition, profile data can be received for a plurality of pixels with film layers and may include, for example, film layer height, aperture ratios, and volume of dried film material (e.g., dried ink in a printed pixel). The received data may be processed such that analytical data is generated for the plurality of electronic displays and the plurality of pixels. For example, once a pattern for pixels or banks is provided, incoming x-y-z data can be automatically analyzed to extract the relevant parameters and analytical data for the display. In some embodiments, this automation is achieved without the need for user intervention or other manual processes, which may considerably reduce processing time to collect data.

In a further exemplary embodiment, the software can perform image recognition from data provided by a user to map the data to the predefined expected pixel patterns. In this way, the software may adjust by rotation, translation, or both the provided image data to align with the expected pattern of pixels based on the predetermined patterns provided as input. Thus, the software can readily identify the data provided as data associated with pixels.

Various interfaces, such as graphical user interfaces, described herein illustrates visual representations of such analytical data.

Interactive Graphical User Interfaces

A plurality of interactive graphical user interfaces may be used in accordance with various embodiments of this disclosure to display profile data for an electronic display and/or film layers on an electronic display.

Figure 2A:
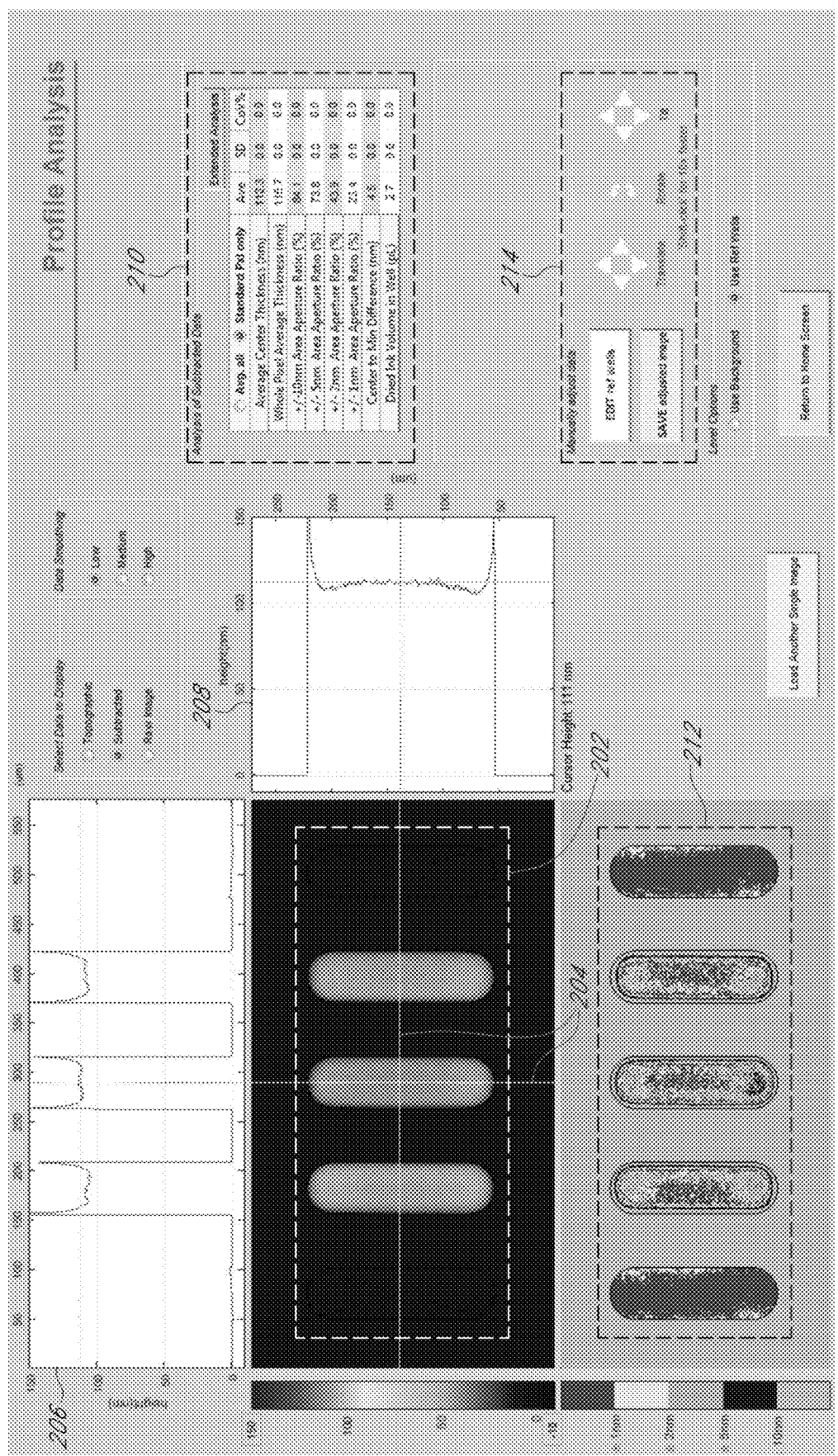
FIGS. 2A-2H are graphical user interfaces that includes interactive graphs, maps, and widgets for displaying profile data of one or more pixels on a substrate in accordance with the present disclosure.

FIGS. 2A-2H depict an exemplary embodiment of graphical user interfaces that include interactive graphs, maps, and widgets for displaying profile data of one or more pixels on a substrate in accordance with the present disclosure. GUI 200A of FIG. 2A is an interactive profile analysis interface that comprises a heat map of pixels 202, cross-hair 204, graphs 206 and 208, data table 210, and heat map of pixels 212. Heat map of pixels 202 illustrates a heat map of film layer height or thickness for the illustrated plurality of pixels according to the depicted scale. In an example, the outer two pixels comprise control pixels (e.g., reference wells) on which no film layers have been deposited, while the inner three pixels represent pixels in which film layers have been deposited. The inner three pixels may be referred to as printed pixels to connote the exemplary embodiment in which the film layers are deposited via inkjet printing.

Graphs 206 and 208 correspond to the heat map of pixels 202 and illustrate a graphical representation (Cartesian coordinates) of the height of the film layers of the pixels. Cross-hair 204 comprises a cursor that points to a specific location of the heat map of pixels 202. The film layer height at the specific location pointed to by cross-hair 204 is displayed in corresponding graphs 206 and 208. Data table 210 comprises analytical information about one or more of the plurality of pixels corresponding to the heat map of pixels 202. Heat map of pixels 212 illustrate area aperture ratios for the plurality of pixels according to the adjacent scale. Interface 214 comprises an interactive widget with buttons and clickable arrows to manually adjust the data illustrated in heat map of pixels 202, graphs 206 and 208, data table 210, and heat map of pixels 212.

Figure 2B:
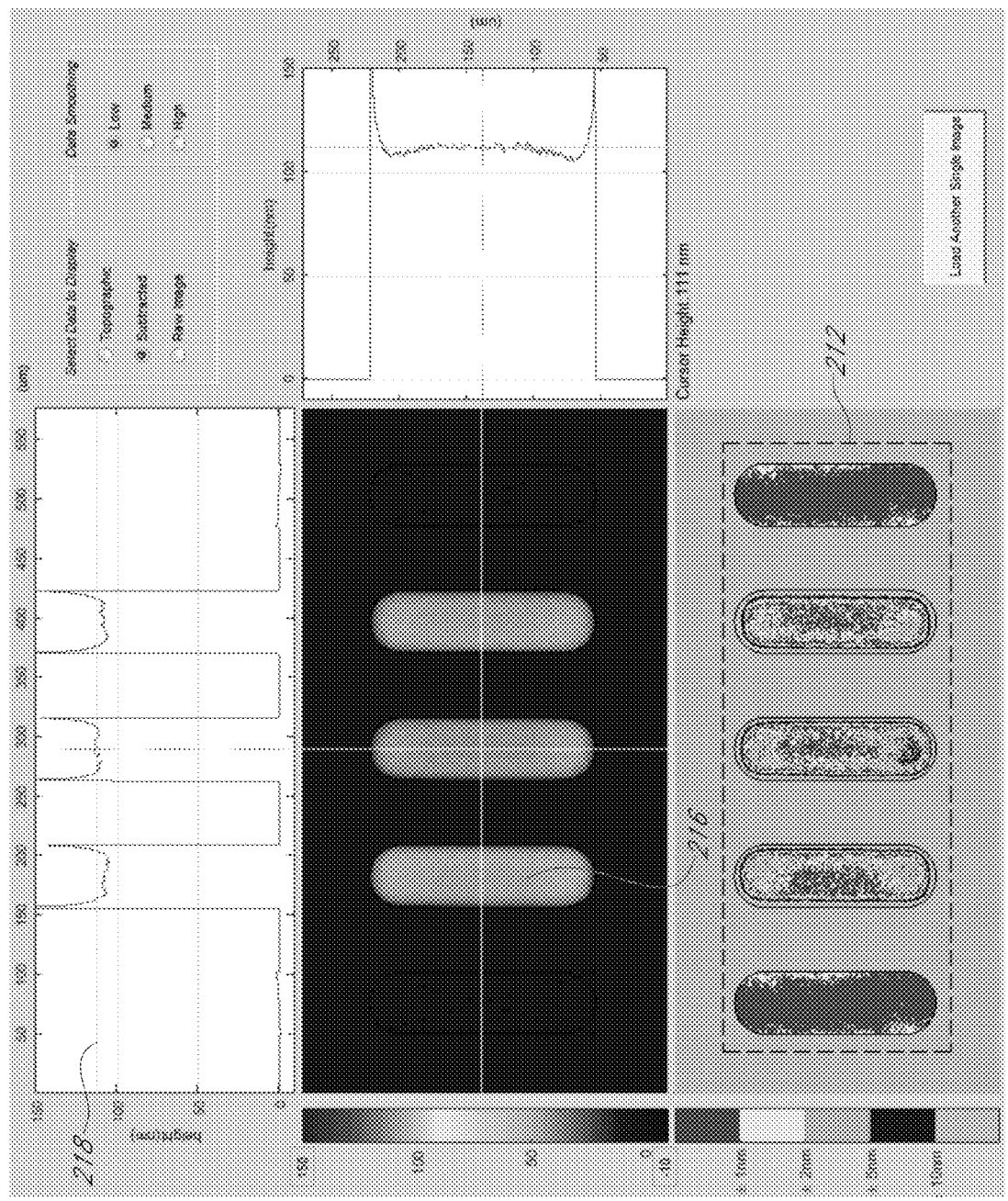

GUI 200B of FIG. 2B is an interactive profile analysis interface that comprises a portion of GUI 200A from FIG. 2A. Graphs 206 and 208 comprise an indicator, such as line 218, that illustrates the average height for the film layers of the printed pixels (e.g., average for the pixels printed an on electronic display). Point 216 on heat map of pixels 202 illustrates a center height or thickness for the related pixel, as illustrated.

Figure 2C:
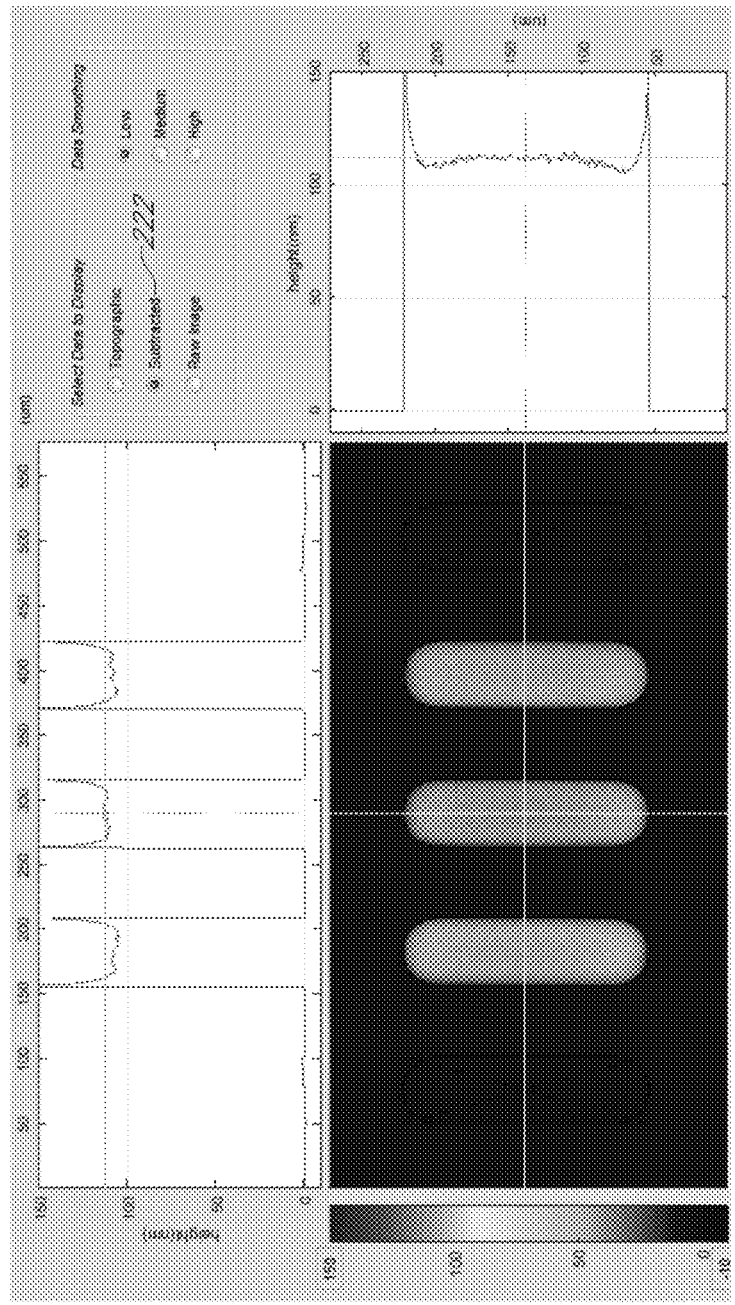
Figure 2D:
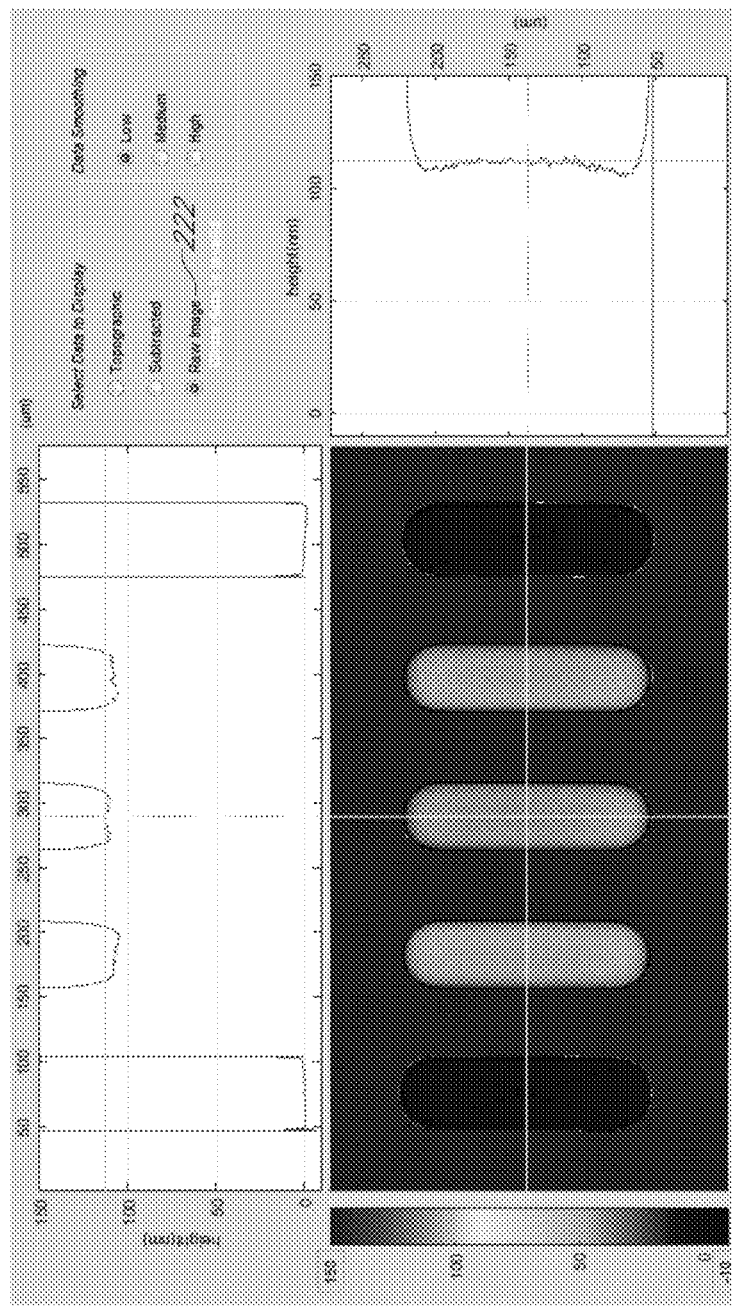

GUI 200C and 200D of FIGS. 2C and 2D are additional interactive profile analysis interfaces that comprise a portion of GUI 200A from FIG. 2A. Radio button 220 is used to select a type of data to be displayed in heat map of pixels 202. In various embodiments, the types of data include topographic data, subtracted data, and raw image data. For example, the raw image data may comprise the x-y-z (3-D) data measured by a profilometer for the plurality of pixels, as described in this disclosure. In another example, the subtracted data may comprise the raw image data after a subtraction of control data. For instance, the outer pixels or wells of heat map of pixels 202 can comprise control pixels (or reference wells in the case of pixels defined by bank structures forming wells) and the subtracted data comprises the measured raw image data after subtraction of the data measured for the control pixels or references wells. In other words, the subtracted data for one of the inner pixels displayed in the heat map of pixels 202 (i.e., a printed pixel) comprises the measured height of the film layers for the inner pixel minus the measured height for a control pixel or reference well. GUI 200C displays subtracted data for the plurality of pixels while GUI 200D displays raw image data for the plurality of pixels.

Figure 2E:
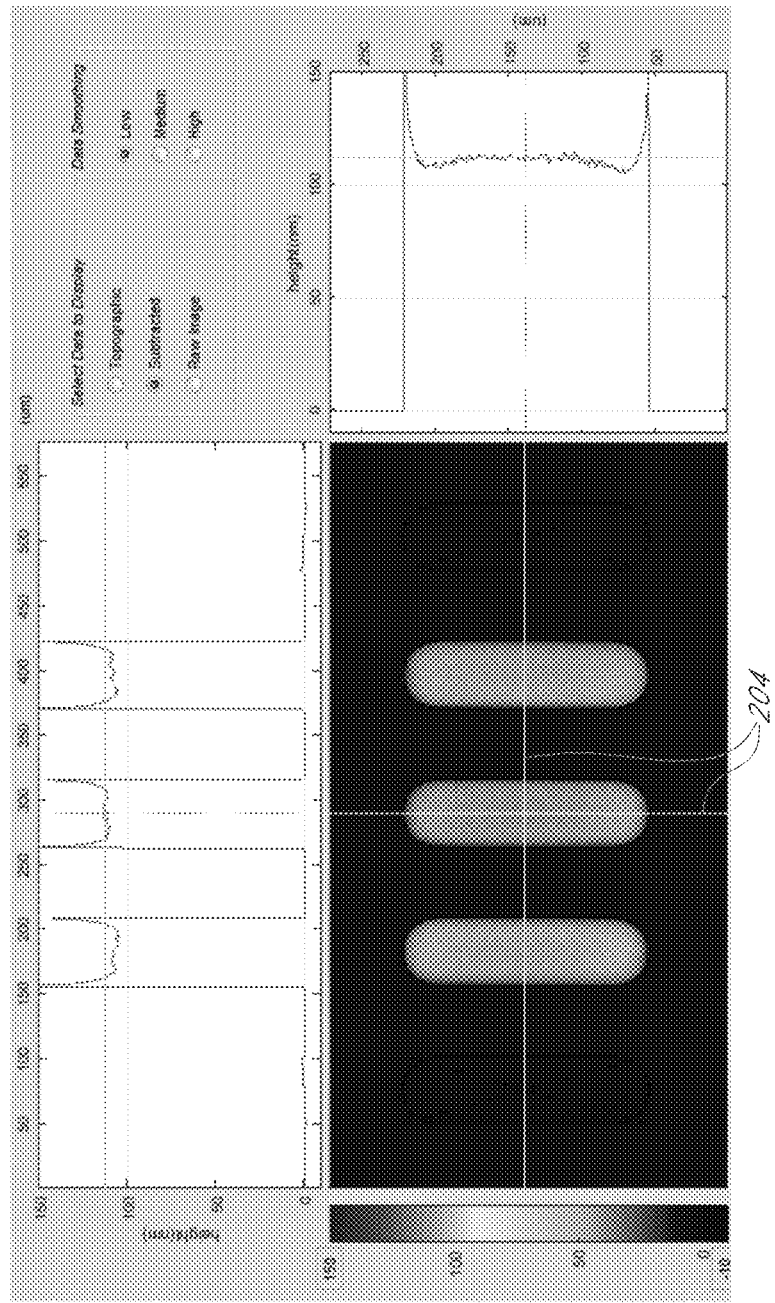
Figure 2F:
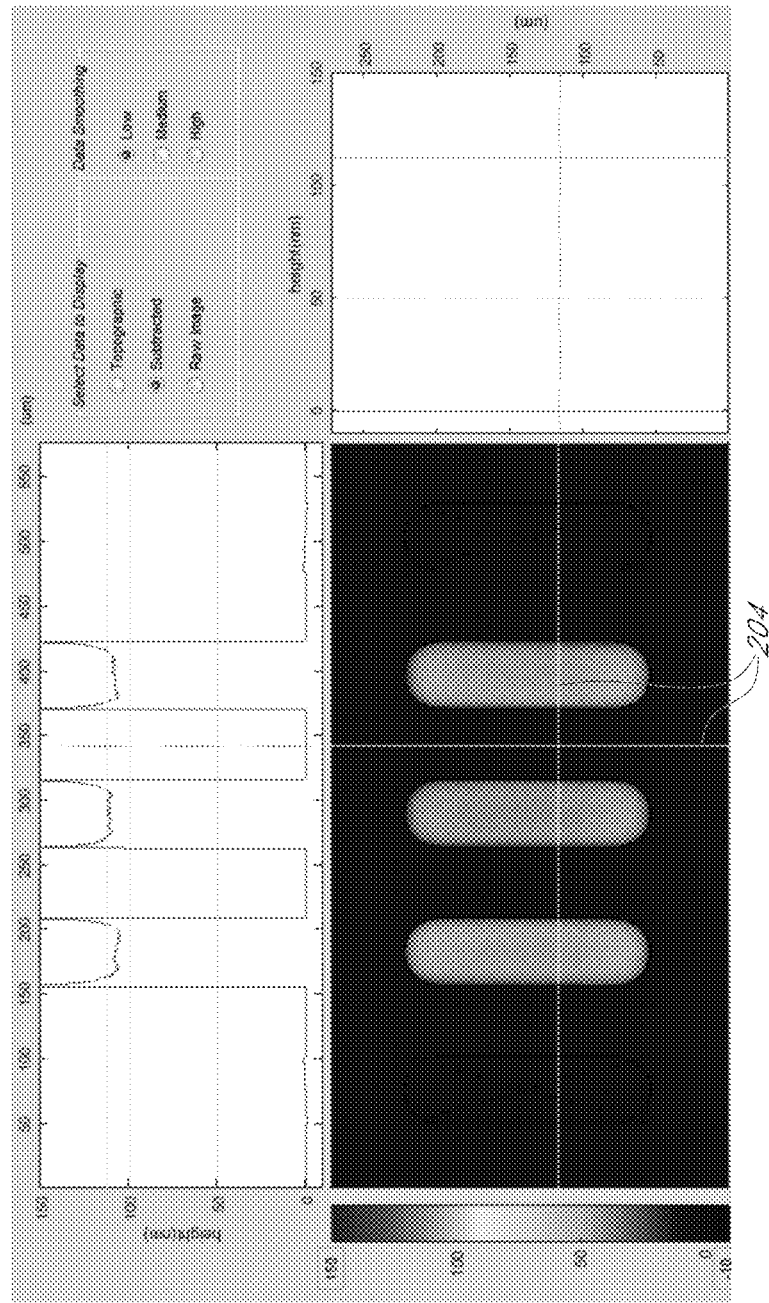

GUI 200E and 200F of FIGS. 2E and 2F are additional interactive profile analysis interfaces that comprise a portion of GUI 200A of FIG. 2A. Cross-hair 204 can be an adjustable cursor that points to a specific location of the heat map of pixels 202 and can be manipulated by a user of the interface. For example, cross-hair 204 comprises two orthogonal lines such that a user can click and drag cross-hair 204 to any location on heat map of pixels 202. GUI 200E shows cross-hair 204 in the center of the center pixel. Cross-hair 204 extends to graphs 206 and 208 such that the lines of the cross-hair intersect with the graphed lines that illustrate film height. In this example, the intersection of cross-hair 204 with graph 206 shows the precise location on graph 206 that corresponds with the location of cross-hair 204 on heat map of pixels 202. The intersection of cross-hair 204 and graph 206 illustrates the film height for the location of cross-hair 204 on heat map of pixels 202. The intersection of cross-hair 204 and graph 208 illustrates a similar correspondence between graph 208 and the location on heat map of pixels 202.

In the illustrated embodiment, graph 204 displays film height for the plurality of pixels from heat map of pixels 202 over the length of the heat map. For example, graph 204 displays film height for the plurality of pixels across the length of the heat map (e.g., x-axis) based on the y-coordinate specified by the location of cross-hair 204. Similarly, graph 206 displays film height for the plurality of pixels from heat map of pixels 202 over the width of the heat map. For example, graph 206 displays film height for the plurality of pixels across the width of the heat map (e.g., y-axis) based on the x-coordinate specified by the location of cross-hair 204.

In some embodiments, as cross-hair 204 is moved by a user, the intersection of cross-hair 204 with graphs 206 and 208 also moves such that the GUI appears to continuously change along with the movement of crosshair 204. In another example, as cross-hair 204 is moved by a user, graphs 204 and 206 update the graphed film height according to the cross-hair location such that the GUI appears to continuously change along with the movement of crosshair 204. In GUI 200F, cross-hair 204 has been moved by a user from the center of the center pixel to a gap between pixels. As can be seen by the intersections of cross-hair 204 and graphs 206 and 208, the corresponding ink height for the gap between pixels is zero.

Figure 2G:
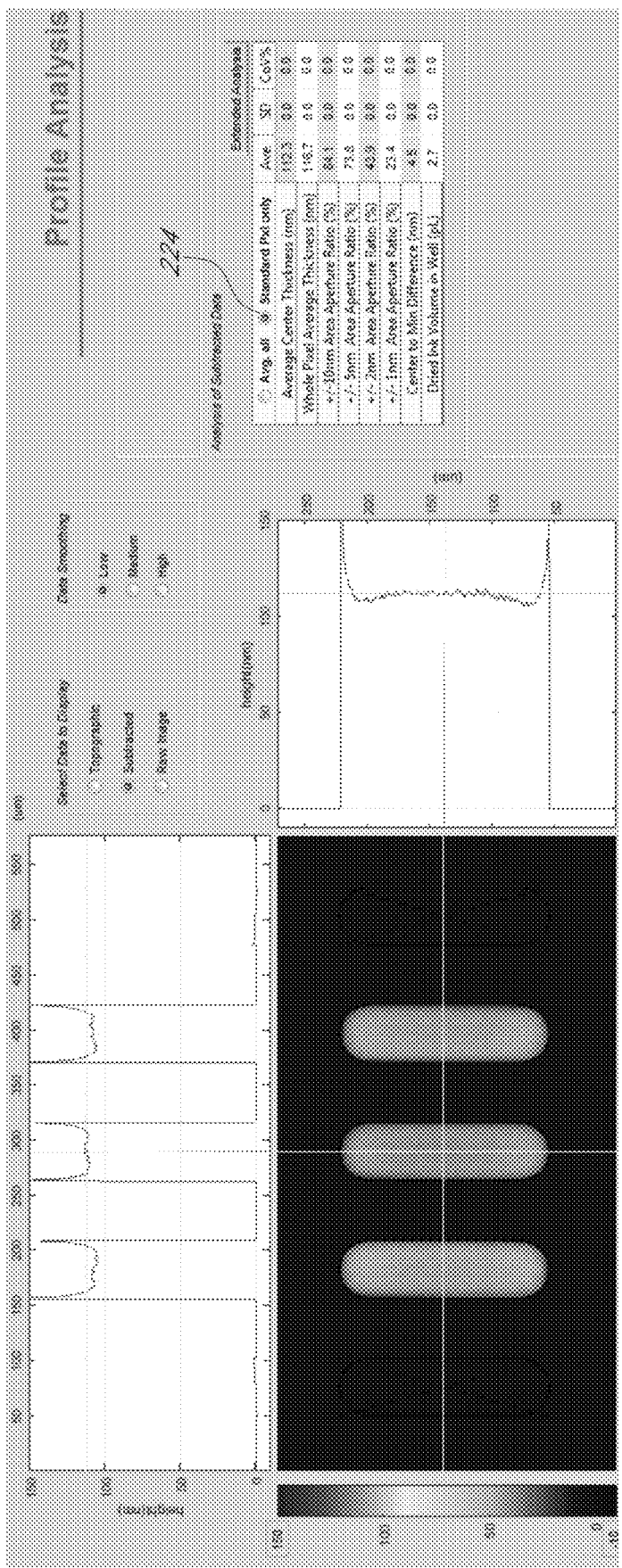
Figure 2H:
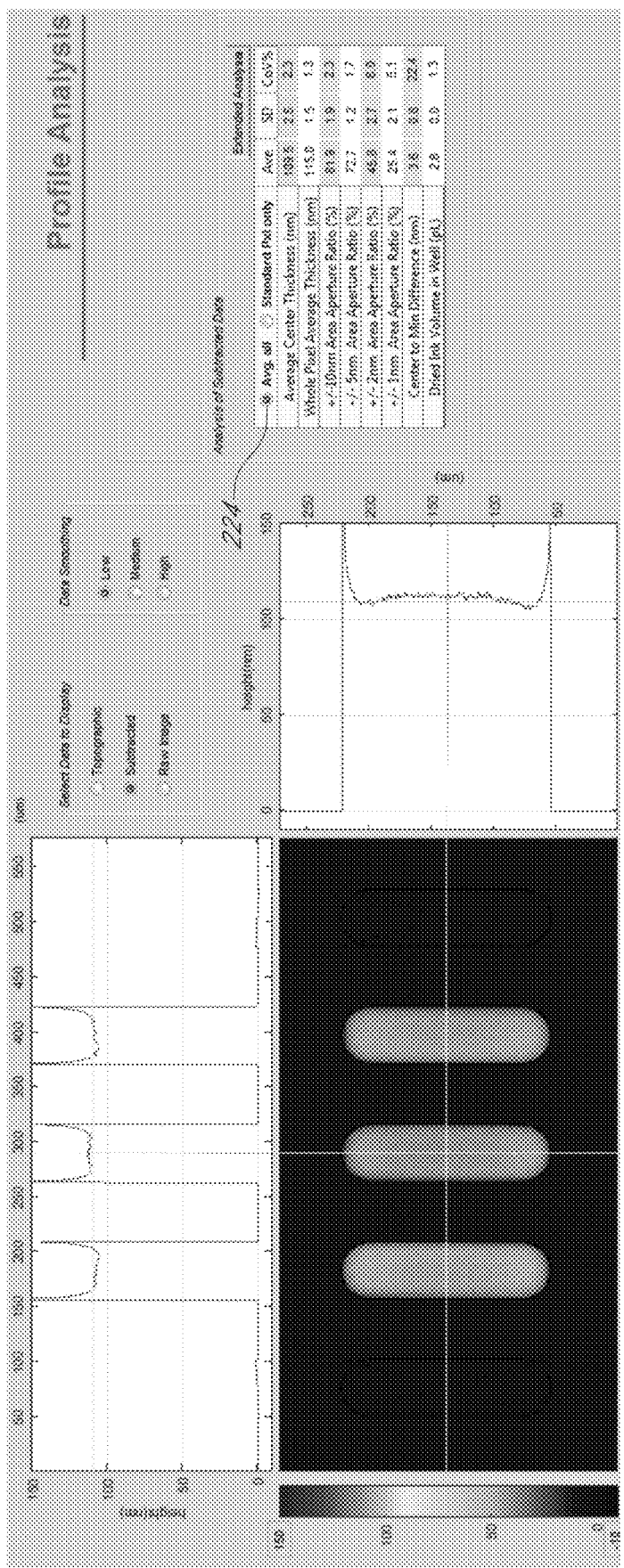

Data table 210 comprises analytical information about one or more of the plurality of pixels corresponding to the heat map of pixels 202. GUI 200G and 200H of FIGS. 2G and 2H are additional interactive profile analysis interfaces that comprises a portion of GUI 200A of FIG. 2A. Data table 210 comprises analytical information about one or more of the plurality of pixels corresponding to the heat map of pixels 202 and/or a set of printed pixels (e.g., a set of printed pixels on a particular panel of an electronic display). For example, data table 210 illustrates average center thickness or height, percent of area aperture ratios within a threshold distance (e.g., +/−10 nm, 5 nm, 2 nm, 1 nm, and the like), center ink height of a pixel to minimum ink height for the pixel difference, and dried material (e.g., ink) volume in a bank or well for a pixel. Radio button 224 selects the type of data to be displayed in data table 210. For example, data for a standard pixel can be displayed as illustrated in GUI 200G, or data for an average for a plurality of a set of pixels (e.g., a set of printed pixels on a particular panel of an electronic display) can be displayed as illustrated in GUI 200H. When data for an average for a plurality of a set of pixels is displayed, analytical data for the set may also be displayed in data table 210. For example, standard deviation data and coefficient of variation (e.g., standard deviation/average) data may be displayed, as illustrated in GUI 200H.

Figure 3:
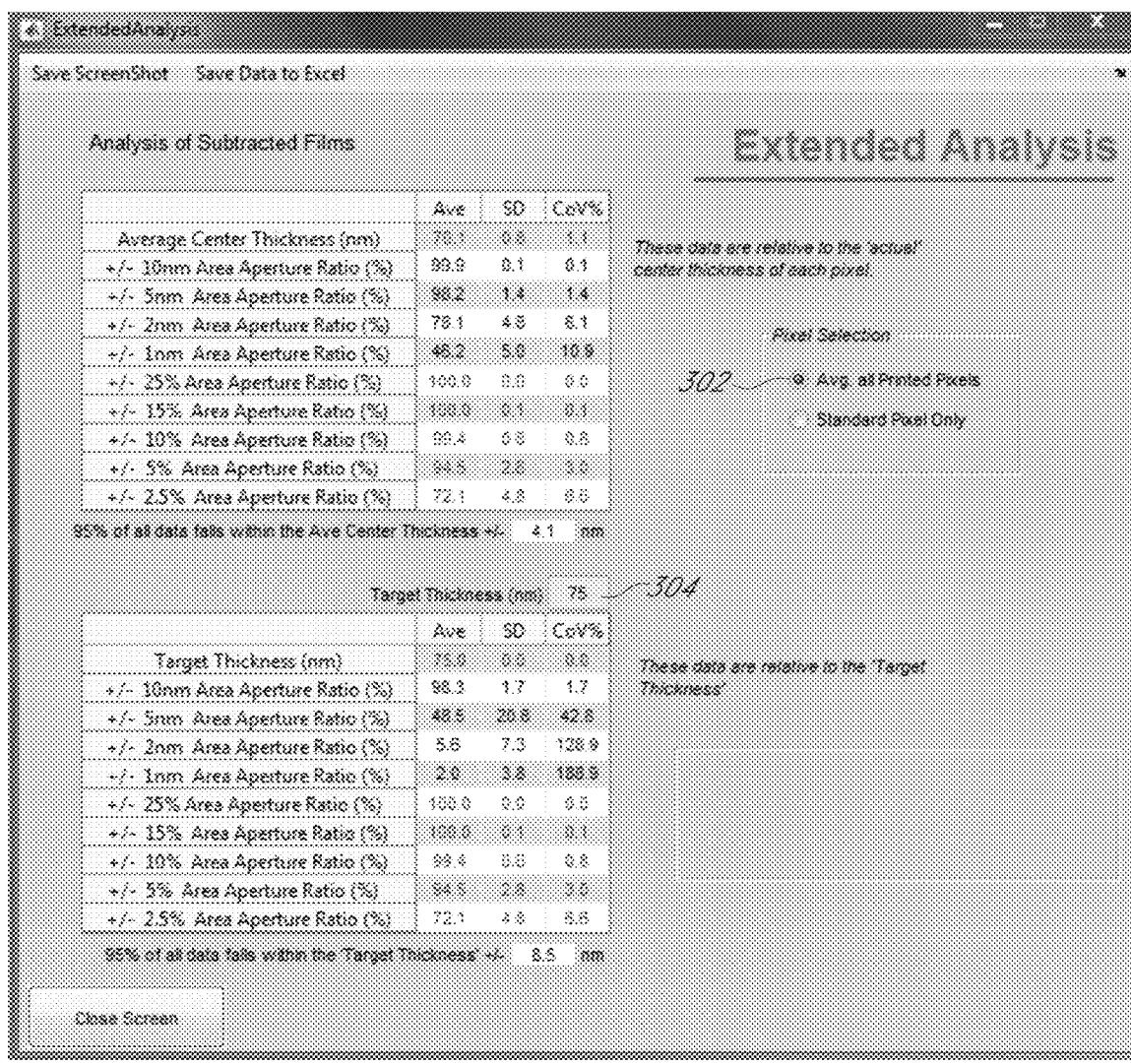
FIG. 3 is a graphical user interface that includes interactive tables and widgets for displaying profile data of one or more pixels on a substrate in accordance with the present disclosure.

An extended analysis of the data displayed in data table 210 may also be displayed, as illustrated in GUI 300 of FIG. 3. FIG. 3 depict one exemplary embodiment of a graphical user interface that includes interactive tables and widgets for displaying extended profile data of one or more pixels on a substrate in accordance with the present disclosure.

GUI 300 displays two data tables that are similar to data table 210 of FIG. 2A. The first and second data tables may display data for an average of a set of pixels or data for a standard pixel based on the selection of radio button 302. In an exemplary embodiment, the first table displays data that is relative to an actual center film height or thickness of a pixel and the second table may display data that is relative to a target center film height or thickness for a pixel. In other words, the percentage area aperture ratios displayed in the first data table may be relative to the actual film center height or thickness for a pixel and the area aperture ratios displayed in the second data table may be relative to the target film center height or thickness for a pixel. For both the first and second data table, GUI 300 may also display a threshold height difference, where a threshold percentage (e.g., 95% or the like) of data from pixels falls within the threshold height difference for the average center film height or thickness. The target thickness is editable and may be input into box 304 by a user.

Figure 4:
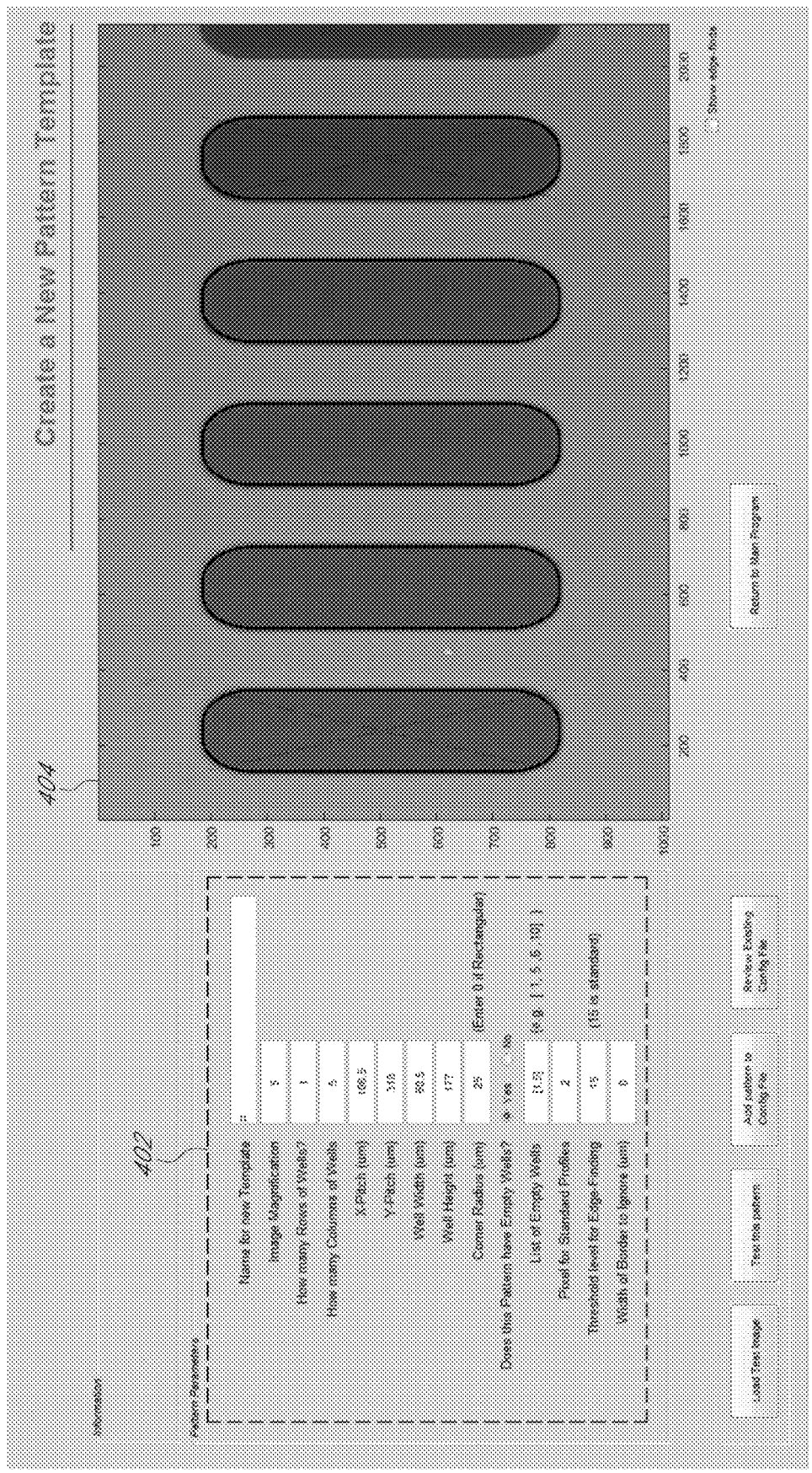
FIG. 4 is a graphical user interface for defining characteristics of a pattern template for banks or pixels on a substrate in accordance with the present disclosure.

FIG. 4 depicts one exemplary embodiment of a graphical user interface for defining characteristics of a pattern template for banks or wells on a substrate in accordance with the present disclosure. For example, an electronic display panel can comprise a pattern of banks or wells such that pixels can be printed onto the display (e.g., one or more film layers can be deposited on the surface of the display). GUI 400 illustrates an interface such that a template may be input that defines the pattern of banks or wells for an electronic display. Data table 402 includes defining parameters for a pattern such as a name, image magnification, number of bank or well rows, number of bank or wells columns, x-axis (horizontal) pitch distance, y-axis (vertical) pitch distance, bank or well width and height, corner radius, a binary parameter with regard to whether the pattern includes empty (e.g., control or unprinted) banks or wells, if empty banks or well are included, a list of such locations for such empty banks or wells, a number of pixels for a standard profile, a threshold distance for finding an edge of the electronic display, and/or a border width. The defining parameters for a pattern may be automatically generated based on the x-y-z data received from a profilometer or other instrument for a given electronic display panel and the automatically generated parameters may be editable by a user. In another example, the parameters for a pattern may be input by a user. The pattern may also be saved such that subsequently received data for electronic displays (e.g., film height for pixel data, bank or well profile, data, and the like) may be analyzed based on the pattern or such that a profilometer can be configured to determine profile data for a given electronic display that corresponds to the saved pattern. Those having ordinary skill in the art would appreciate that the pattern recognition for pixels may be accomplished for surfaces that do not have bank structure defining wells, but rather have material layers deposited in a patterned manner with spacing between adjacent pixels. In such exemplary embodiments, rather than defining bank parameters, spacing between the pixels can be defined and the remaining aspects of the pattern recognition can occur.

FIG. 5 depicts one exemplary embodiment of a data table illustrating analytical results from profile data for pixels on a substrate in accordance with the present disclosure. Data table 500 illustrates analytical results for x-y-z data received from a plurality of electronic display panels. For example, data table 500 may include an electronic display panel ID number, a sequence number that corresponds to a pattern template for banks or wells of the panel, a pixel average center film height or thickness for the panel, a whole pixel average film height or thickness for the panel, percent of area aperture ratios within a threshold distance (e.g., +/−10 nm, 5 nm, 2 nm, 1 nm, and the like) for the panel, average center film height of a pixel to minimum film height for the pixel difference for a panel, and average dried material (e.g., dried ink) volume in a bank or well for a pixel of the panel.

In an embodiment, one or more software interfaces in accordance with various embodiments may receive x-y-z data for a plurality of electronic displays (e.g., with or without film layers deposited in pixels). The x-y-z data may be analyzed such that profile data, such as the data displayed in data table 500, may be generated for the plurality of electronic displays. In an example, a file that comprises such x-y-z data can be processed in a time between 1 second and 5 minutes, depending on the file size. The developed database of profile data for the electronic displays may then be analyzed to enhance the manufacturing process.

FIGS. 6A-6E depict an exemplary embodiment of graphical user interfaces that include interactive tables and graphs for defining a layout and displaying profile data of one or more pixels on a substrate in accordance with the present disclosure. FIG. 600A illustrates a grid 602 of individual pixel graphs adjacent to a composite pixel graph 604. Grid 602 of individual pixel graphs displays film height or thickness for individual pixels while composite graph 604 displays an overlay of the film height or thickness from grid 602. In various exemplary embodiments, the individual graphs of grid 602 may display film height or thickness in different line colors, and composite pixel graph 604 may graph film height or thickness such that the line color of graphed film heights corresponds to the color displayed for the individual graphs within grid 602.

Figure 6A:
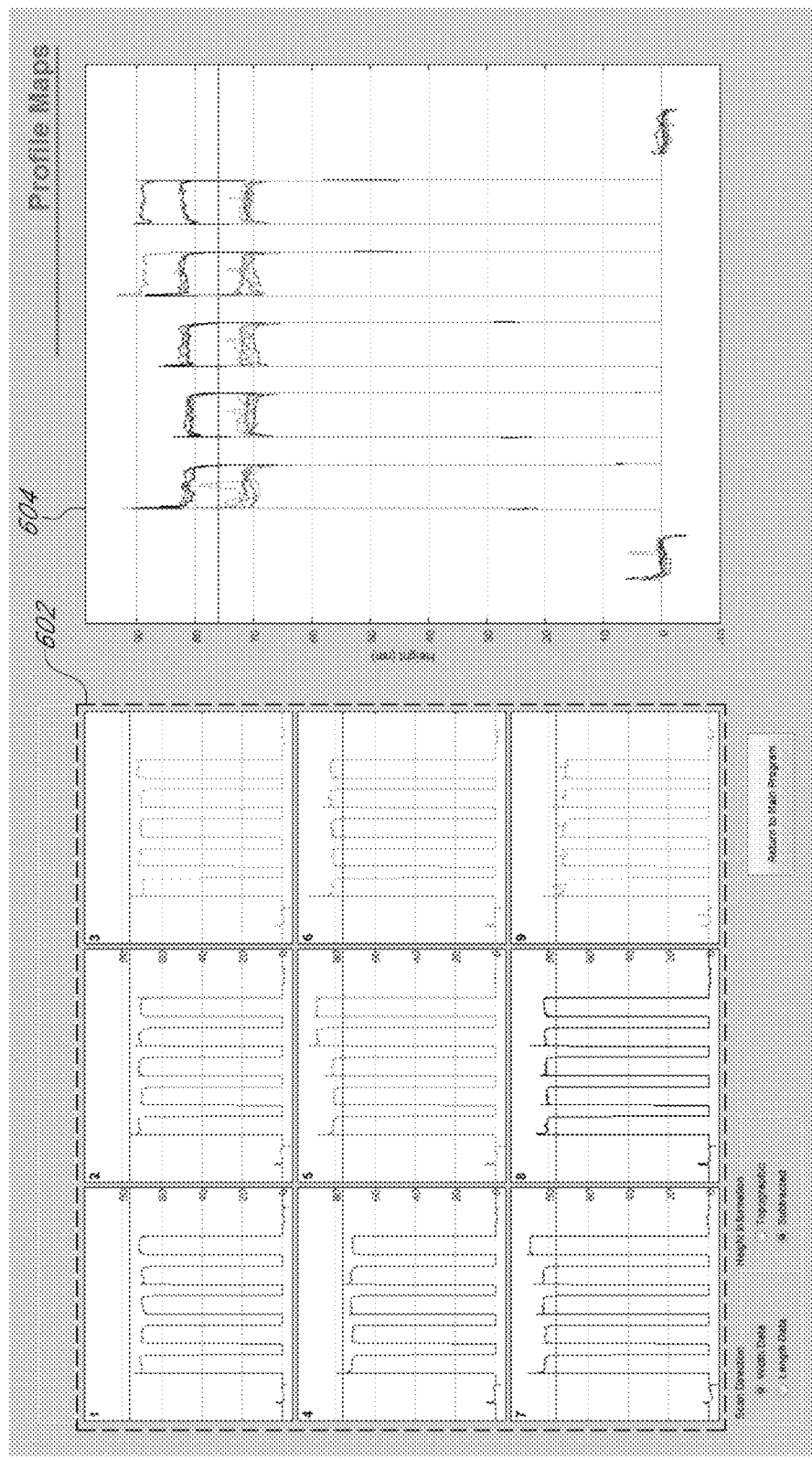
FIGS. 6A-6E are graphical user interfaces that include interactive tables and graphs for defining a layout and displaying profile data of one or more pixels on a substrate in accordance with the present disclosure.
Figure 6B:
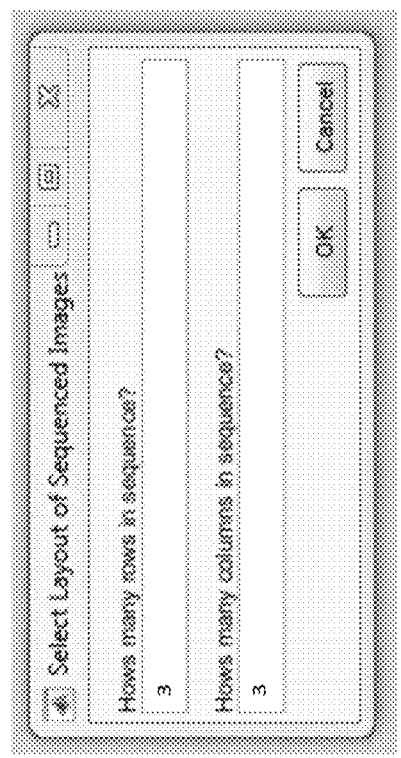
Figure 6C:
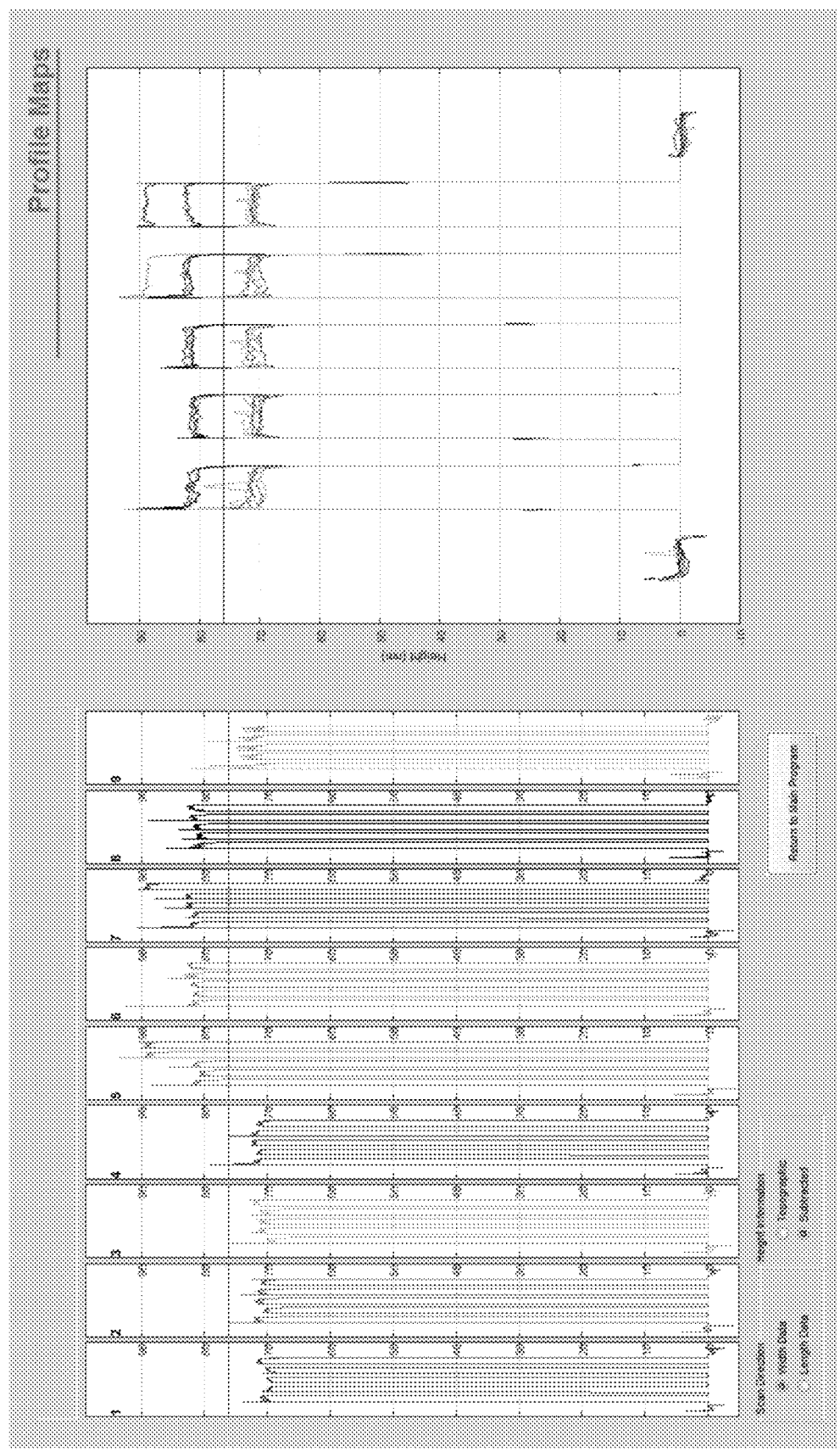
Figure 6D:
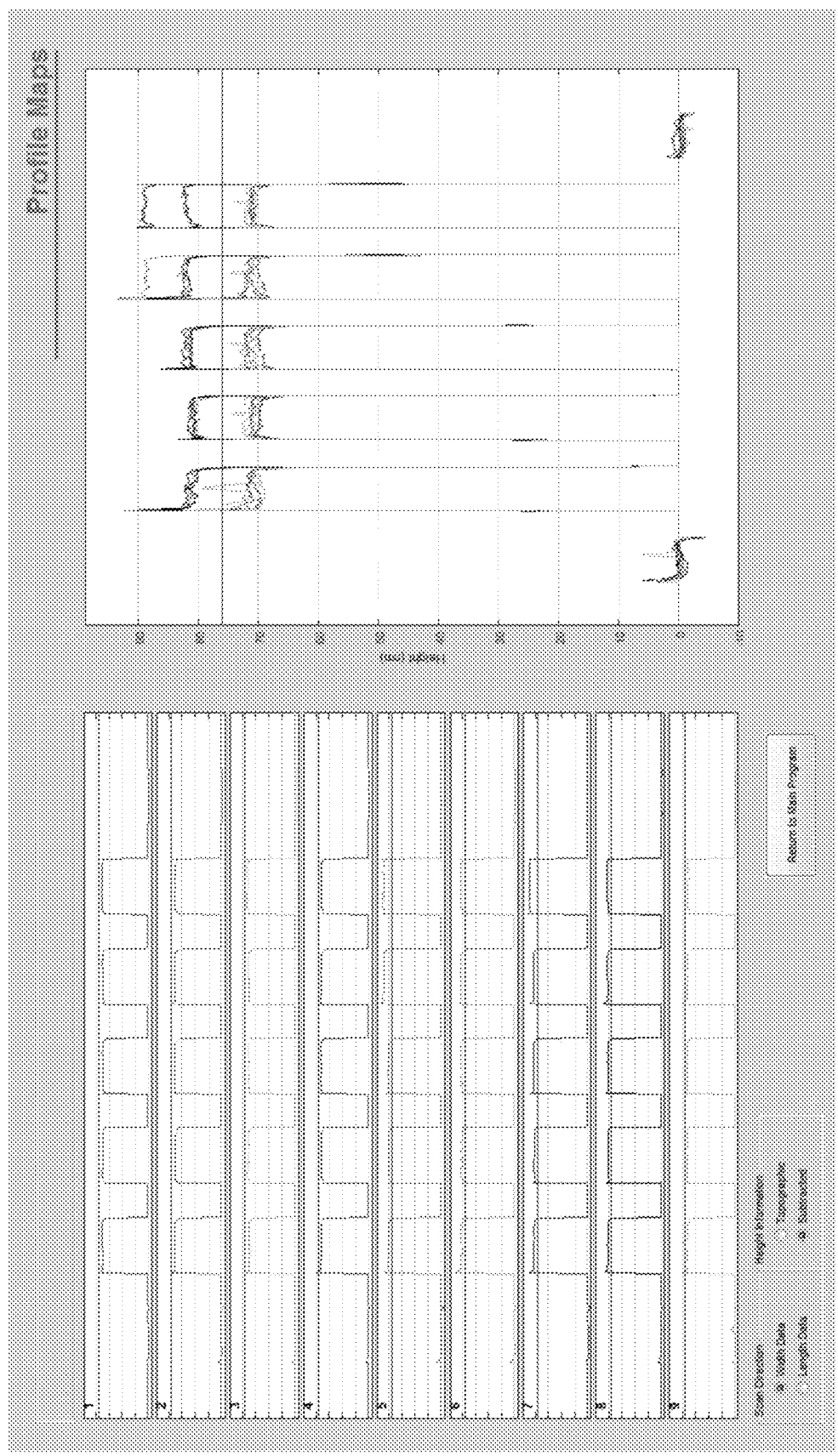

In various exemplary embodiments, grid 602 is configurable by a user. For example, FIG. 6B illustrates an interface 600B for selecting a number of rows and a number of columns for grid 602. FIG. 6C and GUI 600C illustrate a grid with a single row and 9 columns. FIG. 6D and GUI 600D illustrate a grid with a 9 rows and single column. In various embodiments, a user may select one of the individual graphs of a grid (e.g., by clicking the graph), and the graphed line from composite pixel graph 604 that corresponds to the selected individual graph is highlighted based on the selection.

Figure 6E:
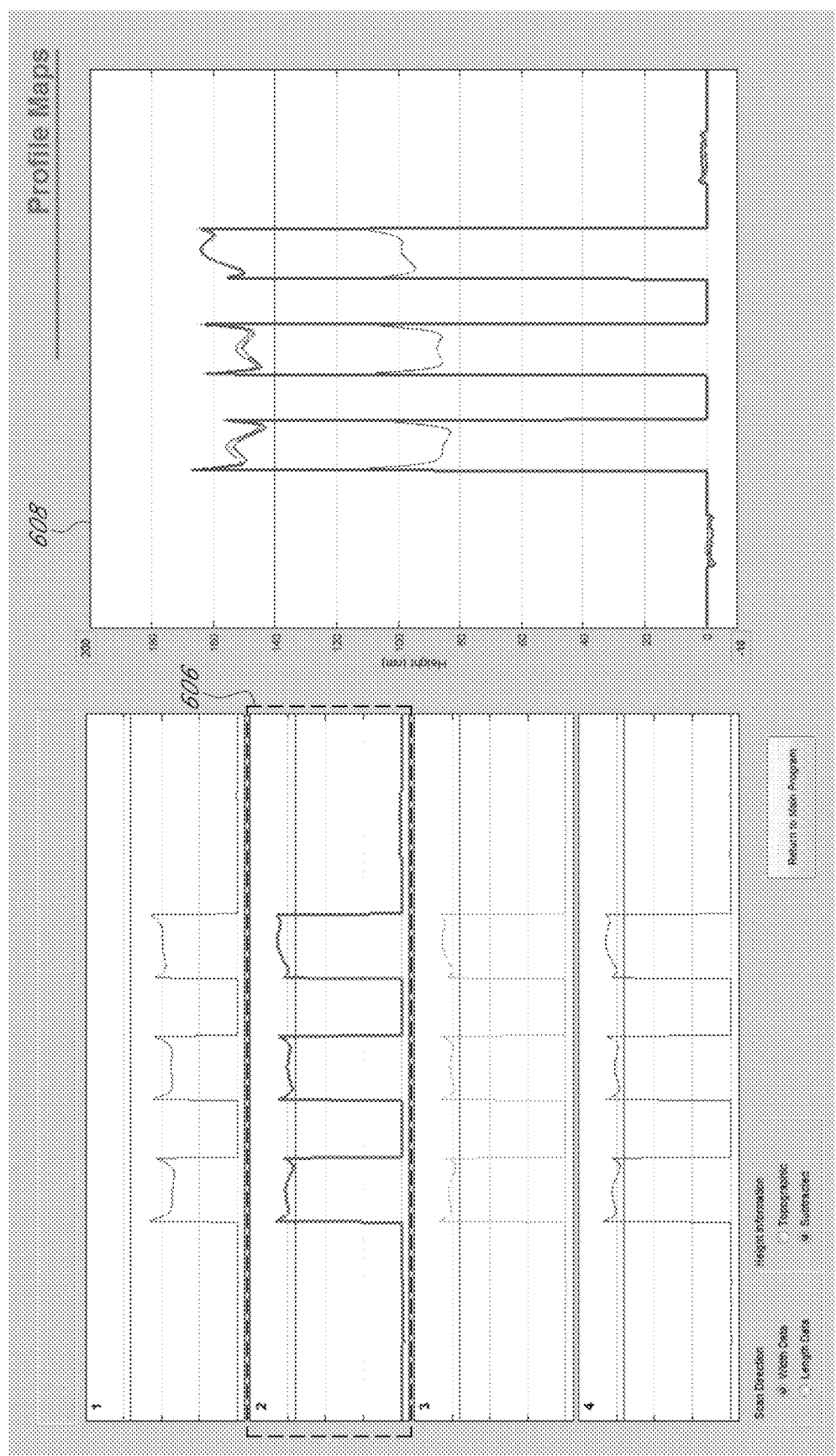

FIG. 6E and GUI 600E illustrates a grid with 4 rows and a single column. GUI 600E also illustrates an error or abnormality detection of the present embodiment based on graph 606 and composite pixel graph 608. For example, graph 606 displays film height or thickness data from a particular pixel in a particular color. The graphed film height or thickness that corresponds to the particular color displayed in composite pixel graph 608 shows that the height or thickness for this particular pixel deviates greatly from the height or thickness for the other pixels displayed in the composite graph. Accordingly, a user can readily detect an error or abnormality for the particular pixel graphed according to the particular color.

Figure 7A:
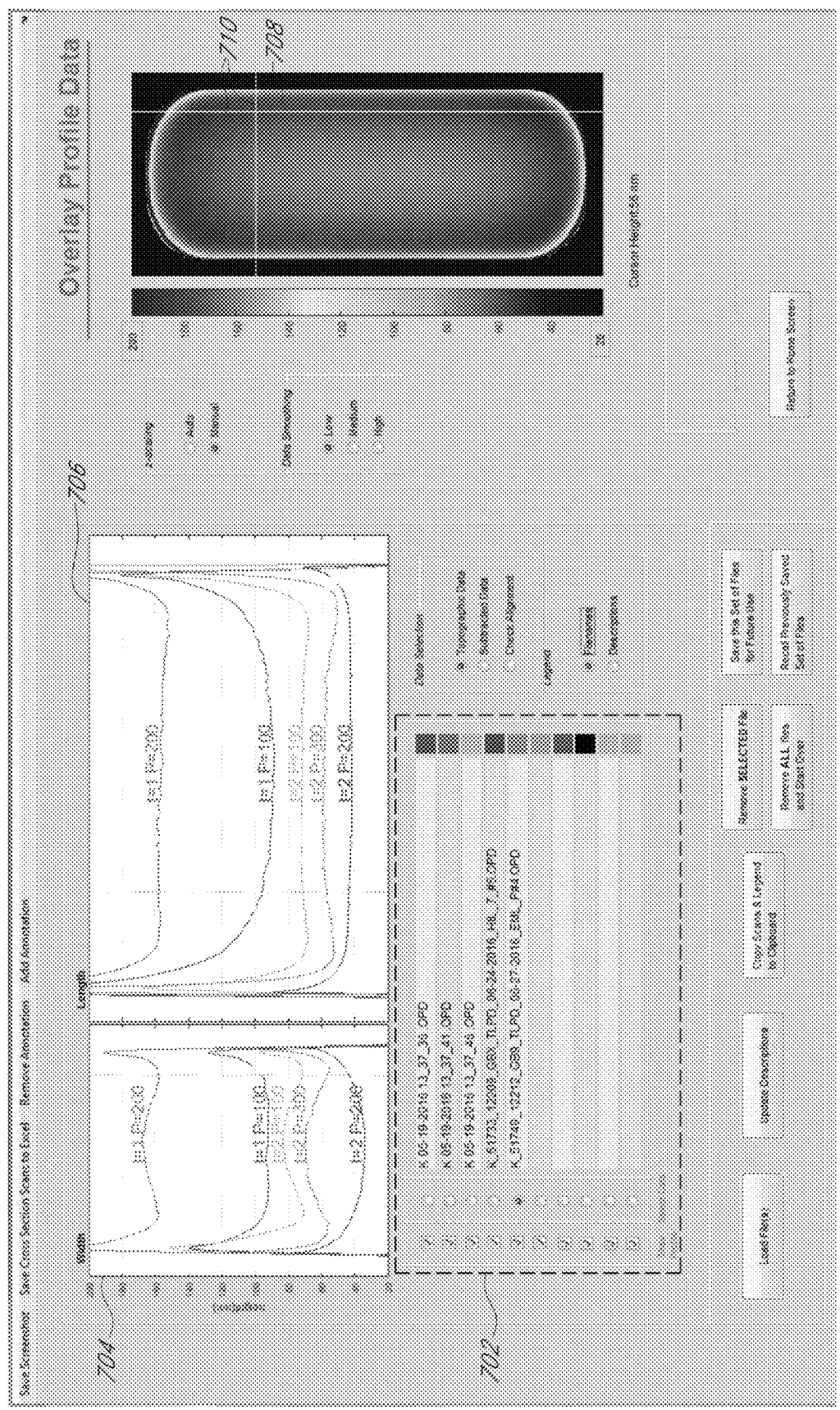
FIGS. 7A-7F are graphical user interfaces that include interactive graphs, maps, tables, and widgets for displaying profile data of one or more ink layers for one or more pixels on a substrate in accordance with the present disclosure.

FIGS. 7A-7F depict an exemplary embodiment of graphical user interfaces that include interactive graphs, maps, tables, and widgets for displaying profile data of one or more film layers for one or more pixels on a substrate in accordance with the present disclosure. GUI 700A of FIG. 7A is an interactive overlay interface that comprises selectable data table 702, graphs 704 and 706, heat map of a pixel 708, and cross-hair 710. Selectable data table 702 illustrate a plurality of film layers deposited on the electronic display panel to form the pixel represented in heat map of a pixel 708.

For example, GUI 700A illustrates five film layers that form the illustrated pixel, and each of the five layers is selected for display in graphs 704 and 706. Data table 702 also illustrates a legend the relates a particular data layer to a particular color, and graphs 704 and 706 display the height or thickness for a layer in the corresponding color for the layer. A user may also select a layer for data to be displayed by heat map of a pixel 708. Heat map of a pixel 708 may be similar to heat map of pixels 202 from FIG. 2A.

Figure 7B:
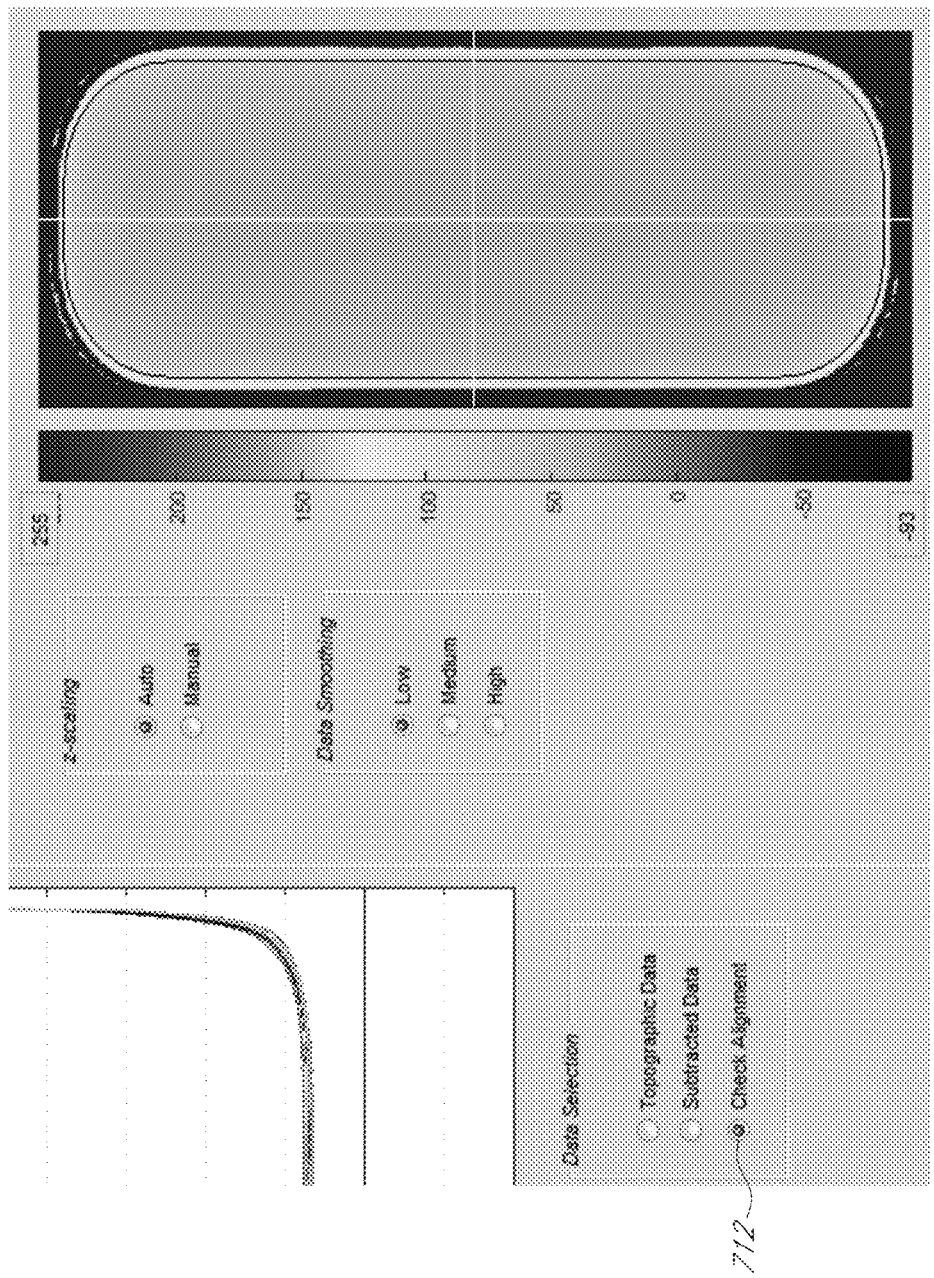

In an example, GUI 700B of FIG. 7B illustrates radio button 712, which can be used to select whether heat map of a pixel 708 displays topographic data or subtracted data (e.g., data received from a profilometer for the pixel minus data from a control pixel). GUI 700B of FIG. 7B shows a check alignment selection for radio button 712, which can be used to show a plurality of the layers that form the relevant pixel in heat map of a pixel 708 to check the alignment for the layers.

Figure 7C:
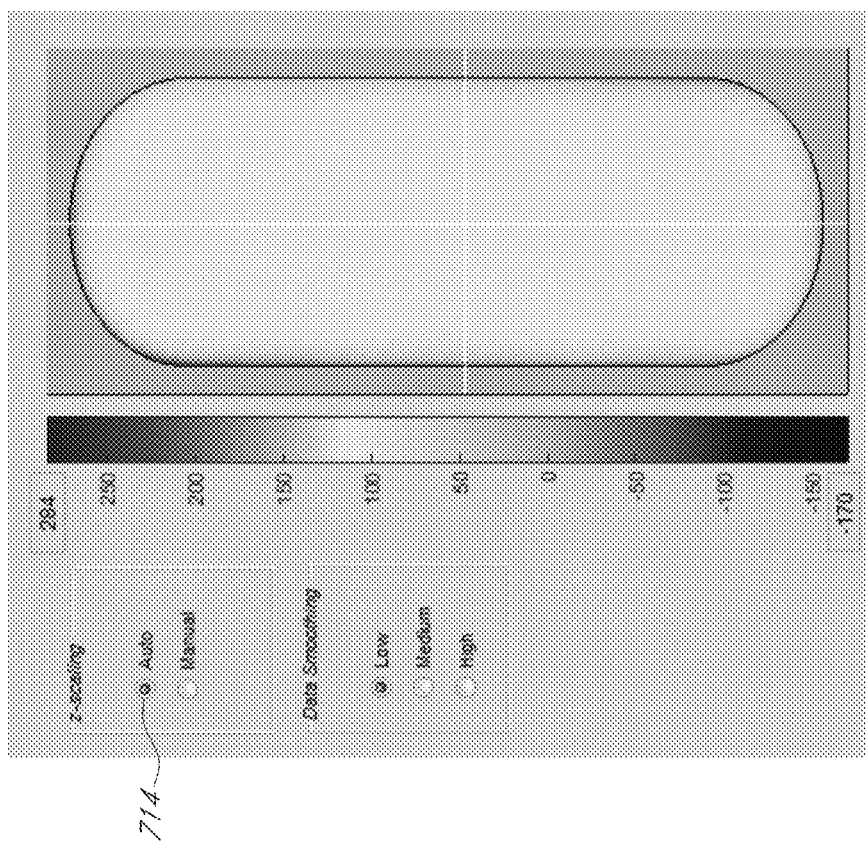
Figure 7D:
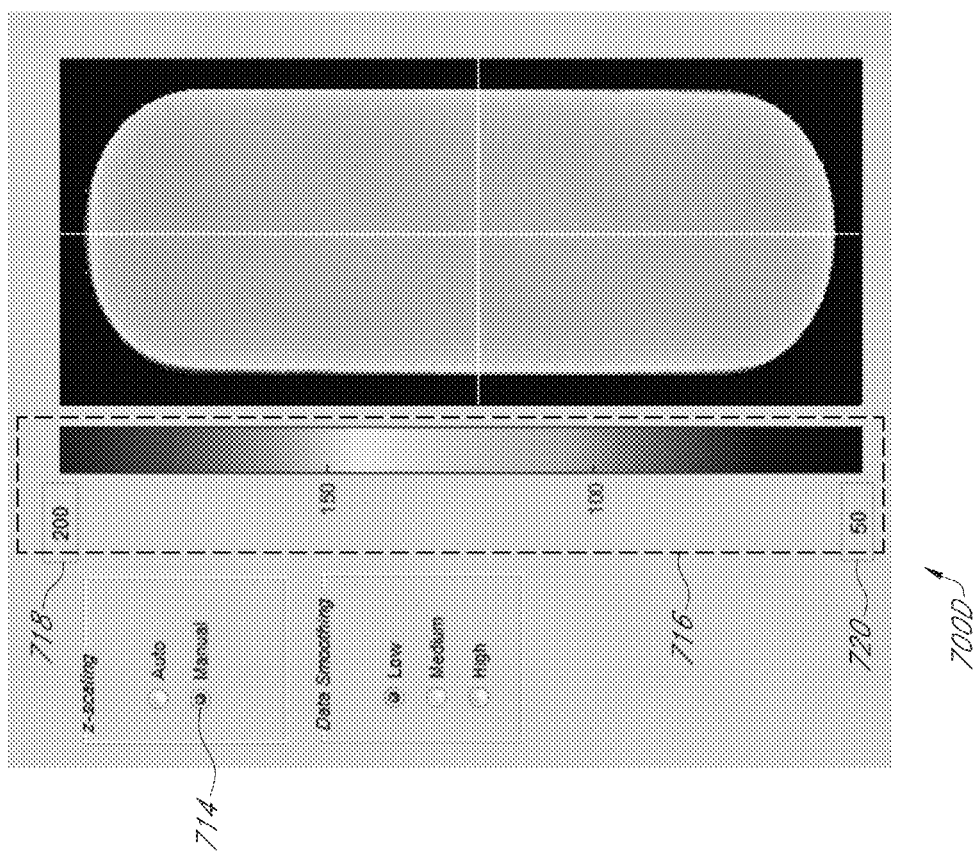

Heat map of a pixel 708 may also include a scale for the heat map, as illustrated. GUI 700C of FIG. 7C illustrates radio button 714, which can be used to select an automatic scale or a manual scale. The automatic scaling may select a scale based on the data for the layers of the pixel received from the profilometer. GUI 700D of FIG. 7D shows manual scale 716, where a user may manually input a scale in boxes 718 and 720.

Figure 7E:
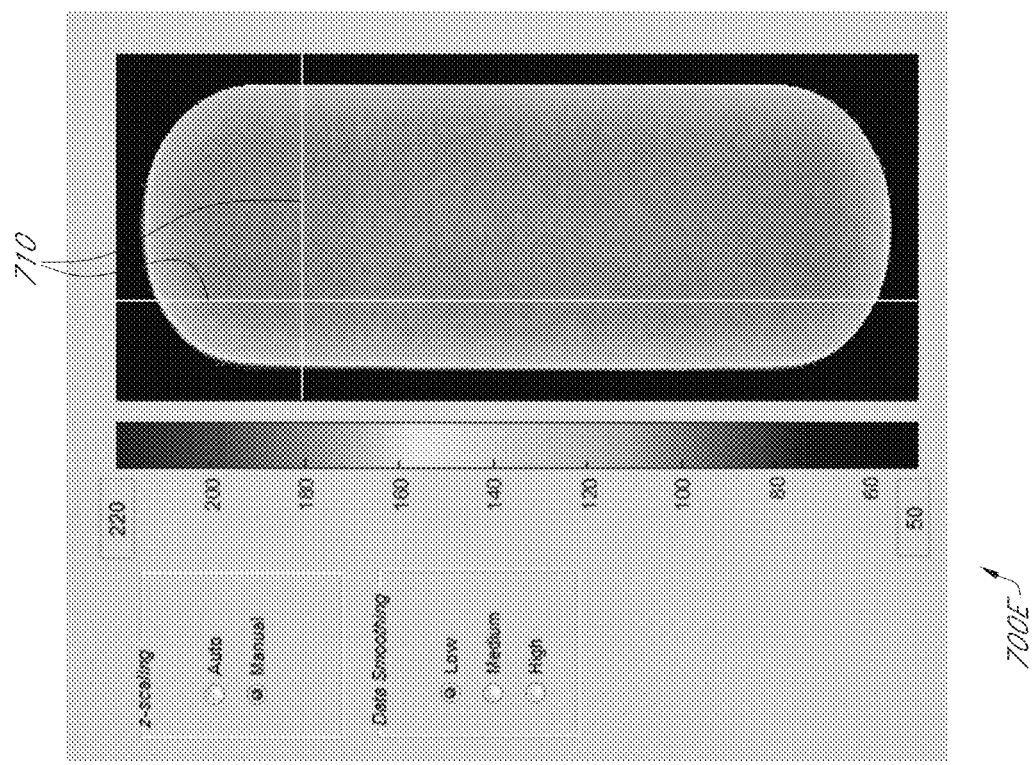
Figure 7F:
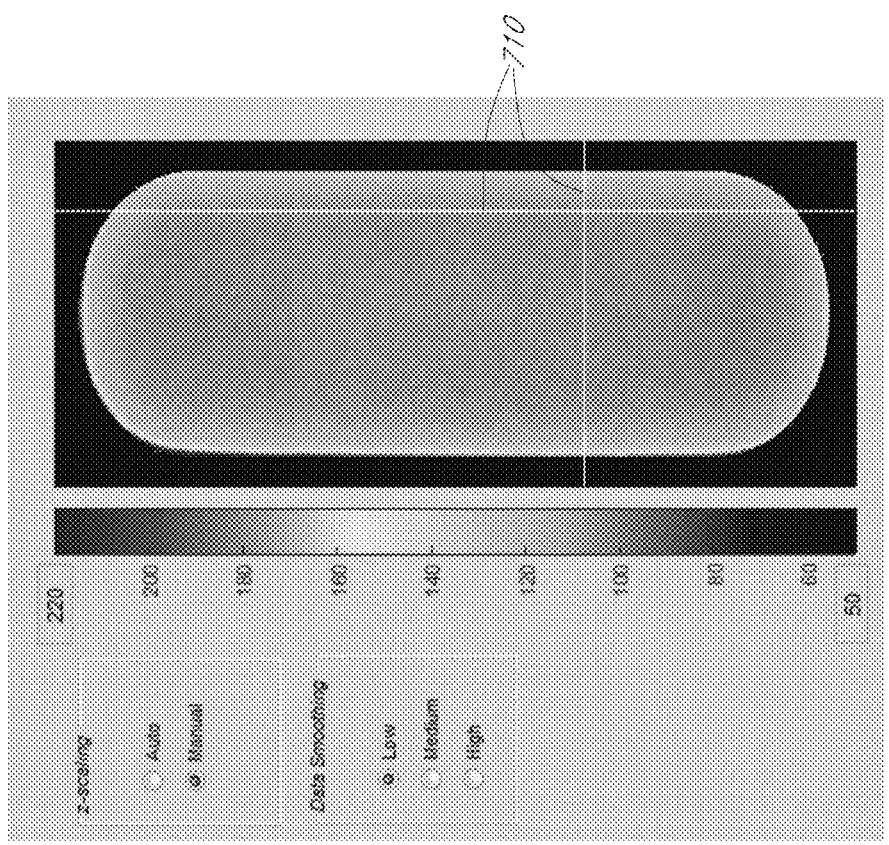

GUI 700E of FIG. 7E illustrates cross-hair 710. Cross-hair 710 may be similar to cross-hair 204 of FIG. 2A. For example, cross-hair 710 may be selectable by a user such that the cross-hair may be moved to any other location on heat map of a pixel 708. Graphs 704 and 706 each comprise an indication for the location corresponding to the location of cross-hair 710 on the heat map of a pixel 708, and the indication moves along with the movement of cross-hair 710. For example, as cross-hair 710 is moved by a user, the indication corresponding to cross-hair 710 displayed on graphs 704 and 706 also moves such that the GUI appears to continuously change along with the movement of crosshair 710. GUI 700F of FIG. 7F illustrates cross-hair 710 that has been moved to a new location on heat map of a pixel 708.

Figure 8A:
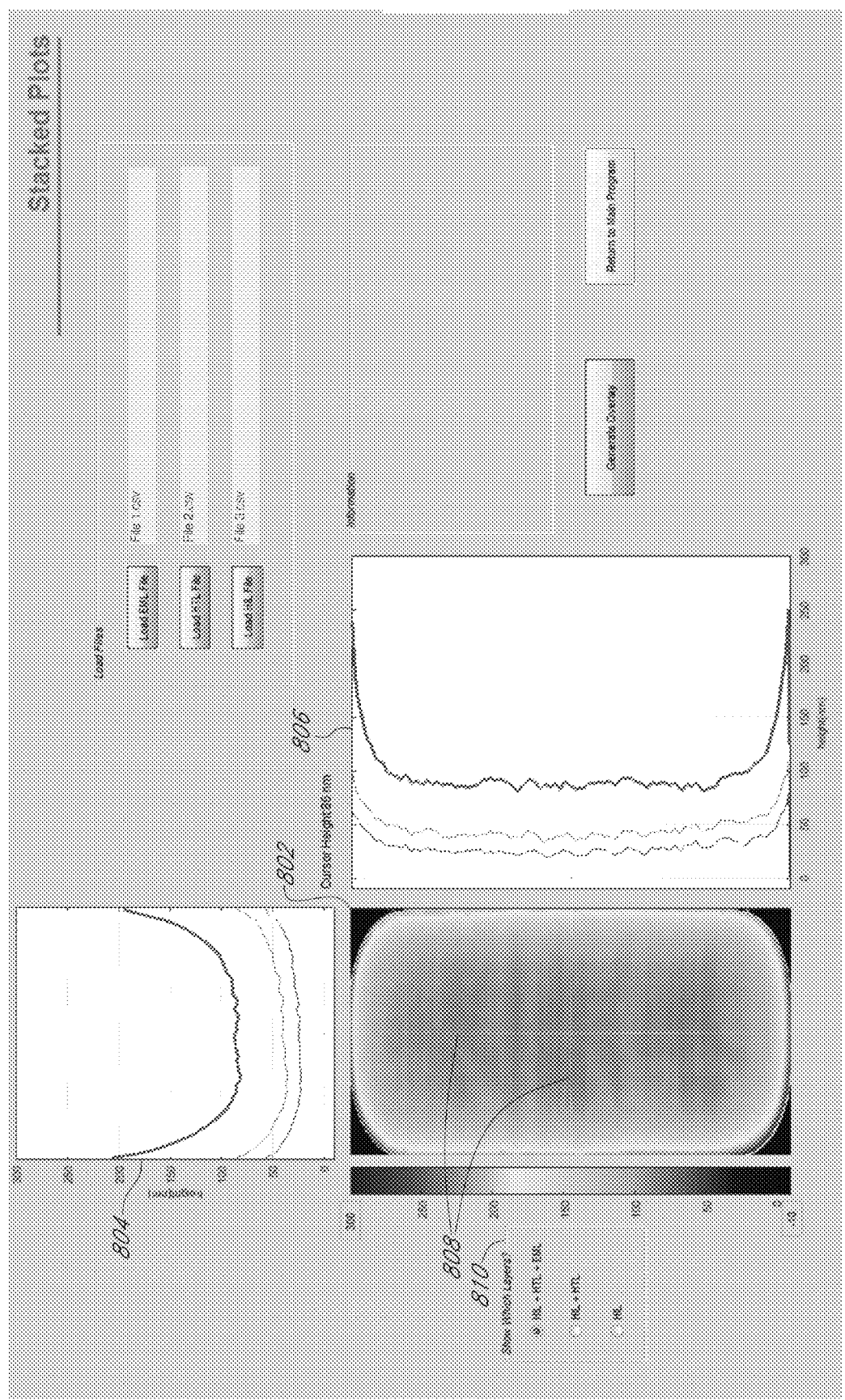
FIGS. 8A-8B are graphical user interfaces that include interactive graphs, maps, and widgets for displaying profile data of one or more ink layers for one or more pixels on a substrate in accordance with the present disclosure.
Figure 8B:
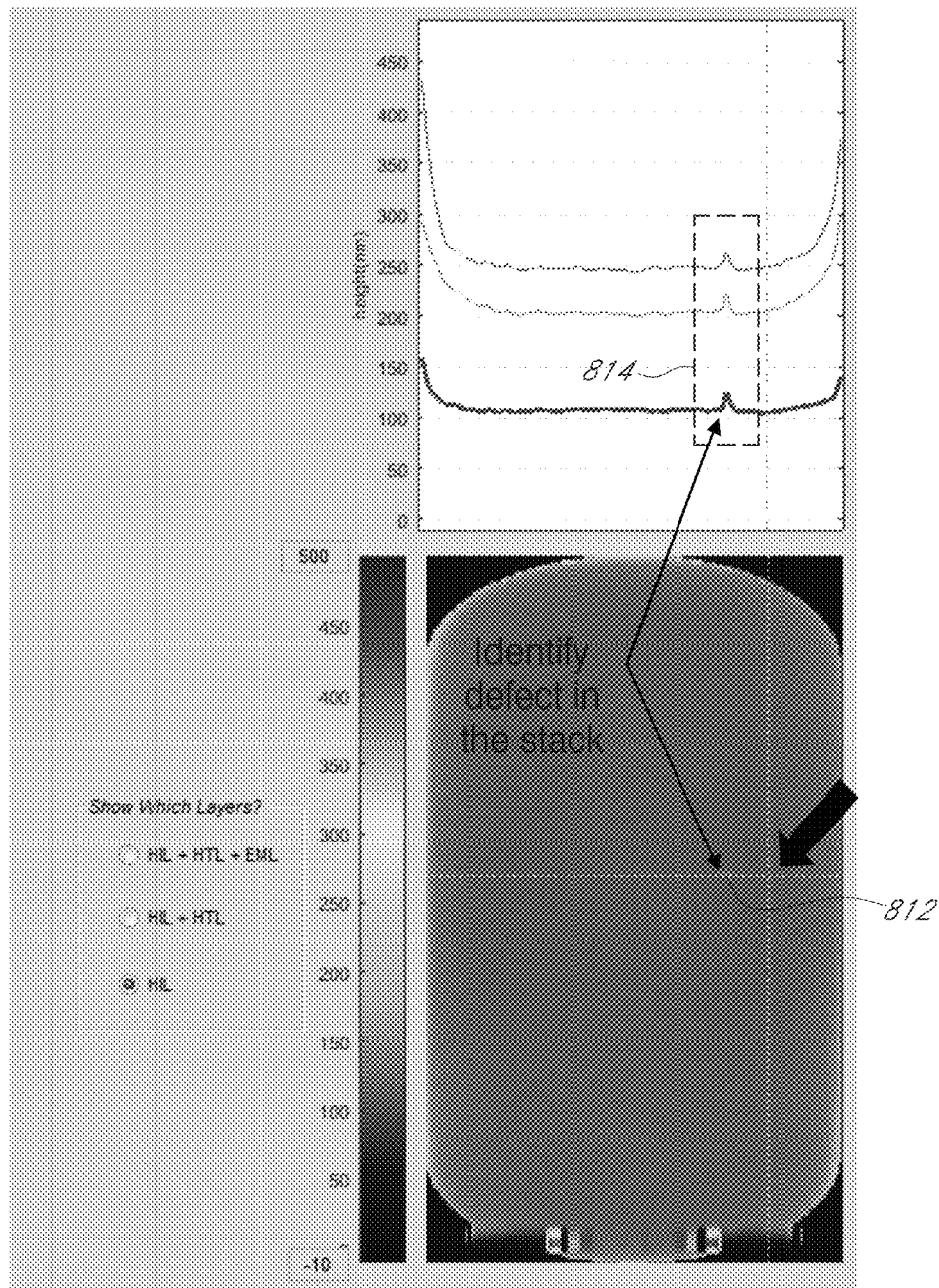

FIGS. 8A-8B depict an exemplary embodiment of graphical user interfaces that include interactive graphs, maps, and widgets for displaying profile data of one or more film layers for one or more pixels on a substrate in accordance with the present disclosure. GUI 800A of FIG. 8A is an interactive overlay interface that comprises heat map of a pixel 802, graphs 804 and 806, and cross-hair 808. Heat map of a pixel 802, graphs 804 and 806, and cross-hair 810 may be similar to heat map of pixels 202, cross-hair 204, and graphs 206 and 208 of FIG. 2A. For example, graphs 804 and 806 may display film layer height or thickness corresponding to the pixel data displayed in heat map of a pixel 802. Cross-hair 808 may comprise a cursor that is moveable by a user such that the intersection of cross-hair 808 and graphs 804 and 806 illustrate a film height for the location on the heat map of a pixel pointed to by cross-hair 808.

Radio button 810 may be used to select layer data that is displayed in heat map of a pixel 802 and graphs 804 and 806. For example, GUI 800A illustrates a selection of layers HIL, HLT, and EML, and each of the three layers is displayed in heat map of a pixel 802 and graphs 804 and 806. The individual layers may each correspond to a color for the graphed lines displayed in graphs 804 and 806.

FIG. 8B illustrates error or abnormality detection of the present embodiment based on heat map of a pixel 802 and graph 804. For example, heat map of a pixel 802 illustrated in FIG. 8B displays a single layer HIL for the related pixel and shows an abnormality 812. Graph 804 of FIG. 8B illustrates a corresponding abnormality 814. This abnormality shown in FIG. 8B indicates a lack of uniformity for the HIL ink layer of the represented pixel. Such a lack of uniformity can cause performance errors and otherwise reduce the effective of an electronic display, such as an OLED display. FIG. 8B illustrates how the interactive graphical user interface enables detection of such an error.

In an exemplary embodiment, the error illustrated in FIG. 8B may be automatically flagged for review as a potential error by automated techniques. For instance, it may be determined that a change in slope for one of more of the graphed lines from graph 804 exceeds an error criteria (e.g., slope threshold). In another example, it may be determined that multiple changes in slopes (e.g., based on the spike associated with abnormality 814) over a predetermined window (e.g., x-axis range) exceed an error criteria. Based on the automatic flagging, an indicator may be displayed related to abnormality 814, and a user may review the remaining data for the pixel to determine whether the abnormality results in a quality error.

Figure 9A:
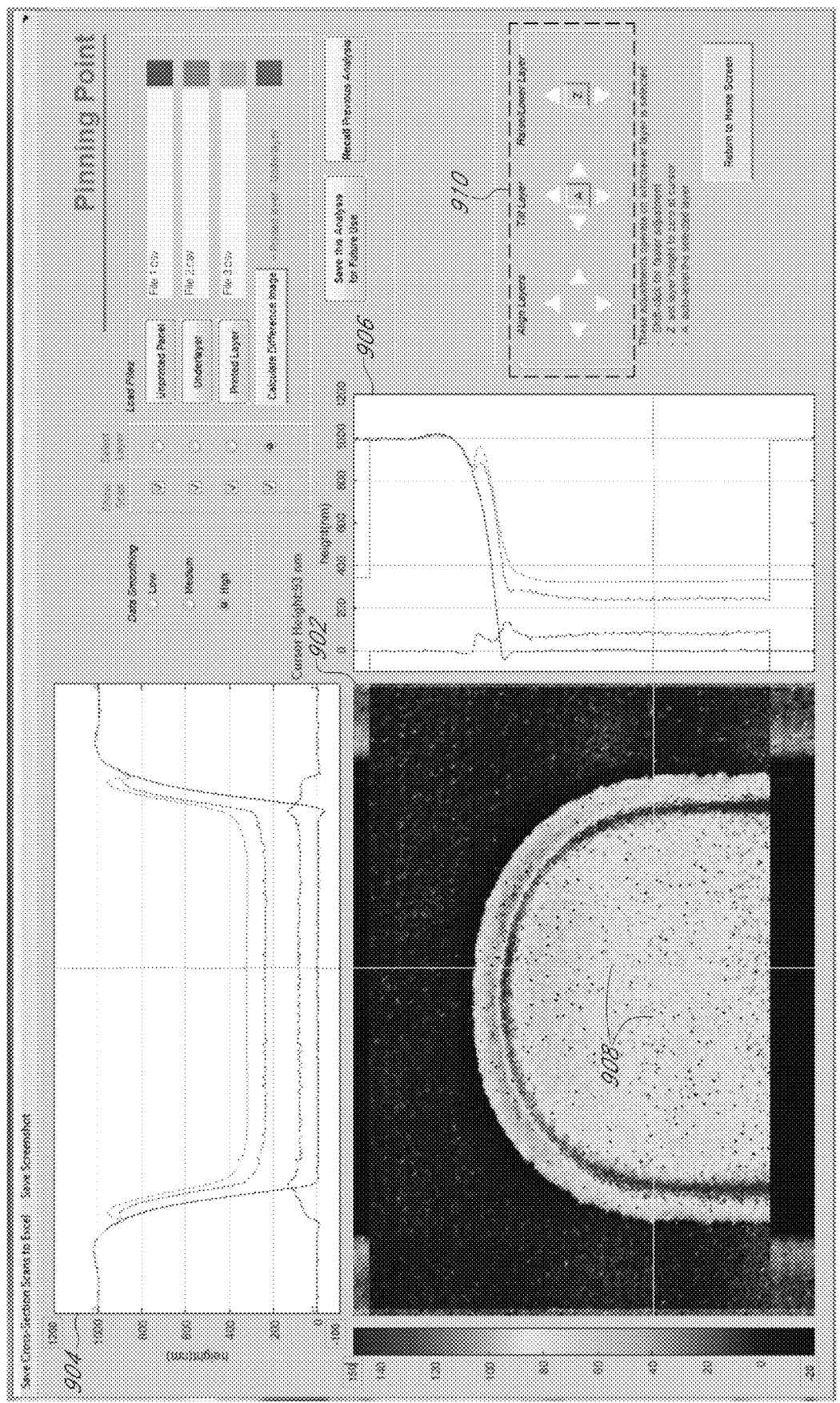
FIGS. 9A-9B and 9D-9H are graphical user interfaces that include interactive graphs, maps, and widgets for displaying profile data of one or more ink layers for one or more pixels on a substrate in accordance with the present disclosure.

FIGS. 9A-9H depict an exemplary embodiment of graphical user interfaces that include interactive graphs, maps, and widgets for displaying profile data of one or more film layers for one or more pixels on a substrate in accordance with the present disclosure. GUI 900A of FIG. 9A is an interactive pinning point interface that comprises heat map of a pixel 902, graphs 904 and 906, and cross-hair 908, and alignment interface 910. Heat map of a pixel 902, graphs 904 and 906, and cross-hair 910 may be similar to heat map of pixels 202, cross-hair 204, and graphs 206 and 208 of FIG. 2A. For example, graphs 904 and 906 may display film layer height or thickness corresponding to the pixel data displayed in heat map of a pixel 902. Cross-hair 908 may comprise a cursor that is moveable by a user such that the intersection of cross-hair 908 and graphs 904 and 906 illustrate a film height for the location on the heat map of a pixel pointed to by cross-hair 908.

Heat map of a pixel 902 may display a cross-section for a given pixel and graphs 904 and 906 may display film height or thickness for a plurality of layers of the given pixel. A pinning point may illustrate the shape of a film layer of an electronic display (e.g., a film layer on top of an underlayer or a base surface of a substrate). For example, FIG. 9A illustrates a distribution of materials after drying inside a top edge of a pixel or subpixel. Heat map of a pixel 902 shows the height or thickness of film layers, and height or thickness profile information at any location of heat map of a pixel 902 can be determined by navigating with the crosshair 908.

In some embodiments, the pinning point can be defined as the point at which a film layer (e.g., a printed film layer) and an underlying surface (which may be of either a film layer underlying the film layer of interest or a base surface of a substrate on which the layers are deposited) converge. For example, a layer may correspond to one or more of the OLED stack film structures that include the HIL layer, HTL layer, EML layer, ETL layer, and EIL layer, as illustrated in FIG. 1B. The underlayer may correspond to the layer beneath the film layer for which the pinning point is being analyzed within the OLED stack or, in some instances, the base surface of the substrate of the OLED stack when no underlayer is beneath the film layer being analyzed. The pinning point for an individual layer may be the location at which the individual layer being analyzed converges with the respective underlayer or converges with the base surface when no such underlayer for the individual layer is present. Other embodiments that comprise different combinations of layers, different layers, or any other suitable configuration may similarly be implemented.

Figure 9B:
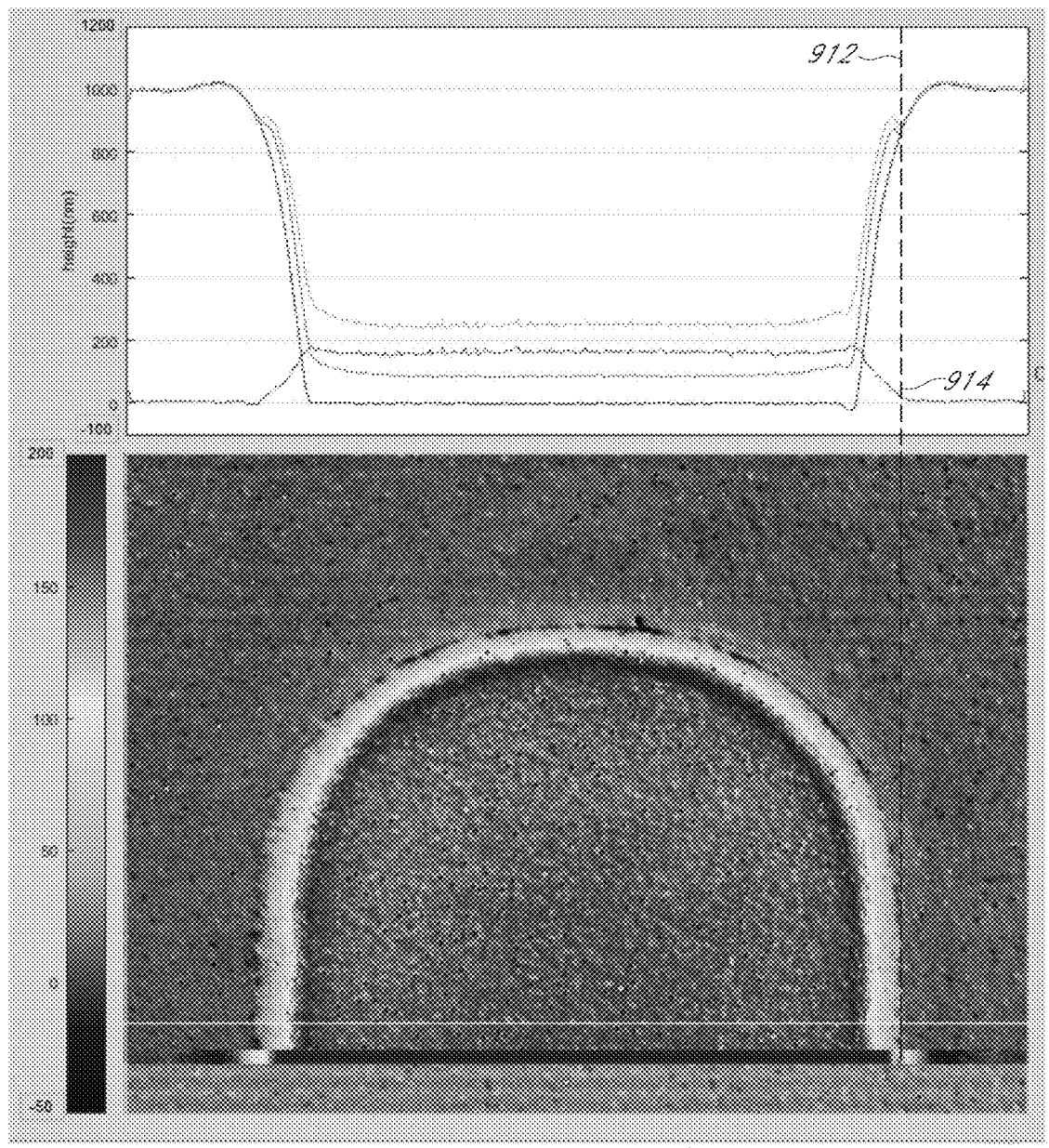

GUI 900B of FIG. 9B illustrates pinning point 912. This can be seen on graph 904 as the point at which the film layer being analyzed (corresponding to a first line color (gray scale coloring being depicted in the drawings)) and the underlayer (correspond to a second line color) converge. Such a convergence can be considered a first indication of the pinning point. A second indication of the pinning point can be seen as the point at which the subtraction line (corresponding to a third line color), or the line comprising the subtraction of the underlayer from the deposited (e.g., printed) film layer, reaches zero, or pinning point 914. Lastly, the third indication may be from the heat map of a pixel 902, which confirms that the location corresponding to the identified pinning points 912 and 914 does not comprise a film layer height or thickness. Accordingly, the graphs, heat maps, and interfaces displayed in GUI 900B readily enable detection of a pinning point for a layer of interest of a pixel.

Figure 9C:
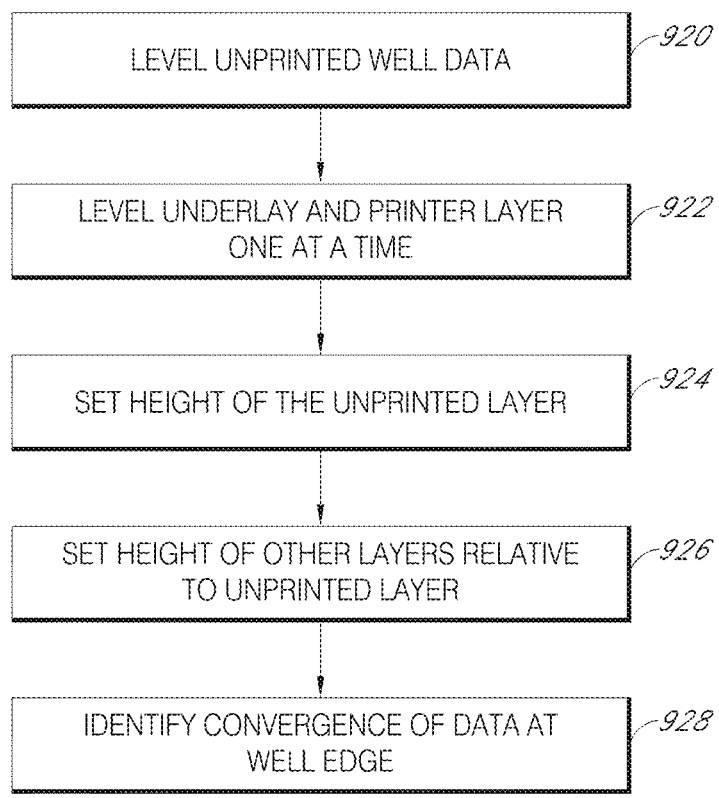
FIG. 9C depicts a method for determining a pinning point for one or more pixels on a substrate in accordance with the present disclosure.

FIG. 9C illustrates an exemplary method for determining a pinning point in accordance with an embodiment, which will be describe in connection with layers that are deposited via printing, although those of ordinary skill in the art would appreciate that the layers can be deposited using a variety of other techniques as discussed herein. At step 920, the unprinted bank or well data (the data relating to a base surface without any film layers thereon) may be leveled. For example, interface 910 may be used to select a given layer (e.g., the base surface of a substrate), align the selected layer, and tilt the selected layer until the layer data is leveled. At step 922, a similar leveling may be performed for the underlayer and the deposited film layer (e.g., printed layer) overlying the underlayer.

At step 924, a height of the unprinted layer may be set. At step 926, a height of the underlayer and deposited (e.g., printed) layer may be set. At step 928, a convergence of the underlayer or unprinted layer and the printed layer may be identified as the pinning point. For example, a subtraction of the printed layer from the unprinted layer or underlayer allows for the calculation of net material distribution in an area of interest. This effectively shows the edge boundary of the deposited materials (e.g., inkjet materials), otherwise known as the pinning point.

Figure 9D:
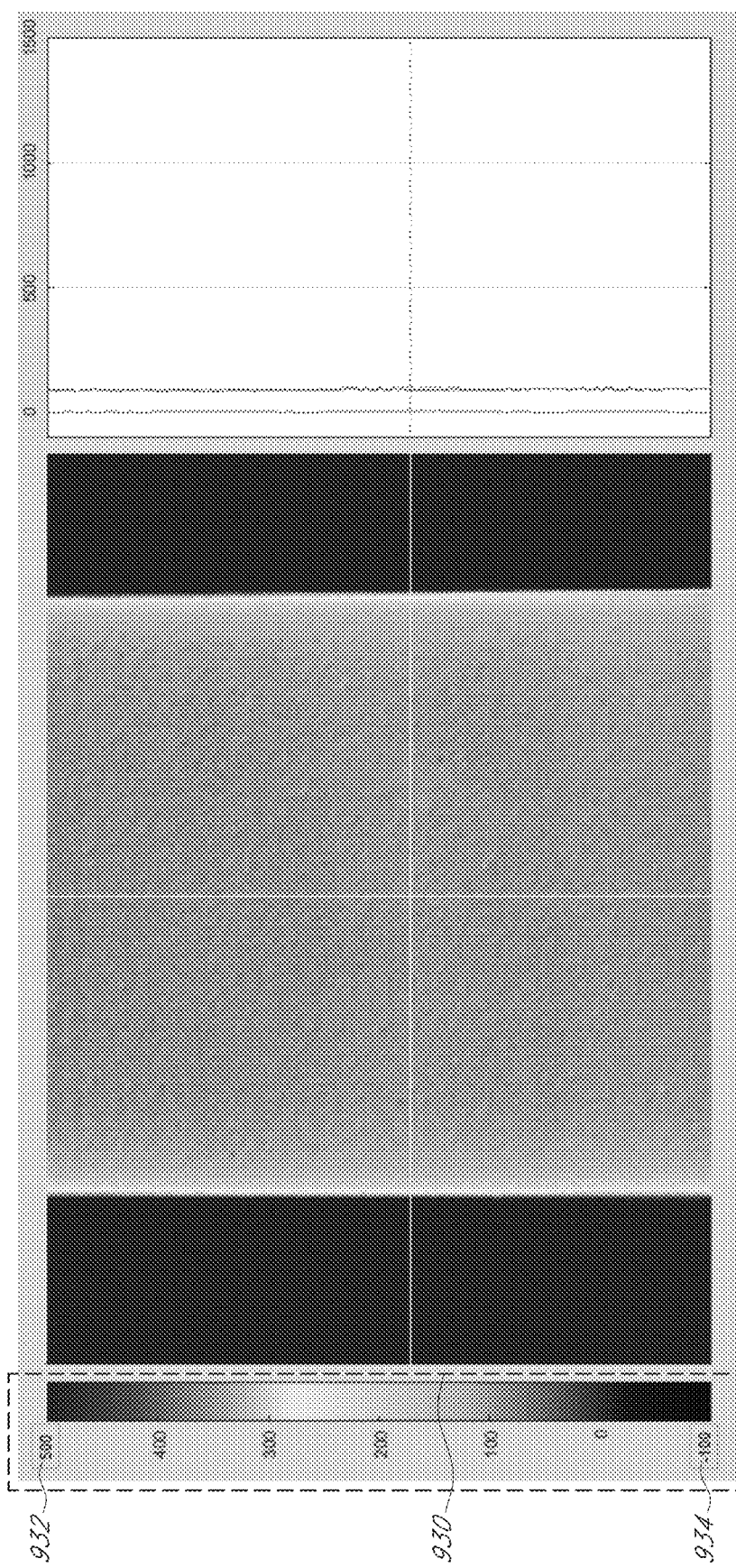
Figure 9E:
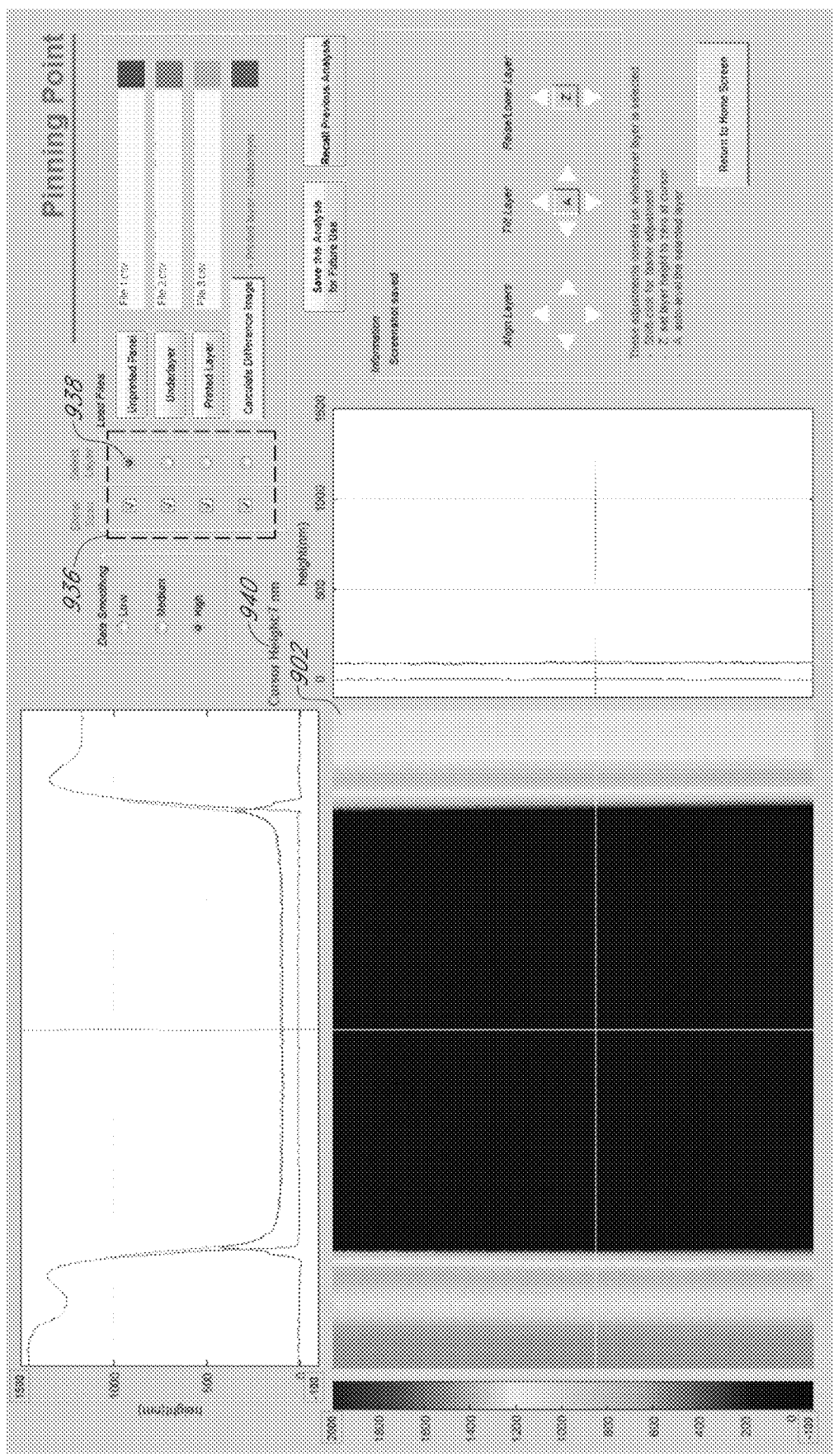

Heat map of a pixel 902 may also include a scale for the heat map, as illustrated. GUI 900D of FIG. 9D illustrates scale 930, where a user can manually input a scale in boxes 932 and 934. Scale 930 may be similar to scale 716 of FIG. 7D. GUI 900E of FIG. 9E illustrates a portion of FIG. 9A. Selectable interface 936 can be used by a user to select the data to be displayed in heat map of a pixel 902 and graphs 904 and 906. For example, data for one or more of the base surface (e.g., unprinted layer), the underlayer, the deposited film layer (e.g., printed layer), and the difference layer (e.g., printed layer—underlayer (if any)) for the given pixel may be displayed.

Figure 9F:
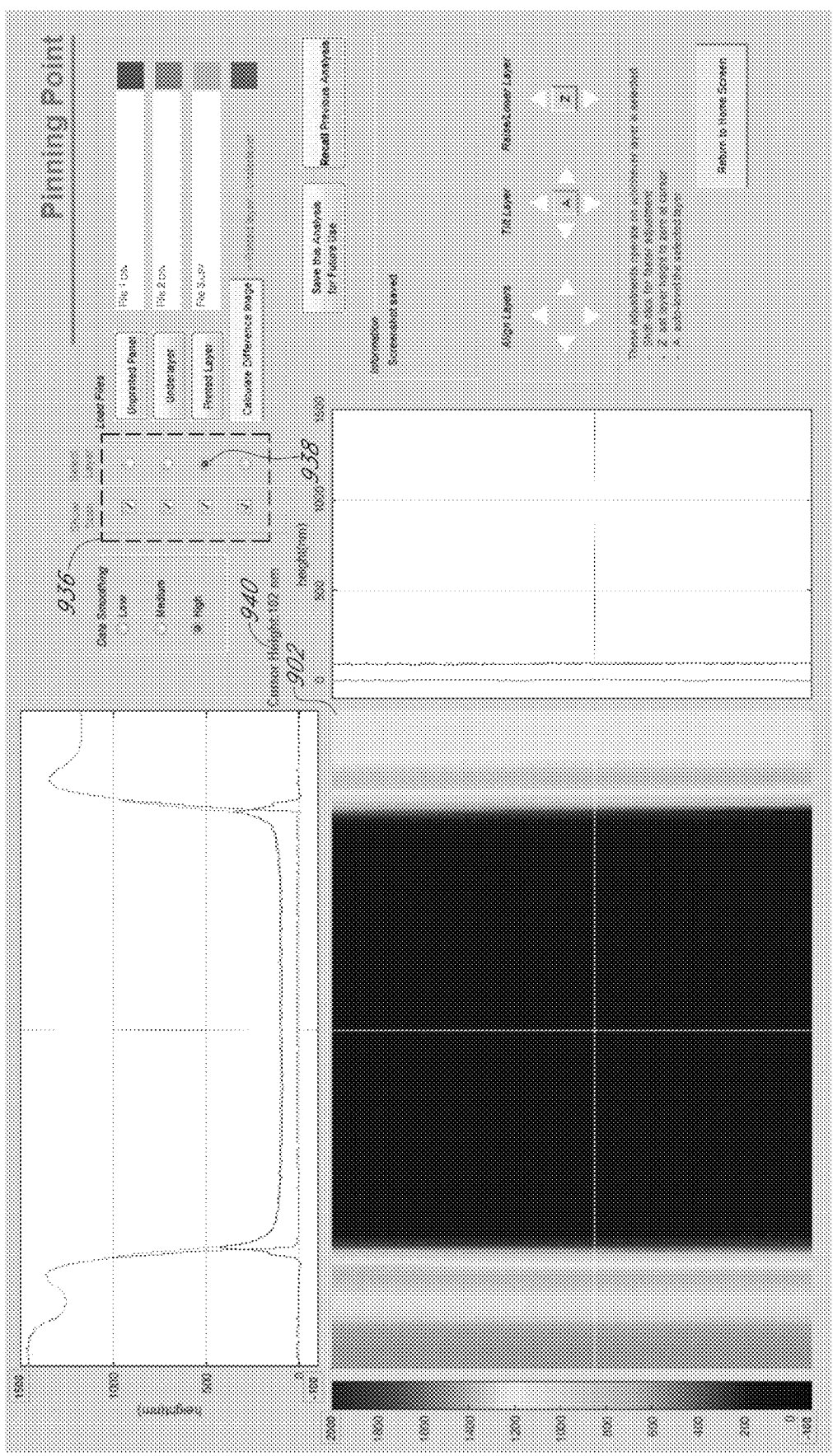

GUI 900E illustrates that each of the unprinted layer, the underlayer, the deposited (e.g., printed layer), and the difference layer have been selected for display in graphs 904 and 906 and that the base surface (e.g., unprinted layer) has been selected for display for the heat map of pixel 902, as indicated by radio button 938. GUI 900F of FIG. 9F illustrates that the deposited film layer (e.g., printed layer) has been selected for display for the heat map of pixel 902, as indicated by radio button 938. Cursor height 940 provides an indication of the height or thickness for selected film layers at a location of the displayed pixel pointed to by cross-hair 908.

Figure 9G:
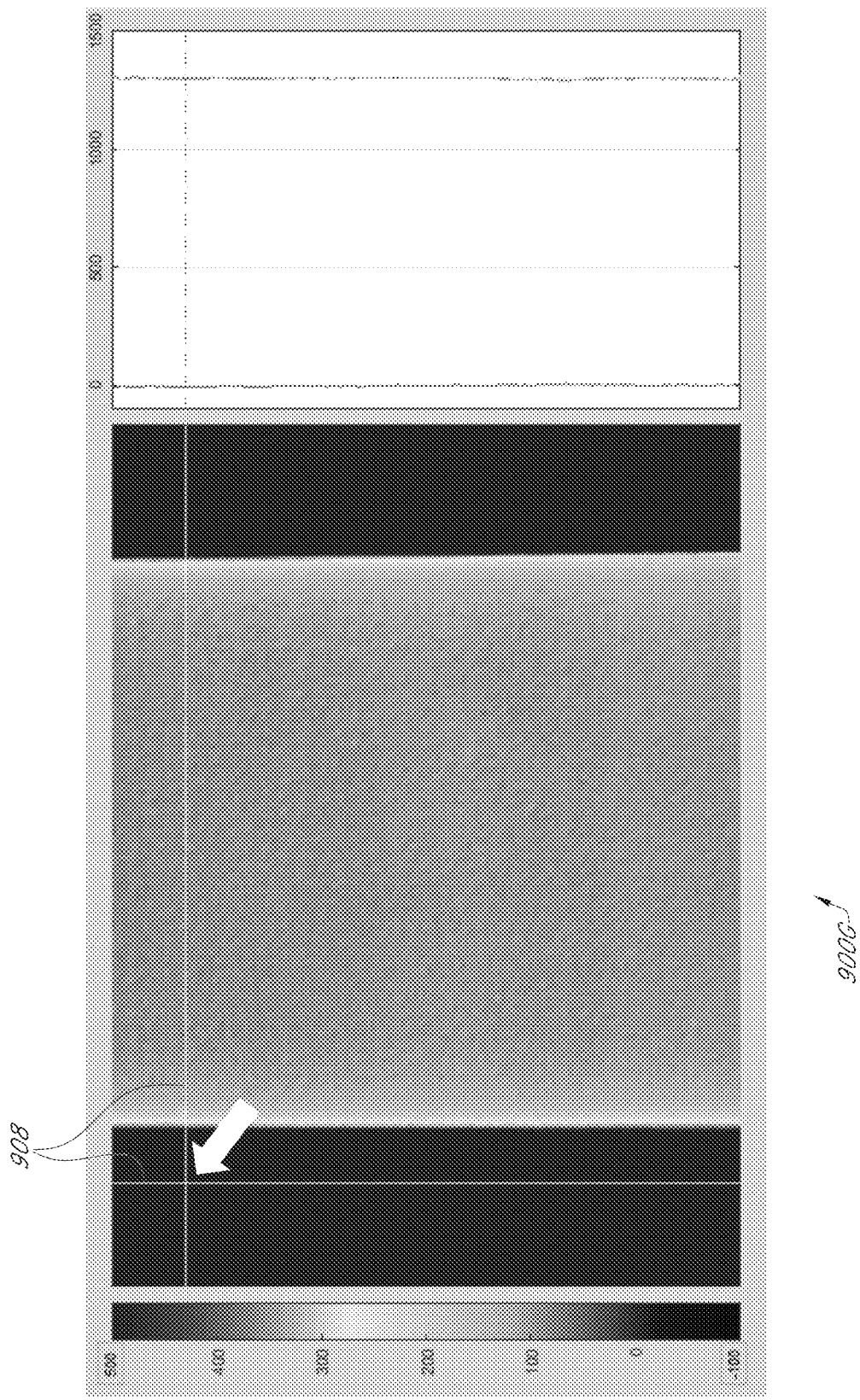
Figure 9H:
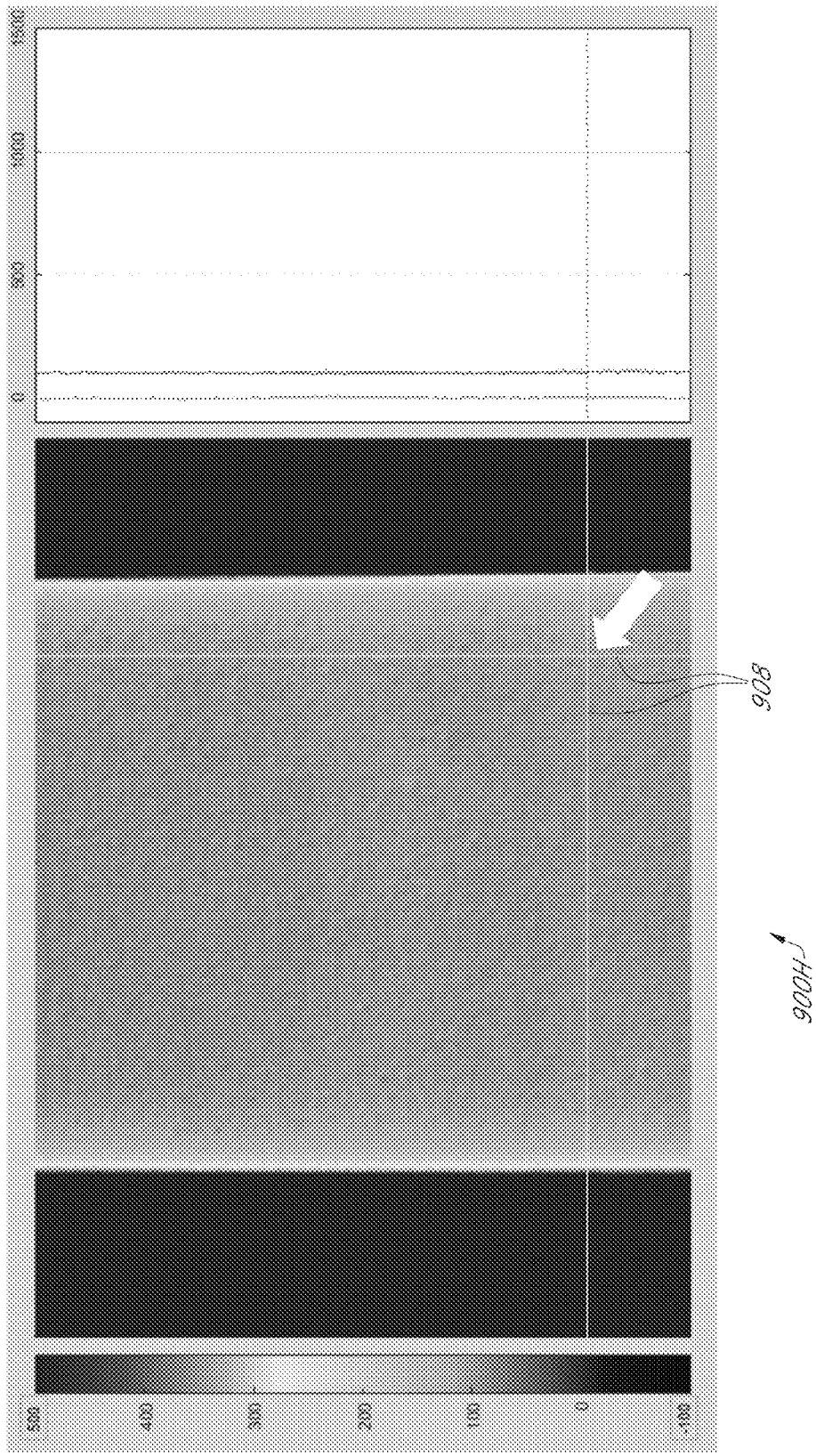

GUIs 900G of FIG. 9G and 900H of FIG. 9H also illustrate a portion of FIG. 9A. GUIs 900G and 900H illustrate cross-hair 908 moving from a first location to a second location, for example based on user input that moves the cross-hair. The movement of cross-hair 908 and corresponding changes to graphs 904 and 906 may be similar to other embodiments described within this disclosure, such as cross-hair 204 and graphs 206 and 208 of FIG. 2A.

Figure 10A:
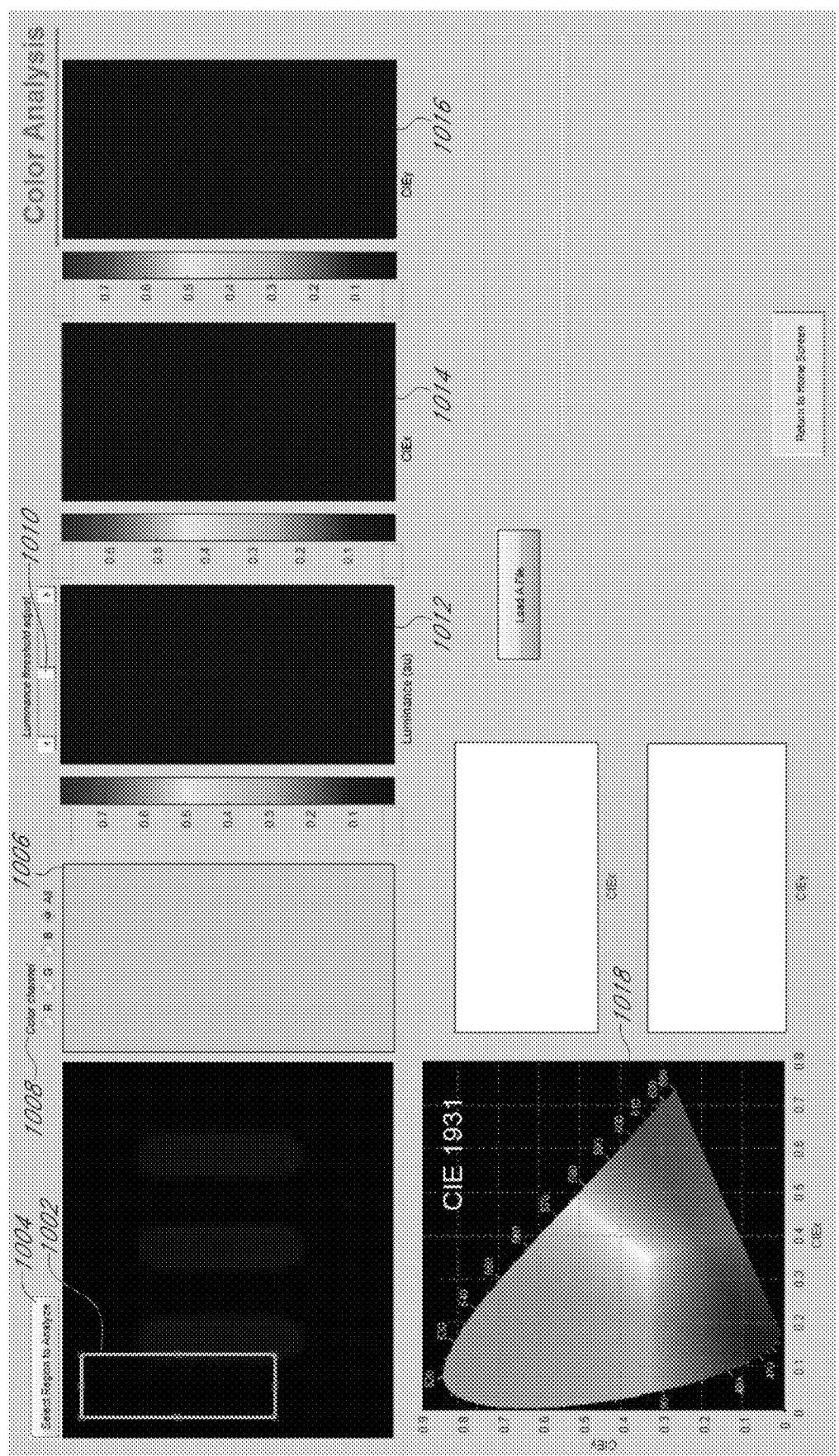
FIGS. 10A-10E are graphical user interfaces that include interactive graphs, maps, and widgets for displaying luminance values for one or more pixels on a substrate in accordance with the present disclosure.
Figure 10B:
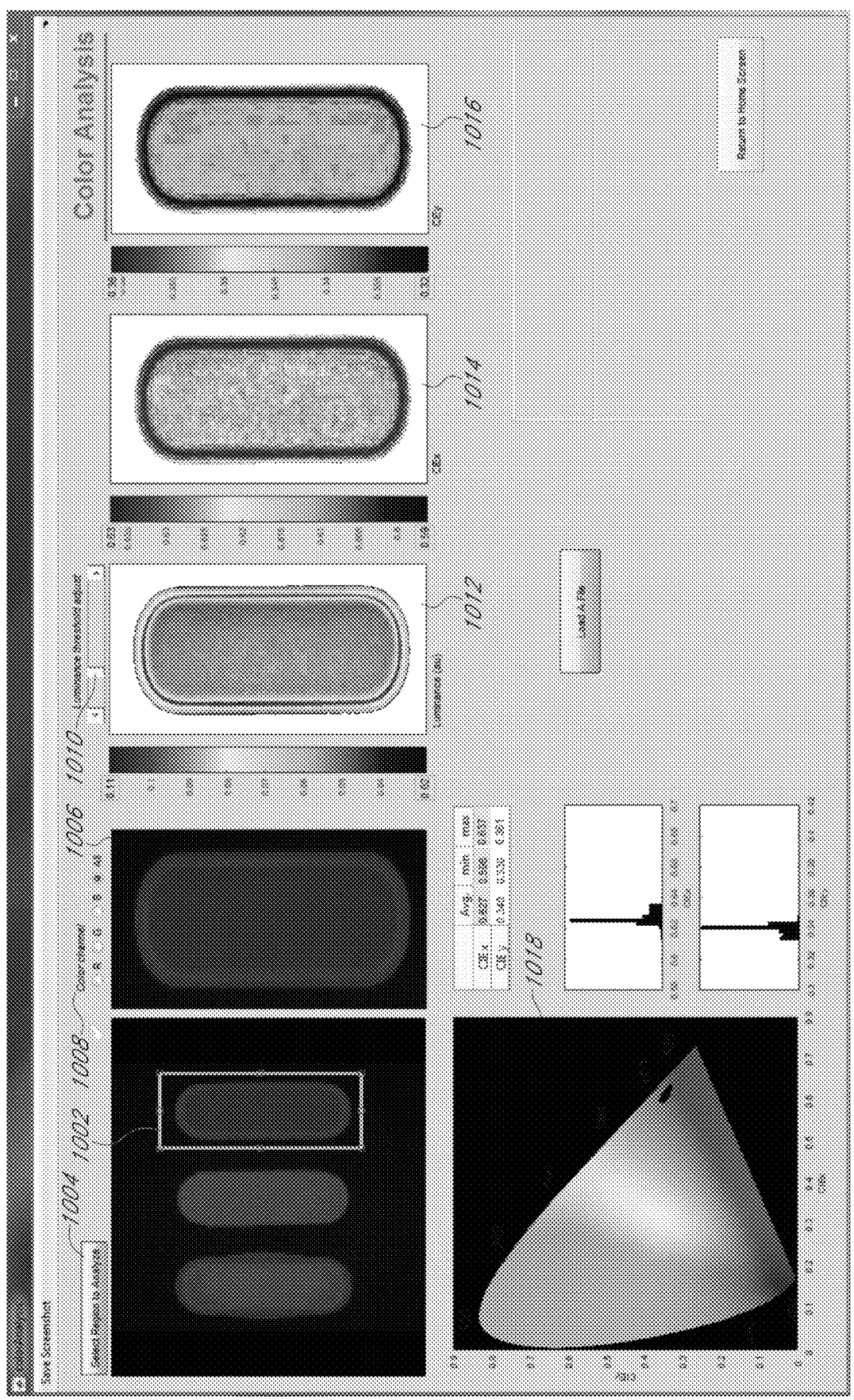

FIGS. 10A-10E depict an exemplary embodiment of graphical user interfaces that include interactive graphs, maps, and widgets for displaying luminance values for one or more pixels on a substrate in accordance with the present disclosure. GUI 1000A of FIG. 10A is a color analysis interface that comprises selectable region 1002, selection button 1004, pixel display 1006, channel selector 1008, luminance slider 1010, heat maps 1012, 1014, and 1016, and color graph 1018. A user may define a region 1002 for analysis within the illustrated pixel display of GUI 1000A. Once a region has been defined, selection button 1004 may be clicked to analyze the selected region.

GUI 1000B illustrates selected region 1002 that has been analyzed. Pixel display 1006 illustrates a color display for the selected region, for instance the selected pixel. Channel selector 1008 comprises a radio button to be used to select the color channel to be displayed in region 1006. For example, the color channels may comprise red, green, blue, or a combination of these. GUI 1000B illustrates a selection of a combination of red, green, and blue. Luminance slider 1010 may be used to select a luminance threshold for display in heat maps 1012, 1014, and 1016, which may display luminance data, CIEx data, and CIEy data for the selected region or selected pixel, respectively. Graph 1018 may display CIE (International Commission on Illumination) color data for the selected region or selected pixel.

Figure 10C:
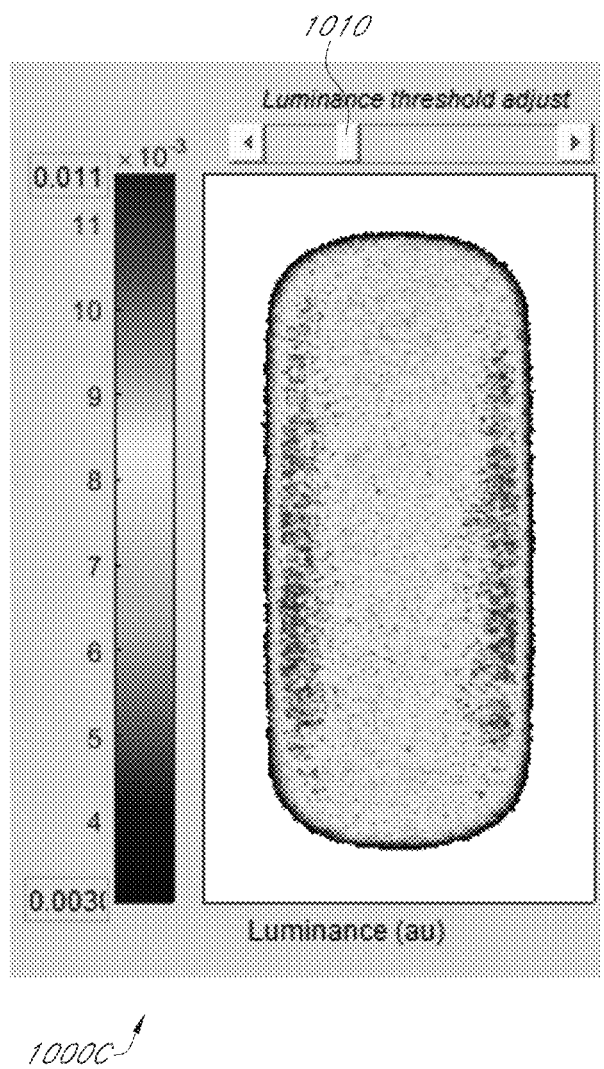
Figure 10D:
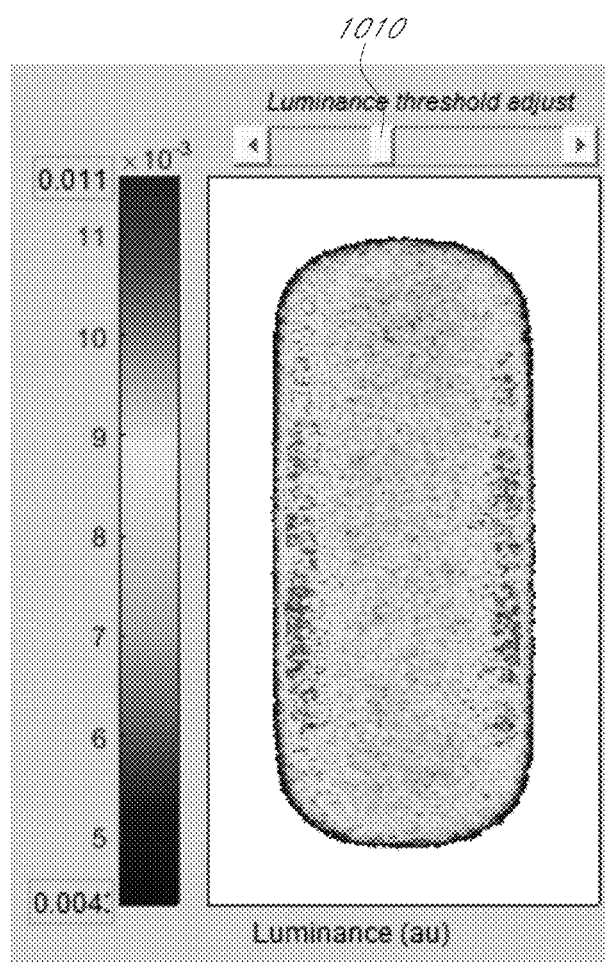

GUI 1000C of FIG. 10C illustrates a luminance slider 1010. A user may adjust luminance slider 1010 to select a particular luminance threshold. Based on the selected luminance threshold, heat map 1012 displays luminance data that meets or exceeds the selected luminance threshold. For instance, regions of heat map 1012 that do not meet or exceed the selected threshold luminance may be filtered from the heat map. GUI 1000D of FIG. 10D illustrates a change in location of luminance slider 1010, and thus an adjusted threshold to be used to display luminance data for heat map 1012. The adjustment to luminance slider 1010 may change the display of heat map 1012 in real time, and thus GUI 1000C may appear to be continuously changing as luminance slider 1010 is adjusted. In an embodiment, the selected luminance threshold may also be used to filter data from one or more graphical representations or data tables.

Figure 10E:
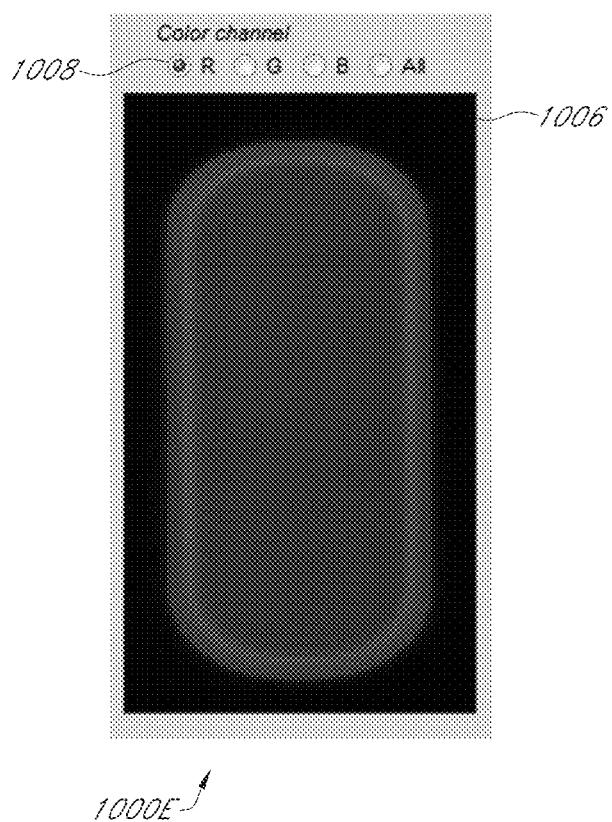

GUI 1000E of FIG. 10E illustrates pixel display 1006 and channel selector 1008. Channel selector 1008 comprises a radio button to be used to select the color channel to be displayed in region 1006. For example, the color channels may comprise red, green, blue, or a combination of these. GUI 1000E illustrates a selection of the red color channel.

Figure 11A:
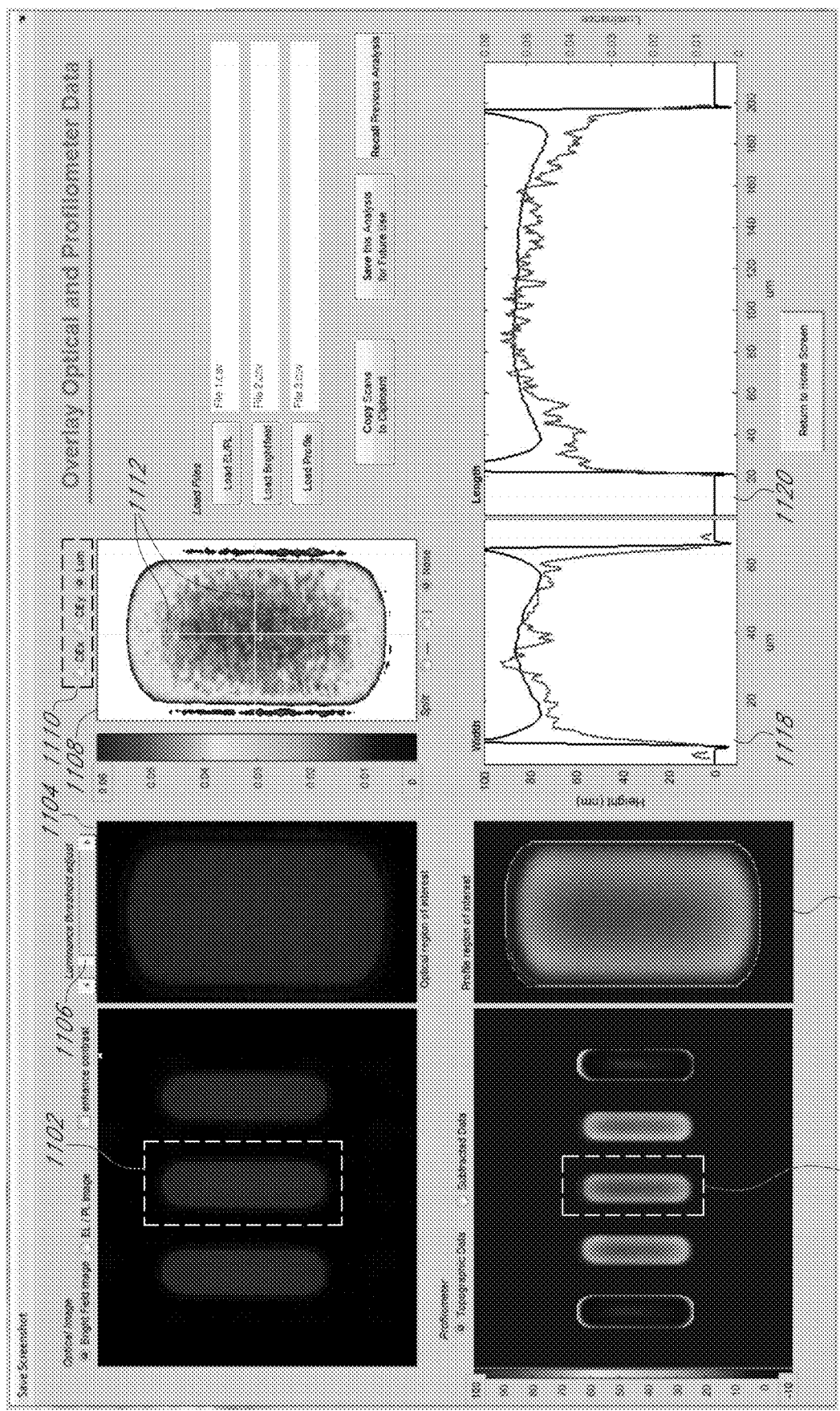
FIGS. 11A-11D are graphical user interfaces that include interactive graphs, maps, and widgets for displaying luminance values and profile data of ink layers for one or more pixels on a substrate in accordance with the present disclosure.

FIGS. 11A-11E depict an exemplary embodiment of graphical user interfaces that include interactive graphs, maps, and widgets for displaying luminance values and profile data of film layers for one or more pixels on a substrate in accordance with the present disclosure. GUI 1100A of FIG. 11A is an optical (color image) and profilometer interface that comprises selectable region 1102, pixel display 1104, luminance slider 1106, heat map 1108, display selector 1110, cross-hair 1112, selectable region 1114, pixel display 1116, and graphs 1118 and 1120. A user may define a region 1102 for analysis within the illustrated pixel display of GUI 1100A.

In an example, region 1114 may correspond to selected region 1102. Pixel display 1104 illustrates a luminance display for the selected region or the selected pixel. In the illustrated embodiment, region 1102 and pixel display 1104 correspond to optical image data displays, such as luminance and color data, and region 114 and pixel display 116 correspond to profilometer 3-D pixel data, such as height or thickness for film layers.

Luminance slider 1106 may be used to adjust a luminance threshold for heat map 1108. A user may adjust luminance slider 1106 to select a particular luminance threshold. Based on the selected luminance threshold, heat map 1108 displays luminance data that meets or exceeds the selected luminance threshold. For instance, regions of heat map 1108 that do not meet or exceed the selected threshold luminance may be filtered from the heat map. Luminance slider 1106 may be adjusted by a user such that detected noise for a given pixel is filtered from heat map 1108 based on the selected luminance threshold. The adjustment to luminance slider 1106 may change the display of heat map 1108 in real time. Display selector 1110 may change the display of heat map 1108 to display one or more of luminance, CIEx color data, and CIEy color data. In an embodiment, the selected luminance threshold may also be used to filter data from one or more graphical representations or data tables.

Graphs 1118 and 1120 display an overlay of optical image data and profilometer 3-D data for the selected region or selected pixel. For example, graphs 1118 and 1120 display two graphed lines, each corresponding to optical image data, such as luminance, and profilometer 3-D data, such as film layer height, for the selected pixel. In exemplary embodiments, the graphed optical image data may comprise CIEx color data or CIEy color data, for instance based on the data selected for display by display selector 1110.

Figure 11B:
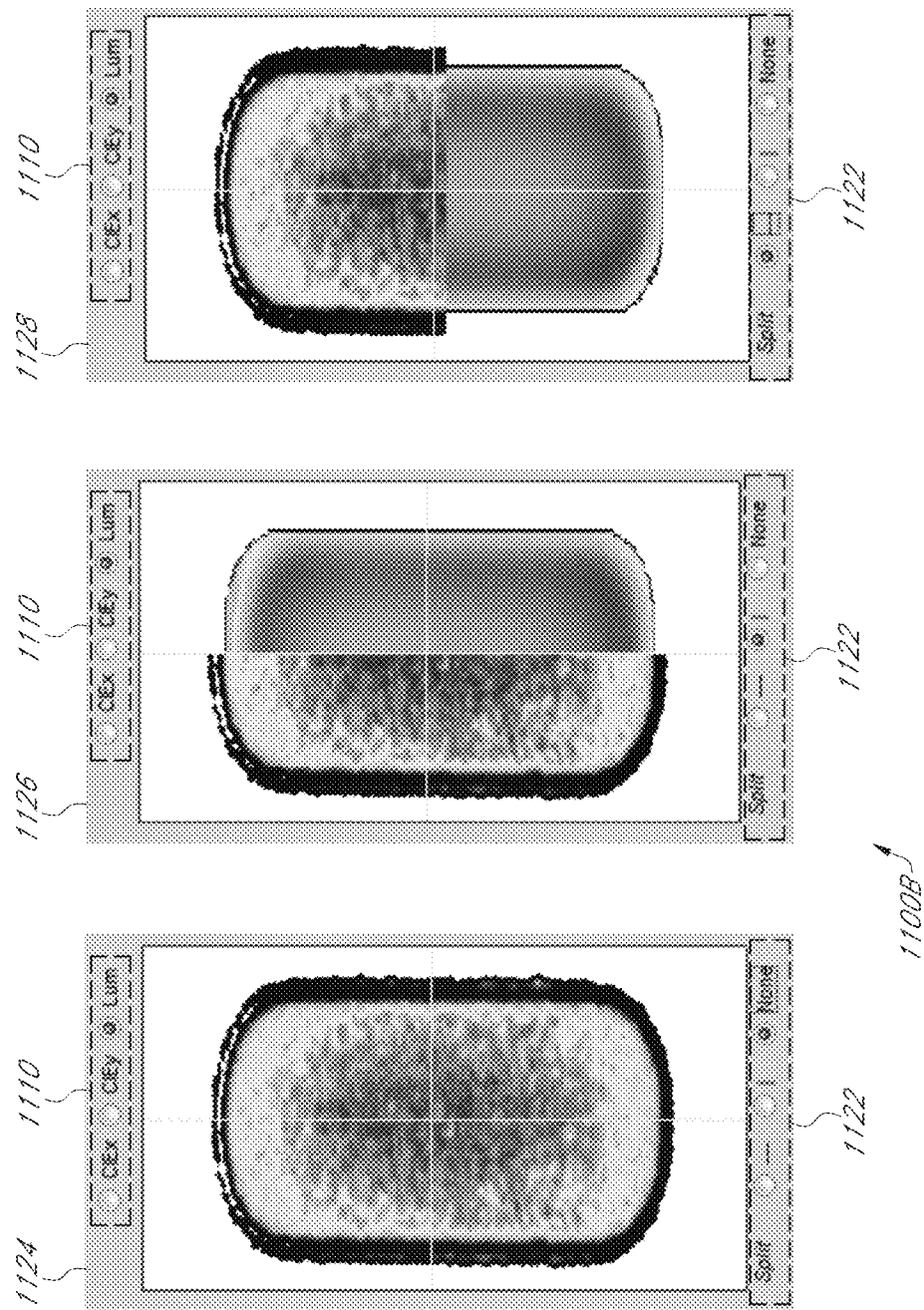

GUI 1100B of FIG. 11B illustrates display selector 1110, configuration selector 1122, and heat maps 1124, 1126, and 1128. A user may adjust luminance slider 1010 to select a particular luminance threshold. Display selector 1110 may change the display of heat map 1108 to display one or more of luminance CIEx color data, and CIEy color data. Configuration selector may be used to portion the selected region or pixel such that a portion displays optical image data while a portion displays profilometer 3-D data. For example, heat map 1124 displays luminance data, heat map 1126 displays half luminance data and half film layer height data, split vertically, and heat map 1128 displays half luminance data and half film layer height data, split horizontally. Other suitable techniques for portioning the illustrated pixel may also be utilized.

Figure 11C:
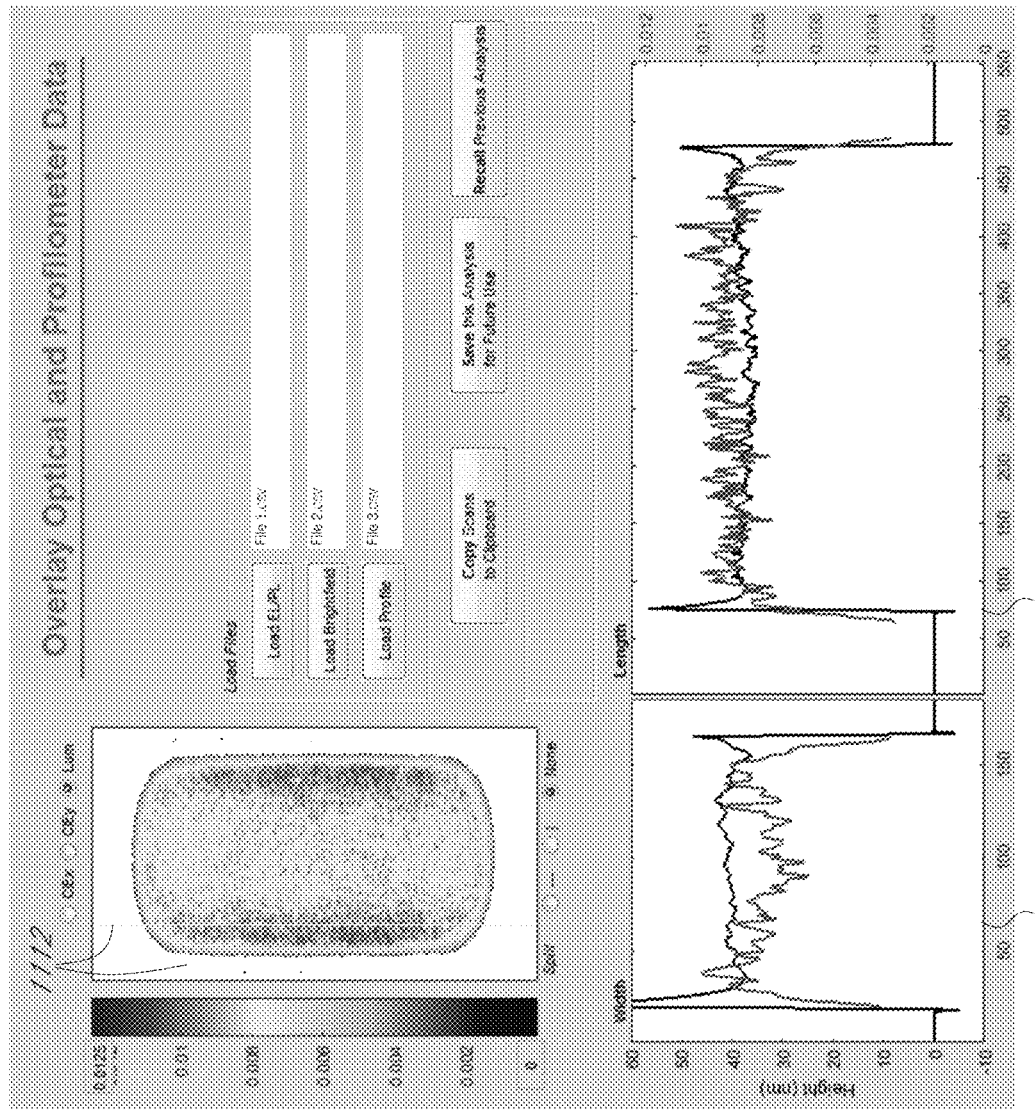
Figure 11D:
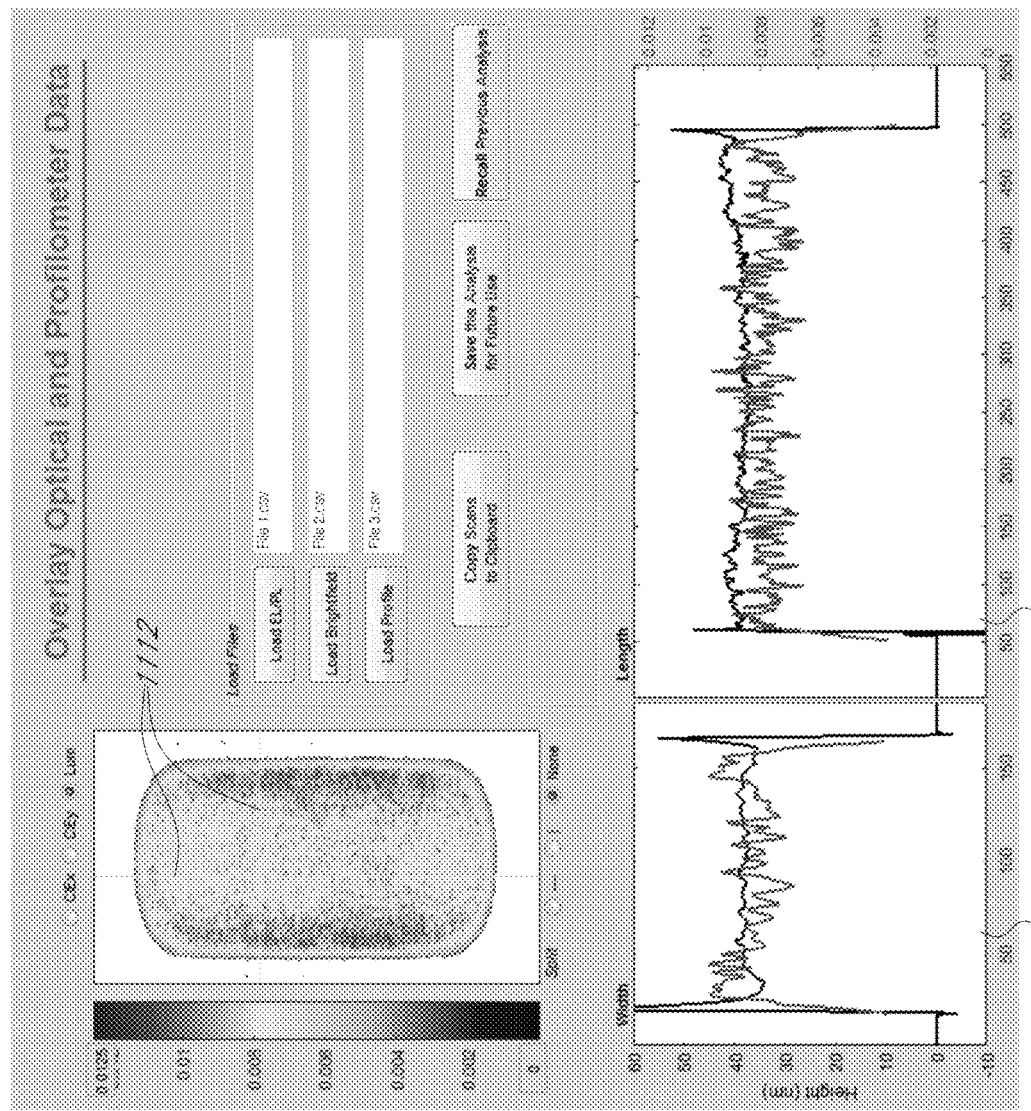

GUIs 1100C of FIG. 11C and 1100D of FIG. 11D illustrate a portion of FIG. 11A. 1100C and 1100D illustrate cross-hair 1112 moving from a first location to a second location, for example based on user input that moves the cross-hair. The movement of cross-hair 908 and corresponding changes to graphs 904 and 906 may be similar to other embodiments described within this disclosure, such as cross-hair 204 and graphs 206 and 208 of FIG. 2A. For example, movement of cross-hair 1112 may adjust the luminance data (CIEx data or CIEy data) and film layer height data displayed in graphs 206 and 208 such that the graphs display data corresponding to the new location for cross-hair 1112.

Figure 12:
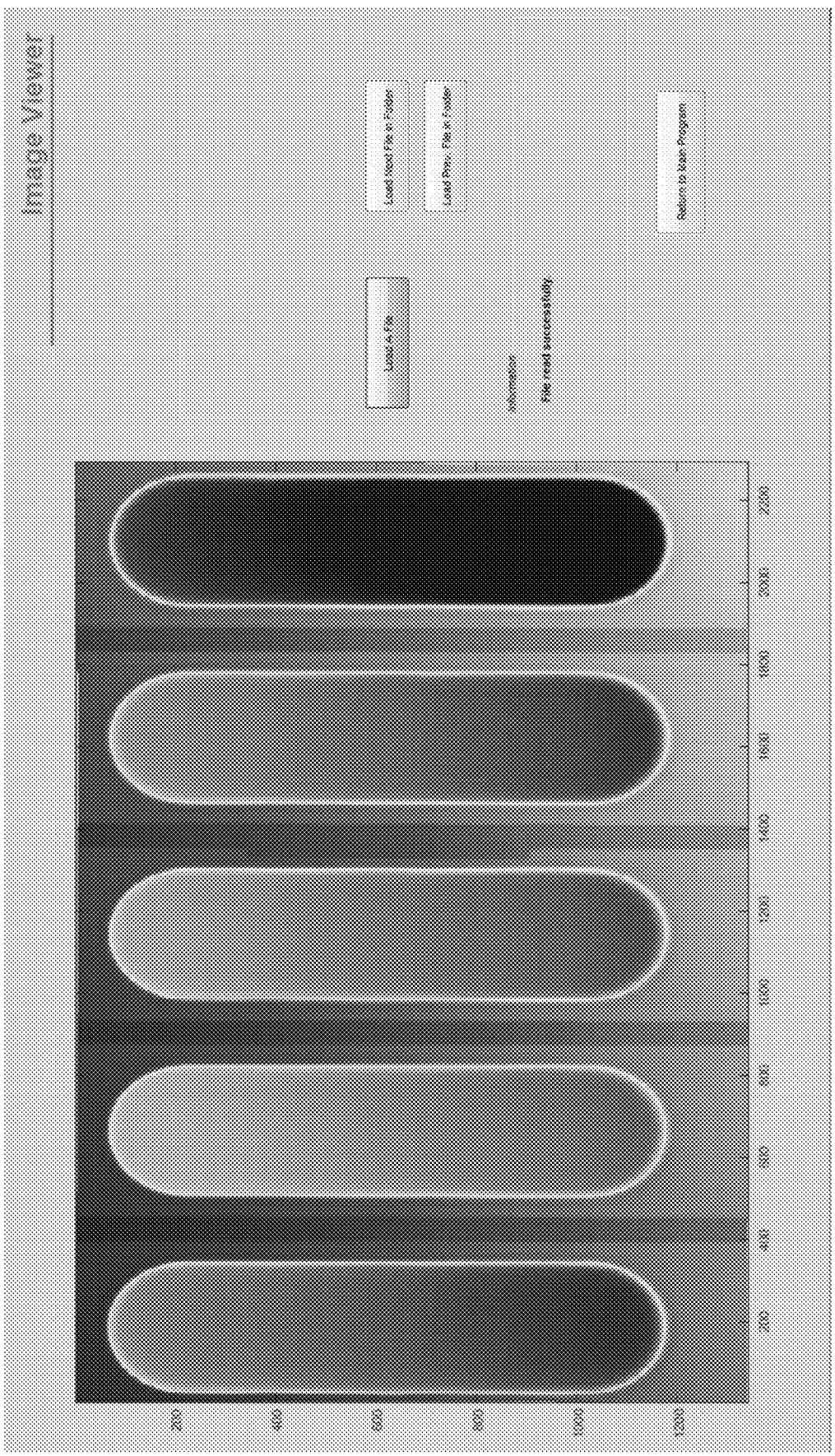
FIG. 12 is a graphical user interface for displaying a plurality of pixels on a substrate in accordance with the present disclosure.

FIG. 12 depicts one exemplary embodiment of a graphical user interfaces for displaying a plurality of pixels on a substrate in accordance with the present disclosure. For example, a file comprising profilometer and/or optical data for a plurality of pixels may be loaded, and a preview of the data may be displayed, as illustrated in GUI 1200.

Figure 13A:
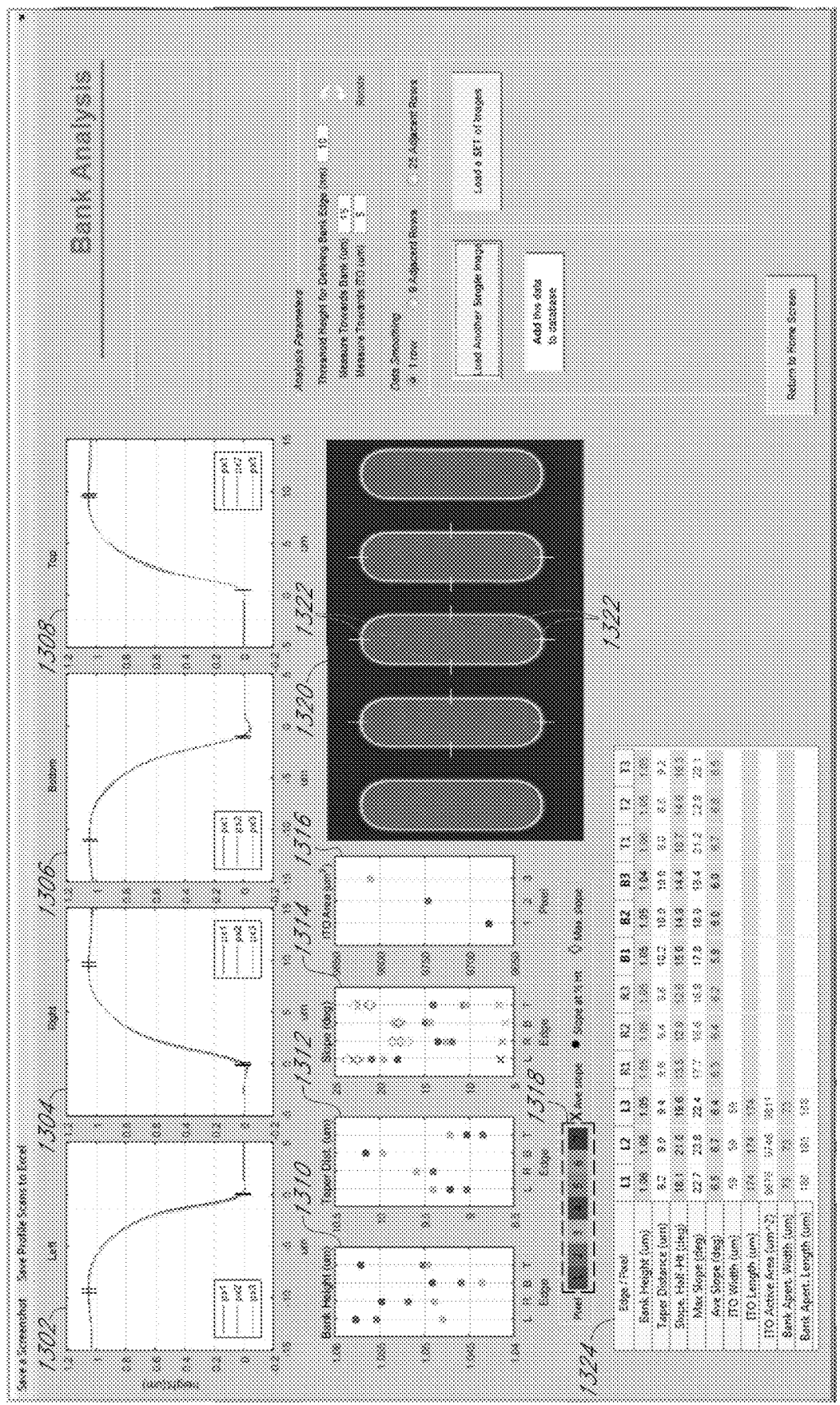
FIGS. 13A-13C are graphical user interface that include interactive graphs, maps, tables, and widgets for displaying profile data of one or more banks on a substrate in accordance with the present disclosure.
Figure 13B:
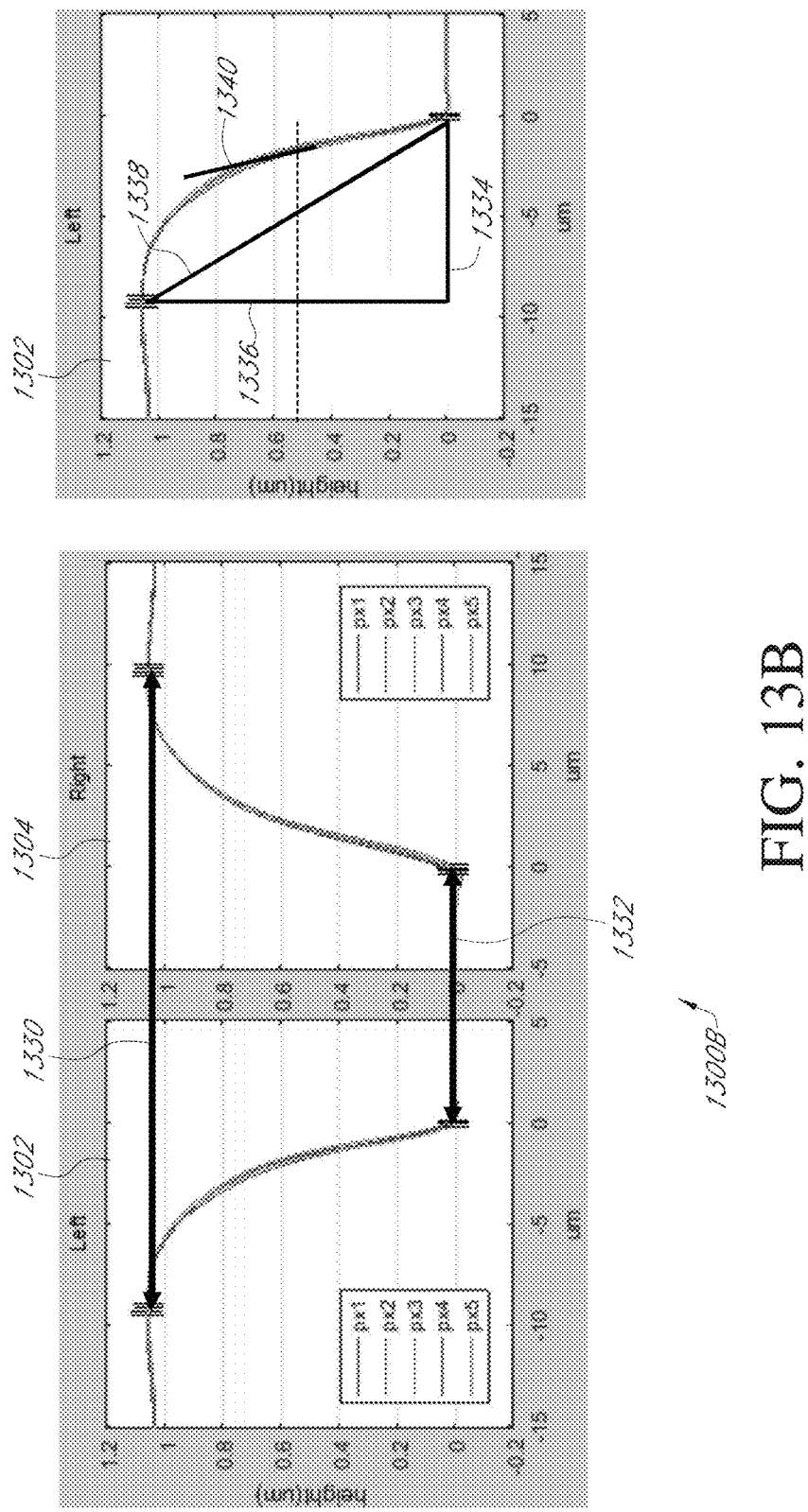
Figure 13C:
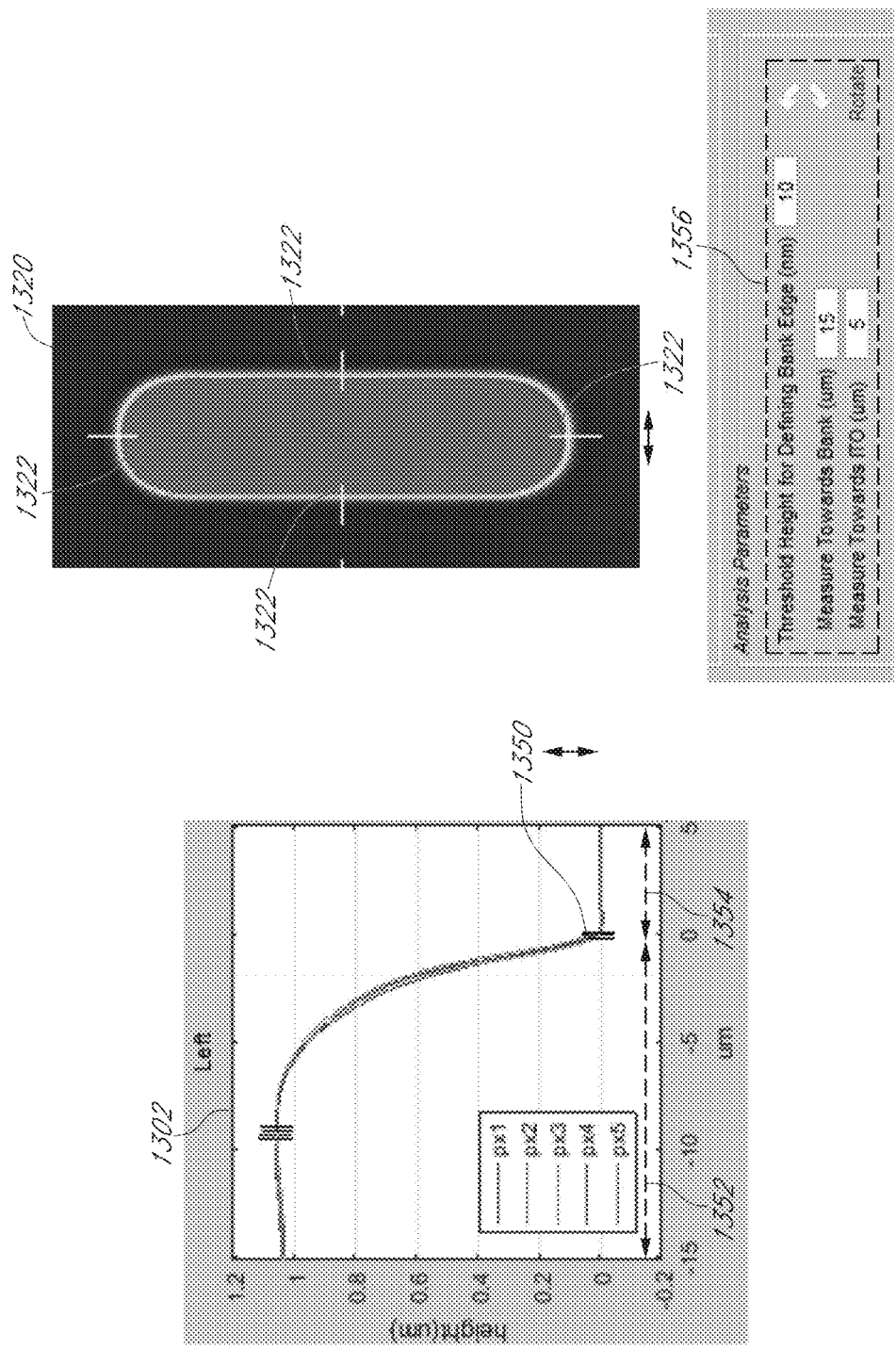

FIGS. 13A-13C depict an exemplary embodiment of graphical user interfaces that include interactive graphs, maps, tables, and widgets for displaying profile data of one or more banks on a substrate in accordance with the present disclosure. GUI 1300A of FIG. 13A is a bank analysis interface that comprises graphs 1302, 1304, 1306, and 1308, scatter plots 1310, 1312, 1314, and 1316, legend 1318, bank display 1320, boundaries 1322, and data table 1324. In an embodiment, an electronic display such as a panel can comprise a pattern of banks or wells such that pixels can be formed (e.g., via deposition of one or more film layers) onto the display (e.g., one or more ink layers can be printed in stacks on the surface of the display). Such an electronic display may be analyzed, for instance using a profilometer, such that the characteristics for the pattern of banks can be determined. In an embodiment, an electronic display may be analyzed to determine these characteristics based on a predetermined pattern for the electronic display, such as a pattern defined with reference to FIG. 4.

In various embodiments, a plurality of banks for the electronic display may be analyzed. For example, graphs 1302, 1304, 1306, and 1308 may illustrate graphed heights for a plurality of banks from the perspective of the left side of the bank, right side of the bank, bottom of the bank, and top of the bank, respectively. Scatter plots 1310, 1312, 1314, and 1316 may illustrates plotted data values for the plurality of banks including plotted bank height, taper distance, slope, and bank opening area, respectively. Legend 1318 may associate a particular color (or shade or hatching, etc.) with a particular bank, and the corresponding graphed lines and plotted points for the particular bank comprise the particular color (or shade or hatching, etc.). Bank display 1320 may display an orientation for the plurality of banks and boundaries 1322 illustrates the boundaries for the banks used to determine bank characteristics (e.g., bank height, width, and the like).

Data table 1324 displays bank characteristics for the individual banks. Graphs 1302, 1304, 1306, and 1308 and scatter plots 1310, 1312, 1314, and 1316 may graphically display the data from data table 1324. Data table 1324 may comprise individual columns that indicate an individual bank and the orientation (e.g., left, right, bottom, top) for the data. For example, measurements data may be received or determined at different locations of the bank (e.g., left, right, bottom, and top) such that the data may be standardized and to determine pixel or subpixel symmetry or asymmetry. The data for the banks comprises at least bank height, taper distance, slope (e.g., at the half-way point), max slope, average slope, ITO or aperture width, ITO or aperture length, ITO or aperture area, bank aperture width, and bank aperture length.

For example, FIG. 13B and GUI 1300B illustrates graphs 1302 and 1304. Based on the left and right bank measurements, as illustrated, a width for the top of a bank, distance 1330 or bank aperture width, and the bottom of the bank, distance 1332 or ITO width, can be determined. Similarly, based on distances 1334, 1336, and 1338, and the right triangle the measurements form, a halfway point for a bank can be determined, and the slope at the halfway point, 1340, may be calculated. In exemplary embodiment, distance 1334 may comprise taper distance for the bank, distance 1336 may comprise a bank height, and distance 1338 may comprise an average slope for the bank.

FIG. 13C illustrates how the bank measurements can be edited by a user. For example, boundaries 1322 may be selected by a user and moved such that the boundaries used to determine the bank measurements are adjusted. Accordingly, boundaries on graphs 1302, 1304, 1306, and 1308, such as boundary 1350, are also adjusted. Based on the adjustment, measurement values, such as values 1352 and

1354, are adjusted. Data table 1324 similarly reflects the adjusted values for the measurements of the banks based on the adjusted boundaries.

Interface 1356 also can be used to configure profile data, such as the data illustrated in data table 1324, for defining the parameters of a bank. For instance, a vertical threshold (threshold height) for defining a bank may be input or edited using interface 1356 such that data with a height (y-axis data) above the threshold is analyzed as data defining a bank edge. Such a bank edge (e.g., where a height meets the vertical threshold) may comprise a reference point for defining the bank parameters and the aperture parameters. For example, horizontal thresholds for defining a bank and aperture may be input or edited using interface 1356. Relative to the defined bank edge (e.g., defined by way of the vertical threshold) the threshold "measure towards bank" may define a boundary from the bank edge such that data within the boundary is analyzed as data defining the bank. Similarly, the threshold "measure towards ITO" may define a boundary from the bank edge such that data within the boundary is analyzed as data defining the aperture.

Figure 14A:
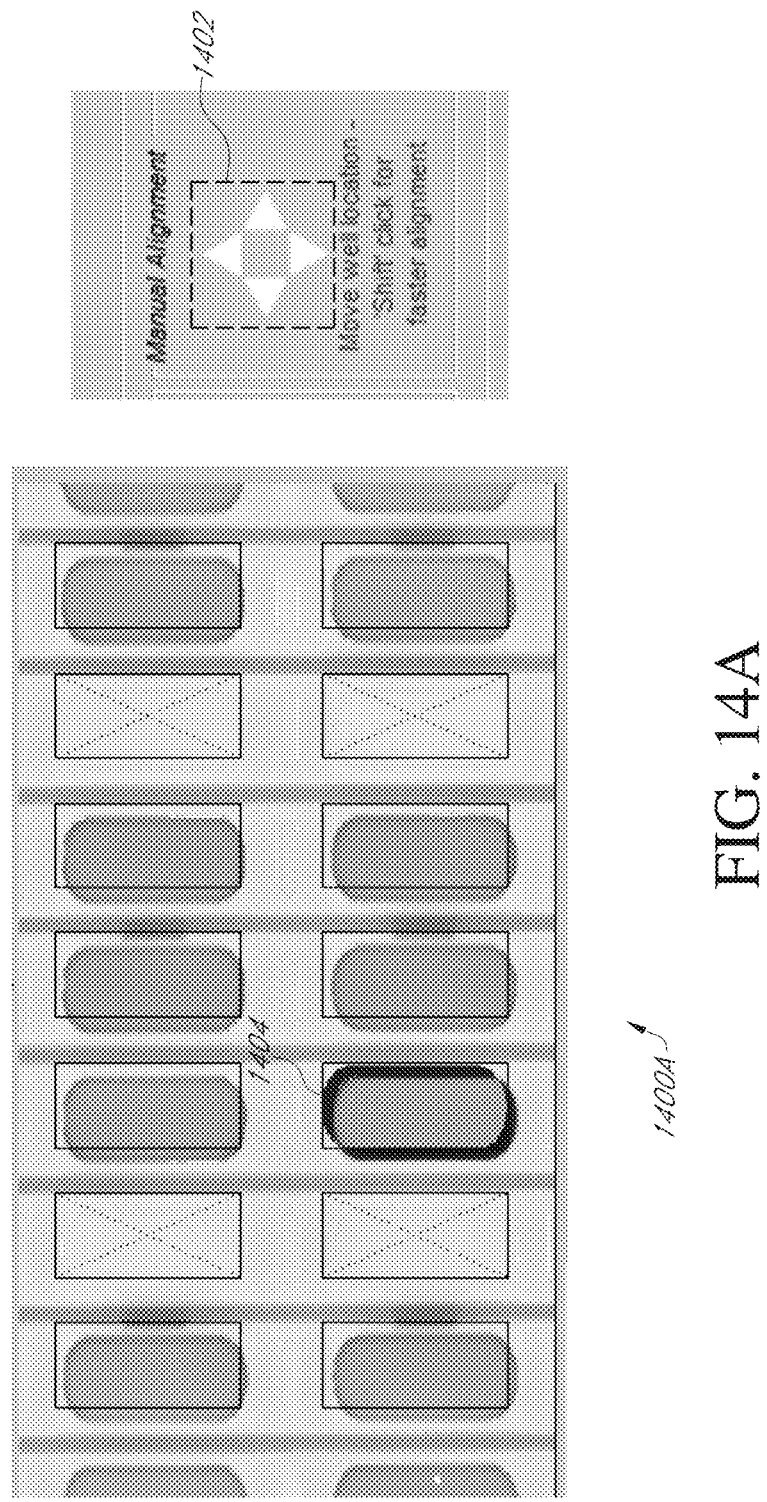
FIGS. 14A-14D are graphical user interfaces that include interactive graphs, maps, and widgets for configuring an alignment for one or more pixels on a substrate in accordance with the present disclosure.
Figure 14B:
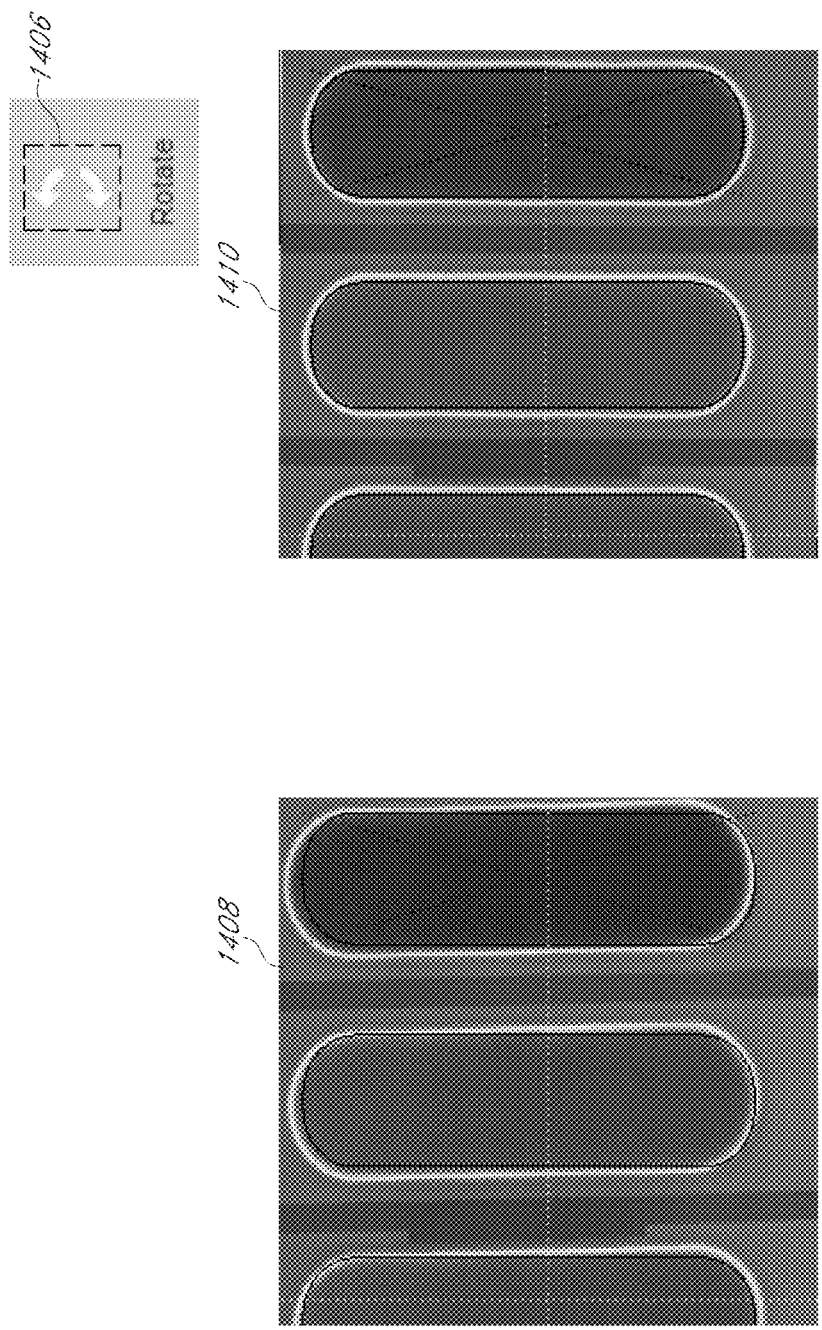

FIGS. 14A-14D depict an exemplary embodiment of graphical user interfaces that include interactive graphs, maps, and widgets for configuring an alignment for one or more pixels on a substrate in accordance with the present disclosure. GUI 1400A of FIG. 14A illustrates a widget for manual alignment of a pixel. For example, a user may click the arrows of widget 1402 to manually move the visual representation of the data for pixel 1404. Once the pixel is aligned, the data for the pixel may be corrected in accordance with the received alignment and analyzed. Similarly, GUI 1400B of FIG. 14B illustrates a widget for manual rotation of a pixel. For example, a user may click the arrows of widget 1406 to manually rotate the visual representation of the data for the pixels illustrated in display 1408. Once rotated, as in display 1410, the data for the plurality of pixels may be corrected in accordance with the received rotation and analyzed.

Figure 14C:
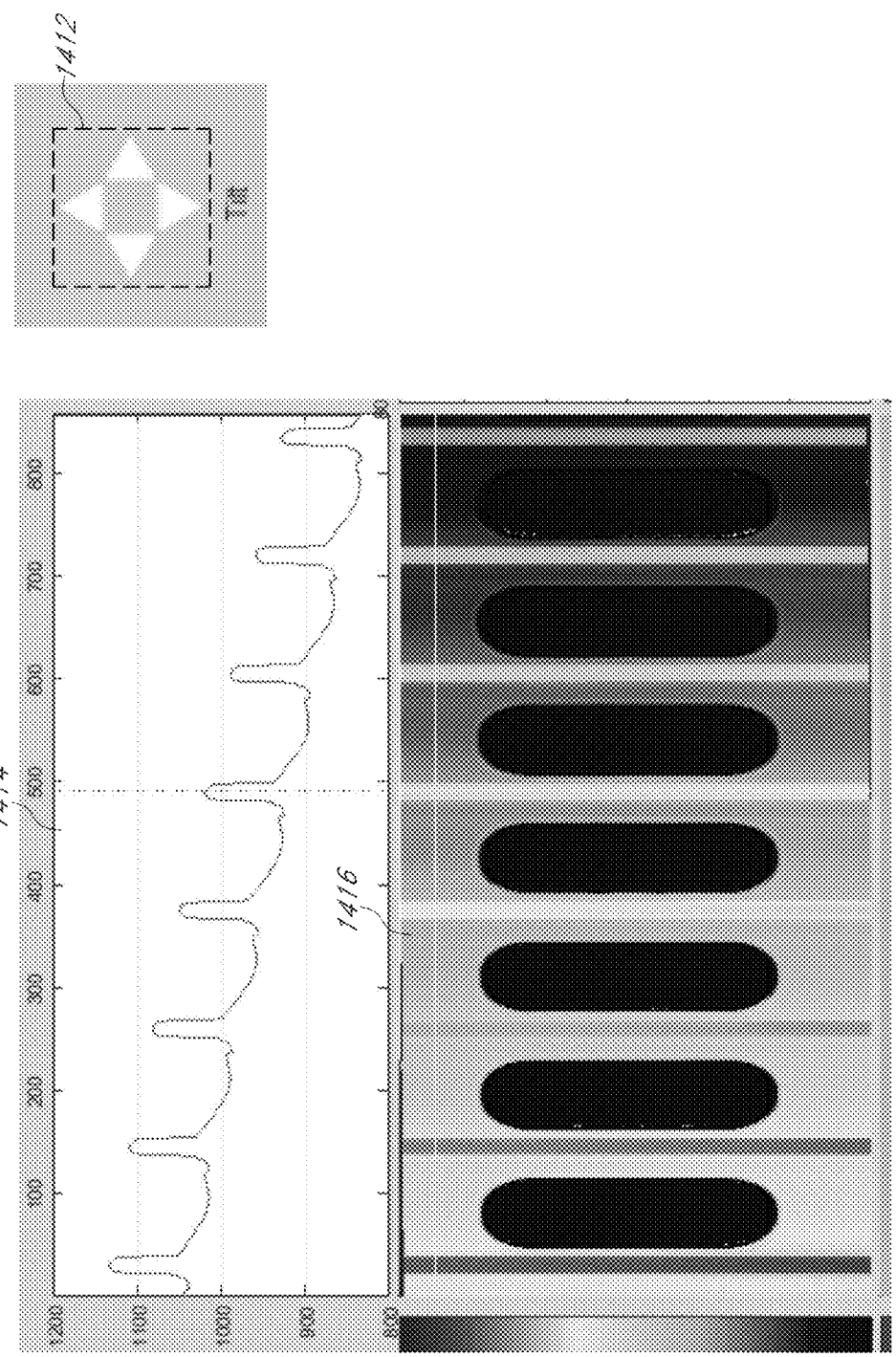
Figure 14D:
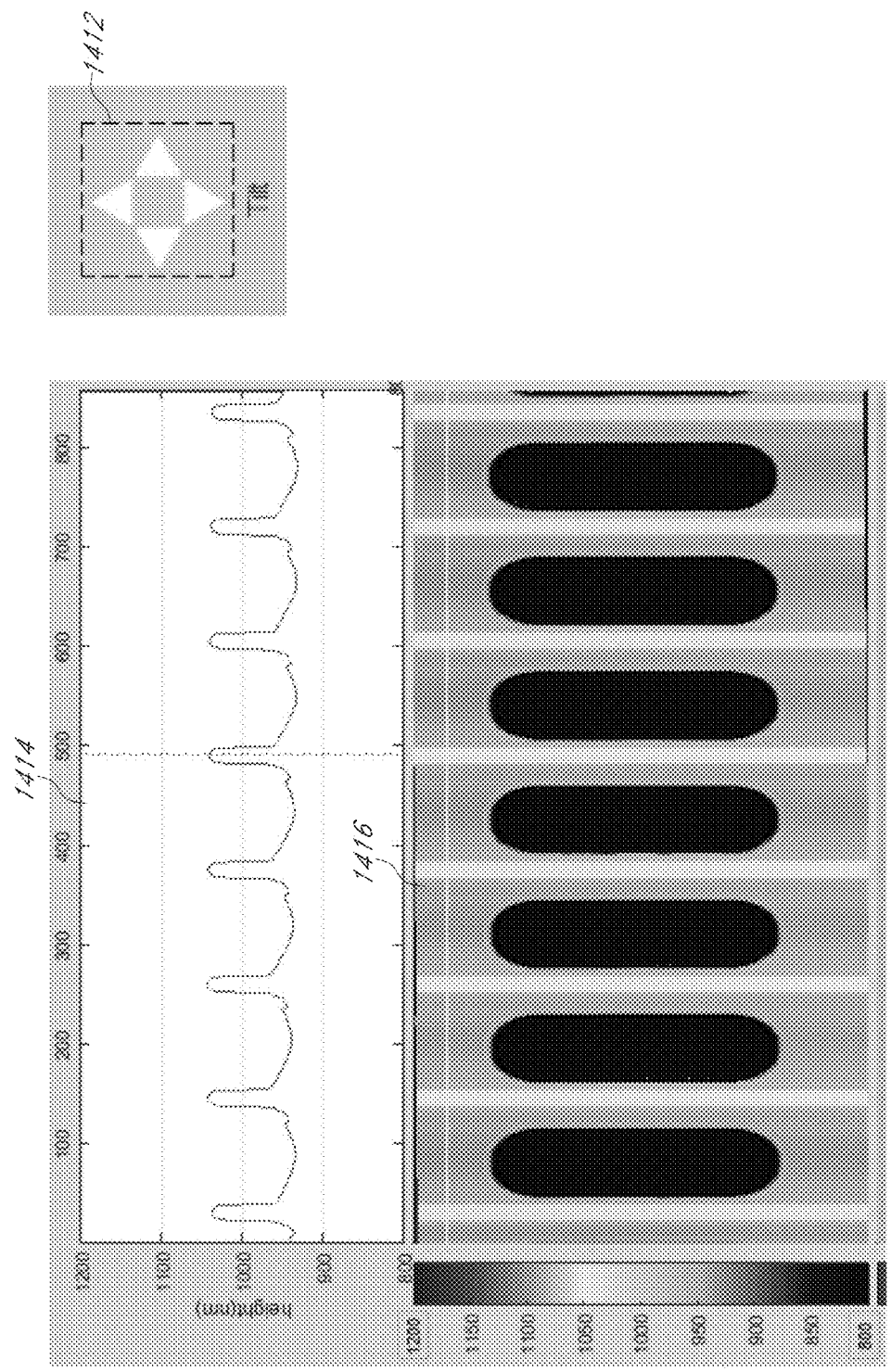

GUIs 1400D and 1400C of FIGS. 14C and 14D illustrates a widget for manual tilt of a pixel. For example, a user may click the arrows of widget 1412 to manually tilt the visual representation of the data for the pixels illustrated in displays 1414 and 1416. For example, display 1414 indicates a tilt for the data of the plurality of pixels that is not anticipated given data expected to be received from a profilometer for printed pixels on an electronic display. Once the data has been tilted, as illustrated in GUI 1400D, the data for the plurality of pixels may be corrected in accordance with the received tilt and analyzed.

Figure 15:
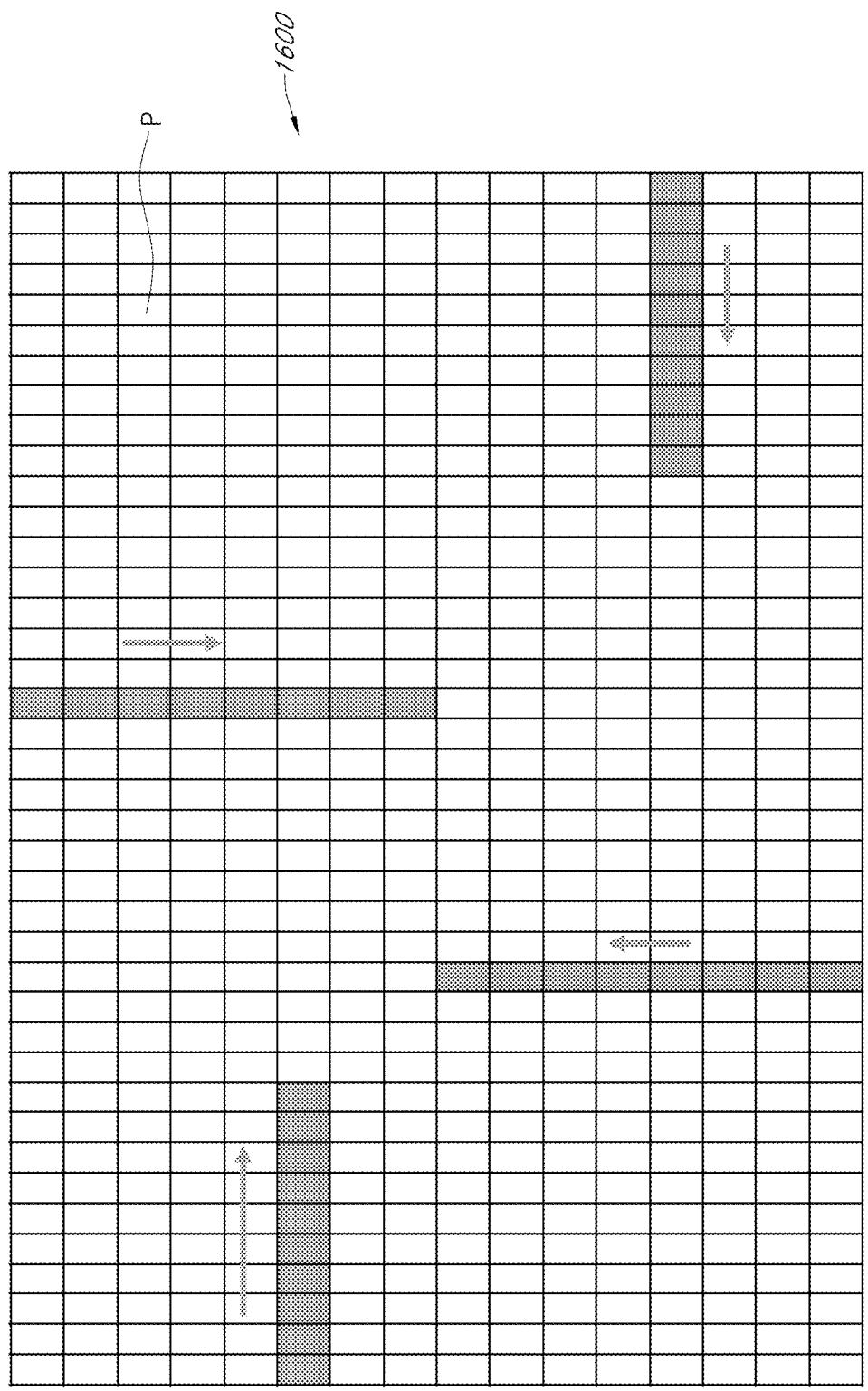
FIG. 15 is a schematic representation of a selection of pixels for use in an edge analysis module in accordance with an exemplary embodiment of the present disclosure.
Figure 16A:
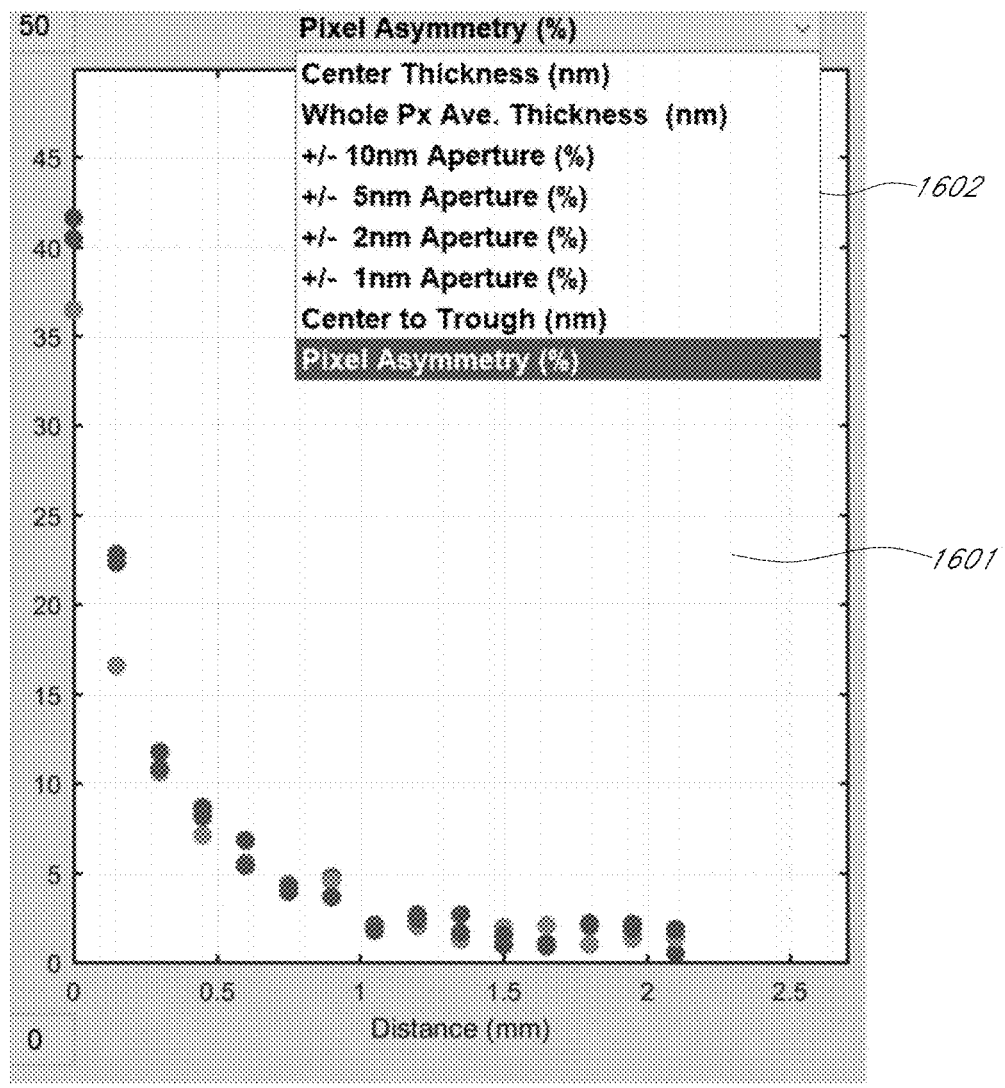
FIGS. 16A-16D are graphical user interfaces that include interactive graphs and widgets for displaying edge data of one or more pixels on a substrate in accordance with an exemplary embodiment of the present disclosure.
Figures 16B, 16C, 16D:
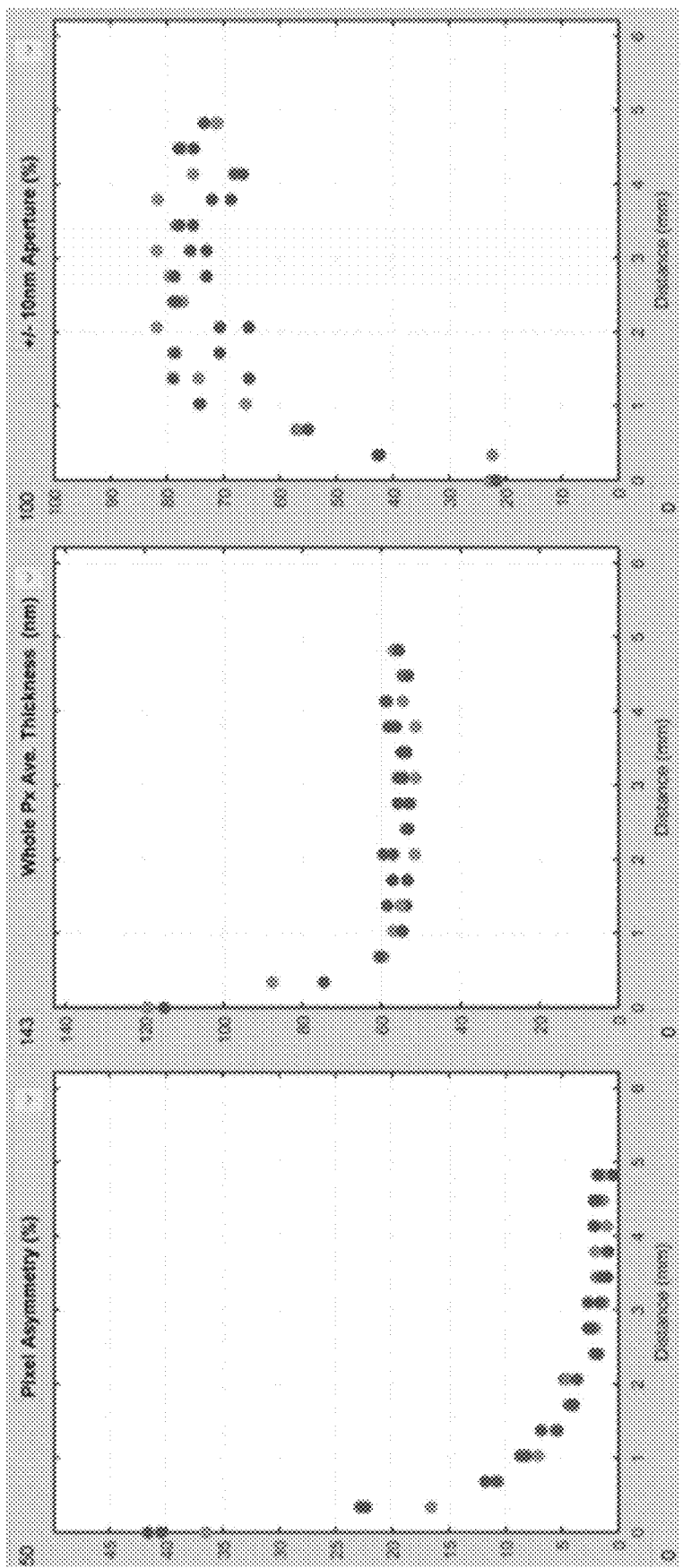

Various exemplary embodiments of the present disclosure provide an edge analysis module for displaying and analyzing profiling data for a series of pixels. Due to the nature of manufacturing processes for various types of substrates, such as for displays as discussed herein, pixels at the edge of the active display area on the substrate may have slightly different performance than those closer to the center of the display. Such differences can result in poor performance and/or undesirable visual artifacts for an observer viewing the display. FIGS. 15-16D depict an exemplary embodiment relating to a graphical user interface that include interactive graphs and widgets for displaying and analyzing edge effects data for a display for which profiling data has been obtained. With reference to FIG. 15, a schematic of a display with a plurality of pixels P is depicted. As shown, in accordance with the edge analysis module, a user can select a line of adjacent pixels (4 such lines denoted by the shading and corresponding arrows being shown), and the software processes each pixel in the sequence to analyze various data based on the profiling data as discussed above. For example, various parameters, such as, for example, pixel asymmetry, whole pixel average thickness, percent of area aperture ratios within a threshold distance (e.g., +/−10 nm, 5 nm, 2 nm, 1 nm, and the like), center to trough distance, and center thickness can be calculated based on the profiling measurements received for reach of the selected pixels, and the data for the selected series can be plotted in a graph 1601, as shown in FIG. 16A for example. The particular graph type to be displayed can be selected using the edge analysis module interface from a drop-down menu 1602, as depicted in FIG. 16D.

FIGS. 16B-16D are examples of screenshots from the edge analysis module showing the results of comparing three parameters along three rows of fifteen adjacent pixels from different parts of the display (the respective pixel data from the three rows are represented by the different shaded data points in the figures). In the graphs, the x-axis shows distance (in millimeters) from the edge of the display. FIG. 16B plots pixel asymmetry with distance from the edge of the display. FIG. 16C plots whole pixel average film thickness in nanometers from the edge of the display. FIG. 16D plots+/−10 nm aperture percentage from the edge of the display.

From graphs such as those in the exemplary embodiments of FIGS. 16A-16D, various information regarding the display is conveyed. For example, differences between the parameters (and thus behavior when driven) of pixels near the edge of the display versus those closer to the center can be assessed. Also, by choosing different rows of pixels in different portions of the display, such as the differing rows depicted in FIG. 15, differences in portions of the display also may be detected. The data may also be used to determine if different color pixels have different parameters than other color pixels.

Once such information is assessed, it may be used as a quality control parameter, to accept or reject a substrate based on set (predetermined) levels of deviation of parameters of edge pixels relative to more centrally located pixels. Further, such information may be used to adjust processing conditions to reduce or eliminate any undesirable edge effects observed, or undesirable effects of other locations of the display.

For the module discussed above with reference to FIGS. 15-16, the number of pixels and where the pixels are located are selectable by a user, and need not be chosen as adjacent pixels in a row or column. For example, a series of diagonal pixels may be selected and the relevant parameters calculated and displayed. Moreover, the pixels need not be adjacent, but rather a sequence of any pixels with appropriate profiling data can be selected by a user, input to the module, and processed.

Figure 17:
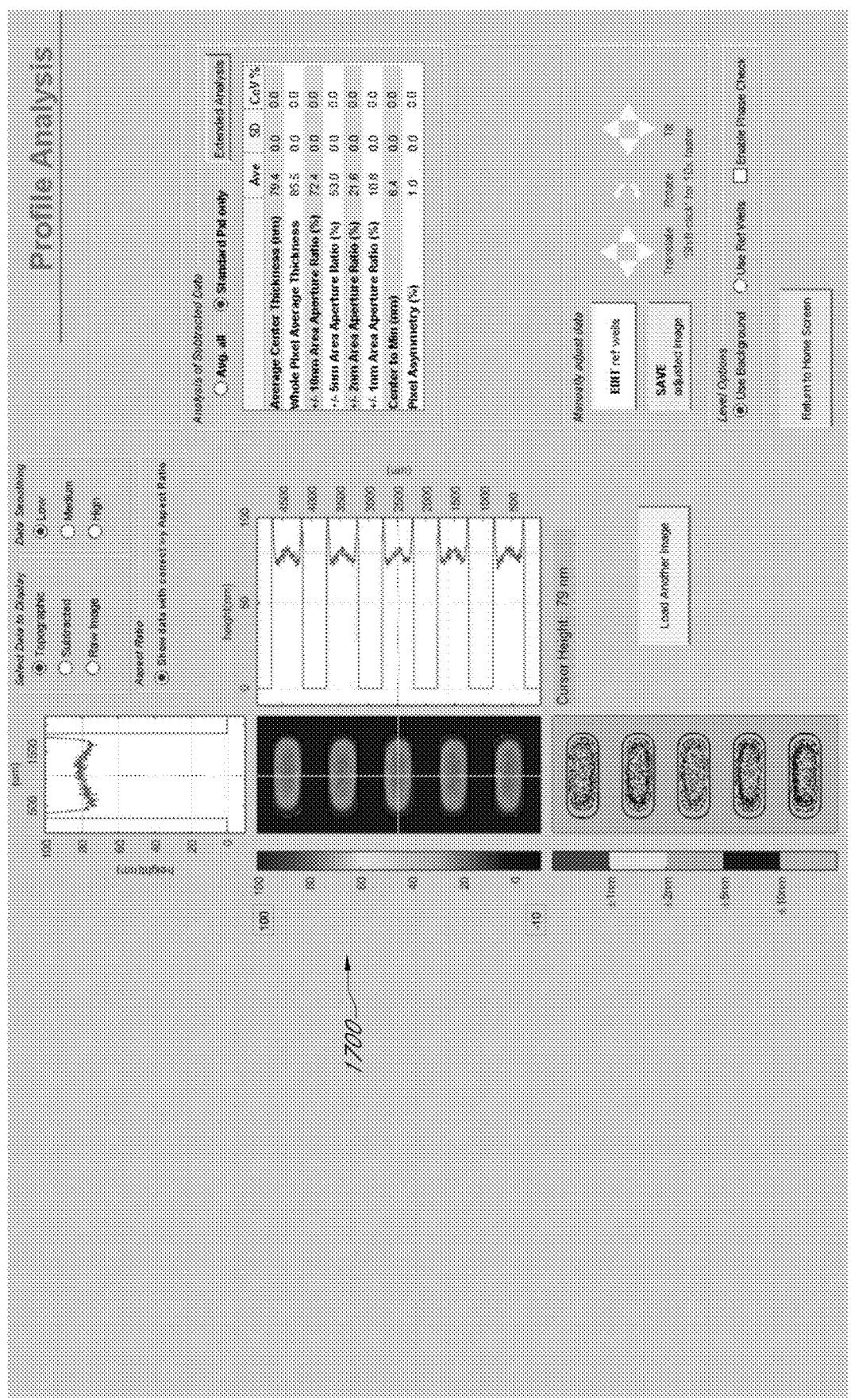
FIG. 17 is a screenshot of a graphical user interface that include interactive graphs, maps, tables, and widgets for displaying profile data of pixels on a substrate in accordance with an exemplary embodiment of the present disclosure

FIG. 17 depicts an alternative layout 1700 of interactive graphs, maps, tables, and widgets displaying profile analysis that may be displayed depending on the pixels that are selected for analysis. For example, when pixels in a column, rather than a row, are selected, the aspect ratio of the displayed interface may be automatically altered so that the presented data is not distorted. The screen shot of FIG. 17 depicts pixels in a column and the adjusted orientation of a profile analysis module (compare to FIG. 2A). The user is thus presented with the graphical information in a format that does not distort the graphical data when differing orientations of pixels are selected for analysis. In an exemplary embodiment, the automatic scaling and adjustment of the layout may be overridden, in which case the data and graphics shown will be in the standard layout and aspect ratio.

Various applications of the methods, techniques, and interfaces described within this disclosure can be used to implement quality control standards for manufacturing of electronic displays. For example, x-y-z data may be received for an electronic display panel comprising a pattern of spaced banks. Parameters such as bank depth, bank pitch, bank height, bank slope, and bank opening size may be extracted from the x-y-z data. The extracted parameters may be compared to a quality criteria to determine whether the electronic display panel meets the quality criteria.

In an exemplary embodiment, the quality criteria may comprise one or more of a bank depth range, a bank pitch range, a bank height range, a bank slope range, and a bank opening size range. The extracted parameters for the electronic display panel may be compared to the quality criteria to determine whether the parameters fall within the corresponding ranges. When the parameters fail to meet the quality criteria, the electronic display panel may be discarded as ink deposition on the panel would waste resources at least because the parameters of the panel indicate it would not produce a viable electronic display. When the parameters meet the quality criteria, film layers may be deposited on the electronic display panel to produce a viable product, such as an OLED display.

In addition, analyzed data for film layers on the electronic display may be used to determine quality control metrics for various film layer materials (e.g., ink products), deposition techniques, and other manufacturing techniques described in this disclosure. For example, the film profile, thickness, and uniformity are related to process conditions for manufacturing. By monitoring the evolution of these parameters using a design of experiments (DOE) methodology, manufacturing processes may be better controlled and updated. A process may be established where routine measurement is used to determine the stability of the process and improve quality. For example, drift from a target profile, thickness, and uniformity can be an indication of loss of quality, and may be assessed for changing process conditions.

In various exemplary embodiments, a method of analyzing film on a substrate may comprise receiving 3-dimensional data obtained from measurements of a substrate comprising a plurality of banks and extracting a plurality of parameters for the substrate from the received 3-dimensional data comprising one or more of bank depth, bank pitch, bank height, bank slope and bank opening size. The method may further comprise comparing the plurality of parameters to a criteria and determining whether the substrate meets a quality control standard based on the comparing.

The method may further comprise discarding the substrate when the comparison indicates the extracted parameters fail to meet the criteria, or depositing one or more film layers on the substrate when the extracted parameters meet the criteria. The criteria may comprise bank depth range, a bank pitch range, a bank height range, and a bank slope. The criteria may comprise a bank depth range for individual banks, a bank pitch range for individual banks, a bank height range of individual banks, and a bank slope range for individual banks.

The method may further comprise calculating one or more of an average bank depth, an average bank pitch, an average bank height, an average bank slope and an average bank opening size based on the extracted plurality of parameters. The method may also comprise extracting one or more of bank depth, bank pitch, bank height, bank slope and bank opening size for individual banks of the substrate. Determining whether the substrate meets the quality control standard may further comprise determining a number of individual banks that fail to meet the criteria, or determining that the substrate fails to meet the quality control standard when the number of individual banks that fail to meet the criteria exceeds a threshold associated with the quality standard.

In various exemplary embodiments, a method of analyzing film on a substrate using data generated by any of a number of measurement sources may comprise receiving 3-dimensional data obtained from measurements of a plurality of spaced pixels on a substrate, the plurality of pixels comprising one or more film layers, wherein the 3-dimensional data is obtained from any one of a laser scanner, a confocal microscope, an optical profilometer or a mechanical profilometer. The method may further comprise extracting a plurality of parameters from the received 3-dimensional data comprising at least an average thickness for the film layers of the pixels, one or more area aperture ratios for the film layers of the pixels, and a pitch between pixels, wherein the extraction is based on a predetermined pattern for the pixels on the substrate; and displaying a user interface graphically representing one or more of the parameters for one or more film layers of the one or more of the pixels, the graphical user interface being interactive such that user input dynamically modifies the graphical representation of the one or more parameters.

Various exemplary embodiments contemplate a method of analyzing film on a substrate that comprises receiving three-dimensional data obtained from measurements of a plurality of pixels of a substrate, the plurality of pixels comprising one or more film layers; extracting a plurality of parameters from the received three-dimensional data, the parameters comprising at least a height for the film layers of the plurality pixels, wherein the extraction is based on a predetermined pattern for the pixels on the substrate; displaying a user interface graphically representing at least a height for the film layers of one of the plurality of pixels; and displaying a graphical representation illustrating a height for a plurality of different film layers of the one pixel, the plurality of film layers including at least one of an underlayer, a printed layer, and a difference layer between the underlayer and the printed layer.

The graphical representation can illustrate at least a point at which the difference layer reaches a zero height or at least a point at which the underlayer and printed layer converge.

The method of claim may further comprise displaying a heat map of the one pixel, the heat map illustrating a height for the film layers of the one pixel and/or dynamically modifying the graphical representation of the height of the plurality of different film layers in response user input at the display, the dynamically modifying causing the displayed graphical representation to appear as continuously changing.

In an embodiment, the graphical representation may further comprise a two-dimensional graphical representation of one of the pixels and an interactive cursor for pointing to a location on the two-dimensional graphical representation, wherein user input that moves the cursor to a new location dynamically changes the graph to illustrate the height of the film layers at the new location. The cursor may be a cross-hair of two orthogonal lines that is moveable by the user.

In another exemplary embodiment, the graphical representation is a graph and the two-dimensional graphical representation of the one pixel and the cross-hair are aligned with the graph illustrating at least the height of the film layers at the location of the one pixel pointed to by the cross-hair such that at least one of the orthogonal lines of the cross-hair intersects with a graphed line of the graph representing the height of the film layers at a precise location of the graph line that corresponds to the height of the film layers at the location of the one pixel pointed to by the cross-hair.

The exemplary embodiments can be used with any size display and more particularly with small displays having a high resolution. For example, exemplary embodiments of the present disclosure can be used with displays having a diagonal size in the range of 3-70 inches and having a resolution greater than 100 ppi, for example, greater than 300 ppi.

Although various exemplary embodiments described contemplate utilizing inkjet printing techniques, the various pixel and sub-pixel layouts described herein and the way of producing those layouts for an OLED display can also be manufactured using other manufacturing techniques such as thermal evaporation, organic vapor phase deposition, organic vapor jet printing, spin coating, slot coating, etc. Moreover, as discussed above, other the analysis techniques described herein can be used for display technologies other than OLED, and also may be used for any number of applications involving deposition of film layers on a substrate, such as, for example, in printed circuitry and semiconductors. Although only a few exemplary embodiments have been described in detail above, those skilled in the art will readily appreciate that many modifications are possible in the example embodiments without materially departing from this disclosure. Accordingly, all such modifications are intended to be included within the scope of this disclosure as defined in the following claims.

It is to be understood that the various embodiments shown and described herein are to be taken as exemplary. Elements and materials, and arrangement of those elements and materials, may be substituted for those illustrated and described herein, and portions may be reversed, all as would be apparent to one skilled in the art after having the benefit of the description herein. Changes may be made in the elements described herein without departing from the spirit and scope of the present disclosure and following claims, including their equivalents.

Those having ordinary skill in the art will recognize that various modifications may be made to the configuration and methodology of the exemplary embodiments disclosed herein without departing from the scope of the present teachings.

Those having ordinary skill in the art also will appreciate that various features disclosed with respect to one exemplary embodiment herein may be used in combination with other exemplary embodiments with appropriate modifications, even if such combinations are not explicitly disclosed herein.

It will be apparent to those skilled in the art that various modifications and variations can be made to the devices, methods, and systems of the present disclosure without departing from the scope of the present disclosure and appended claims. Other embodiments of the disclosure will be apparent to those skilled in the art from consideration of the specification and practice of the disclosure disclosed herein. It is intended that the specification and examples be considered as exemplary only.

What is claimed is:

1. A method of analyzing film on a substrate, the method comprising:

receiving three-dimensional data obtained from measurements of a plurality of pixels on the substrate, the plurality of pixels comprising one or more film layers;

extracting a plurality of parameters based on the received three-dimensional data, the plurality of parameters comprising at least an average thickness for the one or more film layers of the pixels, one or more area aperture ratios for the one or more film layers of the pixels, and a pitch between pixels, wherein the extracting is based on a predetermined pattern for the pixels on the substrate;

displaying a user interface comprising a graphical representation of one or more of the parameters for the one or more film layers of the plurality of pixels; and dynamically modifying the graphical representation of the one or more parameters in response to user input of the displayed user interface, the dynamically modifying causing the displayed graphical representation of the one or more parameters to appear as continuously changing.

2. The method of claim 1, wherein the graphical representation further comprises:

a two-dimensional graphical representation of one pixel of the plurality of pixels;

a cursor for pointing to a location on the two-dimensional graphical representation of the one pixel; and a graph illustrating one or more of the parameters of the one or more film layers at the location of the one pixel pointed to by the cursor, wherein user input that moves the cursor to a new location on the two-dimensional graphical representation dynamically changes the graph to illustrate one or more of the parameters of the one or more film layers of the one pixel at the new location.

3. The method of claim 2, wherein the graph illustrates at least a height of the one or more film layers at the location of the one pixel pointed to by the cursor, wherein user input that moves the cursor to a new location on the two-dimensional graphical representation dynamically changes the graph to indicate the height of the one or more film layers of the one pixel at the new location.

4. The method of claim 3, wherein the cursor comprises a cross-hair of two orthogonal lines that is moveable by a user.

5. The method of claim 2, wherein the one or more layers of the one pixel comprises a plurality of film layers and the graph illustrates a height of the plurality of film layers at the location of the one pixel pointed to by the cursor, each film layer corresponding to a graphed line that illustrates the height of each film layer.

6. The method of claim 5, wherein the two-dimensional graphical representation comprises a heat map of the one pixel, the heat map illustrating a height for the plurality of film layers of the one pixel.

7. The method of claim 5, wherein the graph illustrates at least a luminance of the plurality of film layers at the location of the one pixel pointed to by the cursor, wherein user input that moves the cursor to a new location of the one pixel dynamically changes the graph to indicate the luminance of the plurality of film layers at the new location.

8. The method of claim 5, wherein the graph illustrates a first graphed line that corresponds to the height of the plurality of film layers at the location of the one pixel pointed to by the cursor and a second graphed line that corresponds to a luminance of the plurality of film layers at the location of the one pixel pointed to by the cursor.

9. The method of claim 8, wherein the first graphed line and the second graphed line are superimposed over one another on the graph.

10. The method of claim 2, further comprising: receiving user input selecting one or more film layers, wherein the graph illustrating one or more of the parameters of the one or more film layers dynamically changes to illustrate the one or more parameters of the one or more selected film layers at the location.

11. The method of claim 2, wherein the one or more parameters illustrated by the graph comprise a film layer height, the film layer height corresponding to one of an extracted height for the one or more film layers and an extracted height for the one or more film layers minus an extracted height for a control pixel that does not comprise film layers.

12. The method of claim 1, wherein the graphical representation further comprises: a data table showing numerical data relating to one or more of the parameters of the one or more film layers, wherein user input dynamically changes the numerical data shown in the data table.

13. The method of claim 1, wherein extracting the plurality of parameters comprises extracting the plurality of parameters using subtracted data calculated by subtracting the three-dimensional data measured from one or more control pixels of the plurality of pixels from three-dimensional data measured from other pixels of the plurality of pixels.

14. The method of claim 1, wherein the three-dimensional data is obtained from any of an optical profilometer, a laser scanner, a confocal microscope, and a mechanical profilometer.

15. The method of claim 1, wherein the graphical representation further comprises:
a two-dimensional graphical representation of the plurality of the pixels;
an interactive cursor for pointing to a location on the two-dimensional graphical representation;
a first graph illustrating a height of the one or more film layers of the plurality of pixels along a length for the plurality of pixels; and
a second graph illustrating a height of the one or more film layers at the location of the plurality of pixels pointed to by a cursor, wherein user input that moves the cursor to a new location dynamically changes the graph to illustrate the height of the one or more film layers at the new location.

16. The method of claim 1, wherein the graphical representation further comprises:
a two-dimensional graphical representation of one of the plurality of pixels that illustrates one or more parameters of the one or more film layers, and
a widget that receives input from a user to dynamically adjust a threshold for one or more of the parameters of the one or more film layers illustrated in the two-dimensional graphical representation.

17. The method of claim 16, wherein the graphical representation further comprises: a widget for selecting one of luminance and color values that comprise one of CIEx and CIEy, wherein the two-dimensional graphical representation dynamically changes to display the selected one of luminance and color values for the one or more film layers.

18. The method of claim 16, wherein the graphical representation further comprises: a widget for dividing a two-dimension display into a first portion and a second portion, wherein the two-dimensional graphical representation displays luminance for one or more film layers of the first portion of the one of the plurality of pixels and height for one or more film layers of the second portion of the one of the plurality of pixels, wherein the first portion and second portion of the one of the plurality of pixels comprise halves of the illustrated pixel split lengthwise or widthwise.

19. The method of claim 16, wherein the graphical representation further comprises: a widget for selecting a color channel for the one of the plurality of pixels, wherein the two-dimensional graphical representation displays a color value for one or more film layers of the one of the plurality of pixels corresponding to the color channel selected.

20. The method of claim 19, wherein the color channel is chosen from red, green, blue, and a combination of red, green and blue.

21. The method of claim 1, wherein the one or more film layers comprises a plurality of different film layers and displaying the user interface comprising the graphical representation of the one or more parameters comprises:
displaying a graphical representation of at least a height for the plurality of different film layers of one of the plurality of pixels; and
displaying a graphical representation illustrating a height for one or more of the plurality of different film layers of the one of the plurality of pixels, the plurality of different film layers including at least one of an underlayer, a deposited film layer overlying the underlayer, and a difference layer between the underlayer and the deposited film layer.

* * * * *